(12) United States Patent
Tessariol et al.

(10) Patent No.: US 11,489,038 B2
(45) Date of Patent: Nov. 1, 2022

(54) CAPACITORS HAVING VERTICAL CONTACTS EXTENDING THROUGH CONDUCTIVE TIERS

(71) Applicant: Micron Technology, Inc., Boise, ID (US)

(72) Inventors: Paolo Tessariol, Montebelluna (IT); Qiang Tang, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/689,735

(22) Filed: Aug. 29, 2017

(65) Prior Publication Data
US 2019/0067412 A1    Feb. 28, 2019

(51) Int. Cl.
| | | |
|---|---|---|
| H01L 49/02 | (2006.01) | |
| H01L 27/112 | (2006.01) | |
| H01L 23/535 | (2006.01) | |
| H01L 21/768 | (2006.01) | |
| H01L 23/522 | (2006.01) | |

(52) U.S. Cl.
CPC ........ *H01L 28/40* (2013.01); *H01L 21/76895* (2013.01); *H01L 23/5222* (2013.01); *H01L 23/535* (2013.01); *H01L 27/11286* (2013.01); *H01L 28/86* (2013.01); *H01L 28/90* (2013.01)

(58) Field of Classification Search
CPC . H01L 28/40; H01L 21/76895; H01L 23/535; H01L 27/11286
USPC ....................................................... 257/532
See application file for complete search history.

(56) References Cited

U.S. PATENT DOCUMENTS

| | | | | |
|---|---|---|---|---|
| 4,221,047 A | * | 9/1980 | Narken ............... | H01L 21/4857 257/697 |
| 4,245,273 A | * | 1/1981 | Feinberg ............. | H01L 23/4338 257/714 |
| 4,302,625 A | * | 11/1981 | Hetherington ........ | H01L 21/486 174/253 |
| 4,328,530 A | * | 5/1982 | Bajorek ............. | H01L 23/5383 257/E23.173 |
| 4,407,007 A | * | 9/1983 | Desai .................. | H01L 23/5383 174/257 |
| 4,478,677 A | * | 10/1984 | Chen ................... | C03C 23/0025 216/65 |

(Continued)

FOREIGN PATENT DOCUMENTS

| | | |
|---|---|---|
| CN | 103165619 A | 6/2013 |
| WO | WO-2016205078 A2 | 12/2016 |

*Primary Examiner* — Ori Nadav
(74) *Attorney, Agent, or Firm* — Schwegman Lundberg & Woessner, P.A.

(57) ABSTRACT

Some embodiments include apparatuses and methods of forming the apparatuses. One of the apparatuses includes conductive materials located in different levels of the apparatus, dielectric materials located in different levels of the apparatus, a first conductive contact, and a second conductive contact. One of the conductive materials is between two of the dielectric materials. One of the dielectric materials is between two of the conductive materials. The first conductive contact has a length extending through the conductive materials and the dielectric materials in a direction perpendicular to the levels of the apparatus. The first conductive contact is electrically separated from the conductive materials. The second conductive contact contacts a group of conductive materials of the conductive materials.

17 Claims, 43 Drawing Sheets

(56) References Cited

U.S. PATENT DOCUMENTS

| | | | | |
|---|---|---|---|---|
| 4,622,058 A * | 11/1986 | Leary-Renick | H01L 21/48 | 216/65 |
| 4,998,159 A * | 3/1991 | Shinohara | B32B 18/00 | 174/255 |
| 5,177,670 A * | 1/1993 | Shinohara | H01L 23/36 | 174/253 |
| 5,583,359 A * | 12/1996 | Ng | H01L 23/5223 | 257/306 |
| 5,861,664 A * | 1/1999 | Inoue | H01L 21/4846 | 257/693 |
| 6,072,690 A | 6/2000 | Farooq et al. | | |
| 6,088,215 A * | 7/2000 | Webb | H05K 3/328 | 361/306.3 |
| 6,175,127 B1 * | 1/2001 | Hong | H01L 28/60 | 257/295 |
| 6,274,823 B1 * | 8/2001 | Khandros | G01R 1/0466 | 174/261 |
| 6,327,134 B1 * | 12/2001 | Kuroda | H01G 4/232 | 361/303 |
| 6,399,482 B1 * | 6/2002 | Lou | H01L 21/76801 | 257/E21.576 |
| 6,430,030 B1 * | 8/2002 | Farooq | H01G 4/30 | 257/E23.067 |
| 6,999,300 B2 * | 2/2006 | Togashi | H01G 4/232 | 361/306.1 |
| 7,176,565 B2 * | 2/2007 | Li | H01G 4/232 | 257/678 |
| 7,298,001 B1 * | 11/2007 | Liu | H01G 4/232 | 257/306 |
| 7,630,208 B2 * | 12/2009 | Lee | H05K 1/0231 | 361/766 |
| 7,709,929 B2 * | 5/2010 | Kuramitsu | H01L 23/66 | 257/532 |
| 7,915,164 B2 * | 3/2011 | Konevecki | H01L 21/28282 | 257/E21.585 |
| 8,378,450 B2 * | 2/2013 | Booth, Jr. | H01L 23/5223 | 257/532 |
| 9,054,094 B2 * | 6/2015 | Anthony | H01L 23/49822 | |
| 9,214,284 B2 * | 12/2015 | Pan | H01G 9/012 | |
| 9,524,964 B2 * | 12/2016 | Jing | H01L 27/0805 | |
| 9,691,841 B2 * | 6/2017 | Oh | H01L 23/5223 | |
| 9,693,841 B2 * | 7/2017 | Hussain | A61L 33/0029 | |
| 9,872,391 B2 * | 1/2018 | Zhou | H01G 4/30 | |
| 2001/0001725 A1 * | 5/2001 | Cheng | H01L 21/28132 | 438/595 |
| 2004/0125539 A1 * | 7/2004 | Murakami | H01G 4/232 | 361/306.1 |
| 2009/0026608 A1 * | 1/2009 | Tsai | H01L 24/03 | 257/737 |

\* cited by examiner

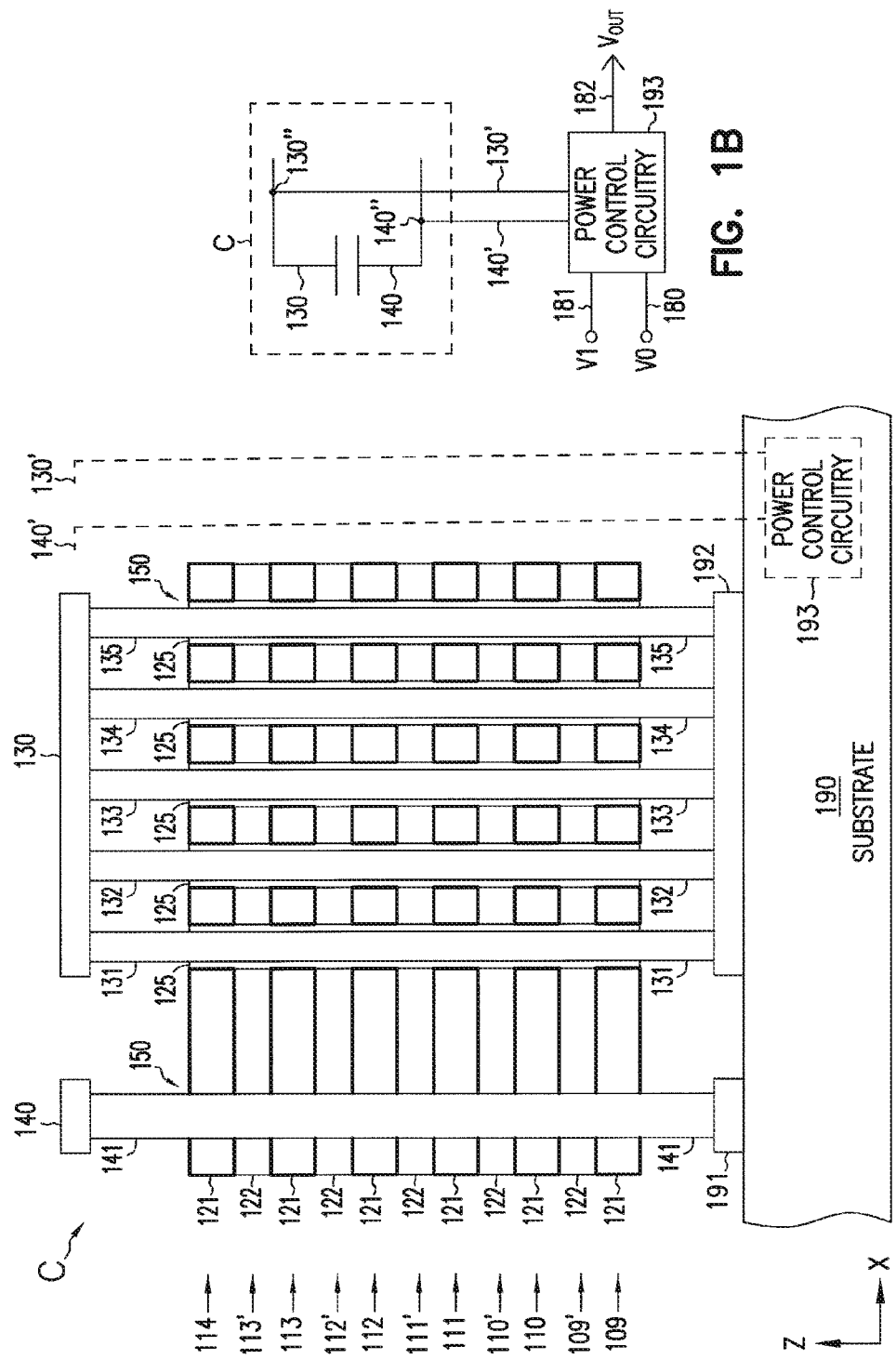

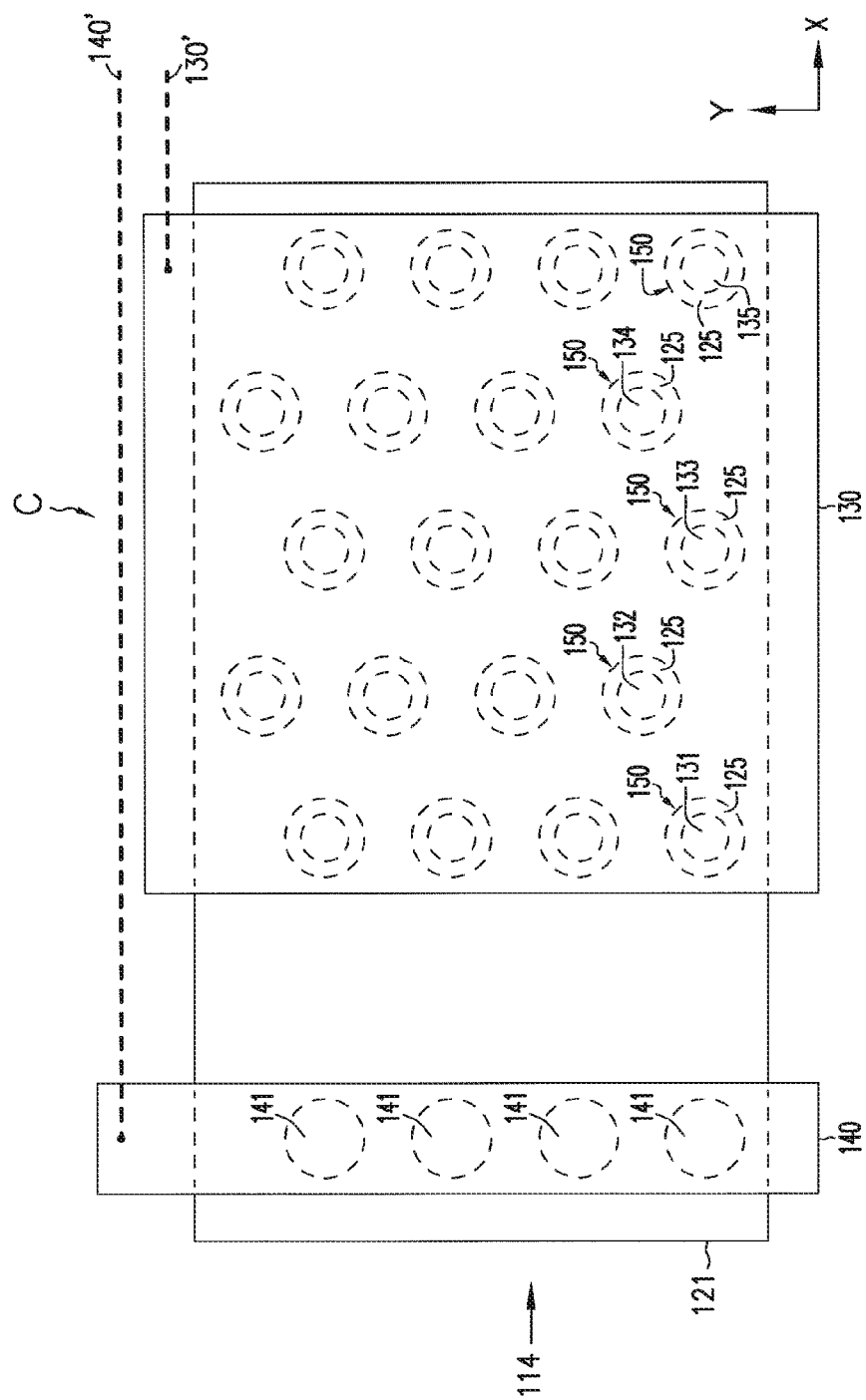

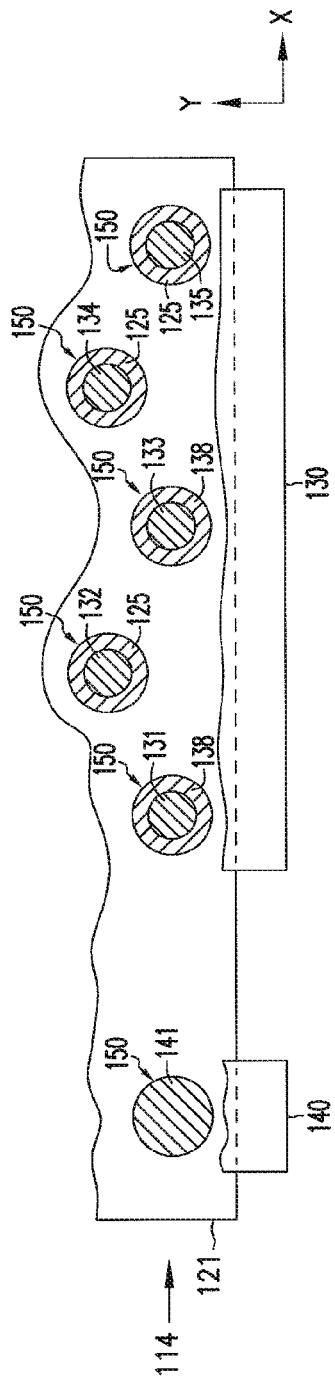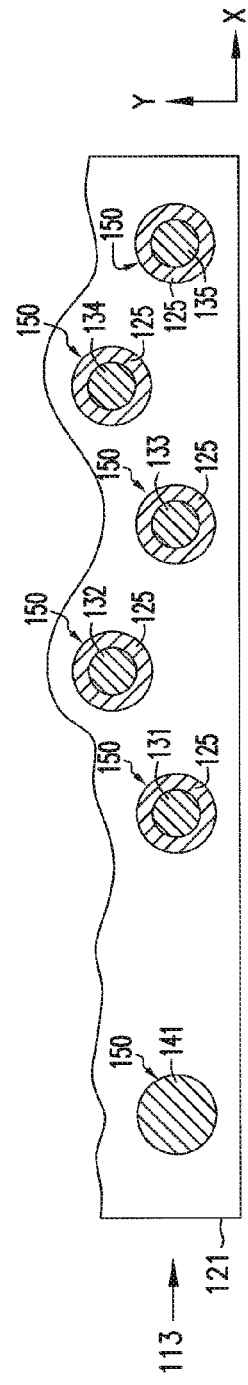

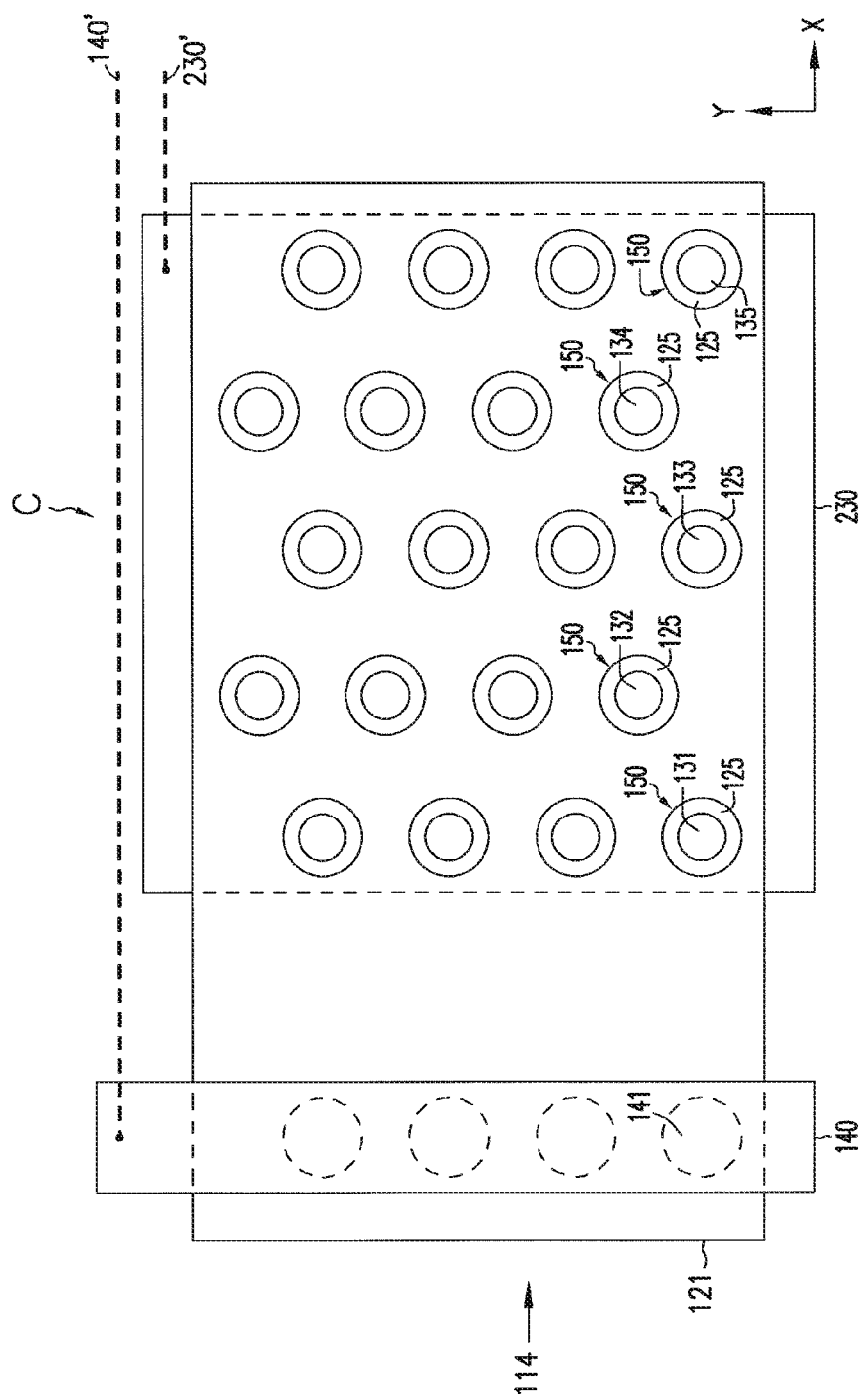

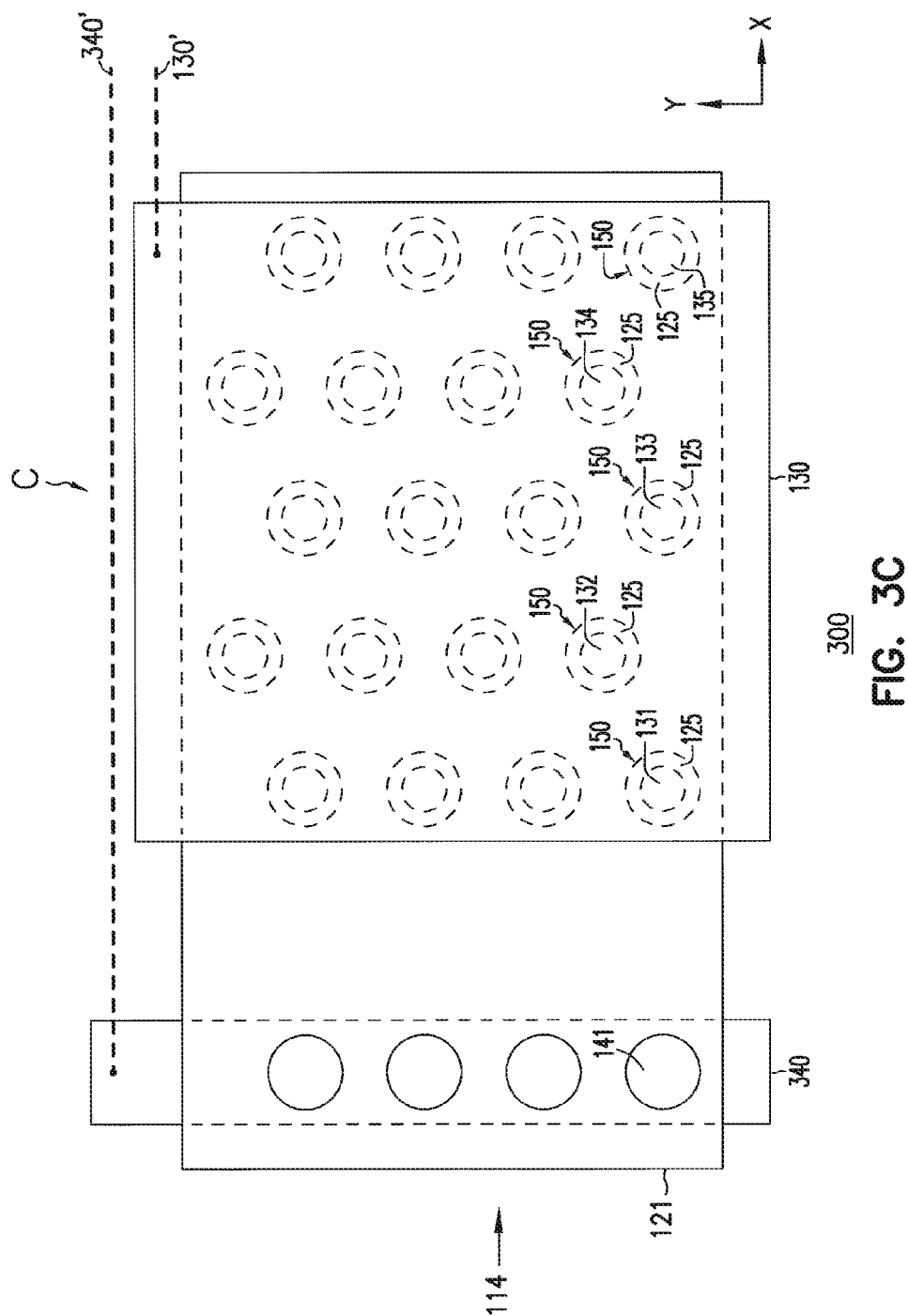

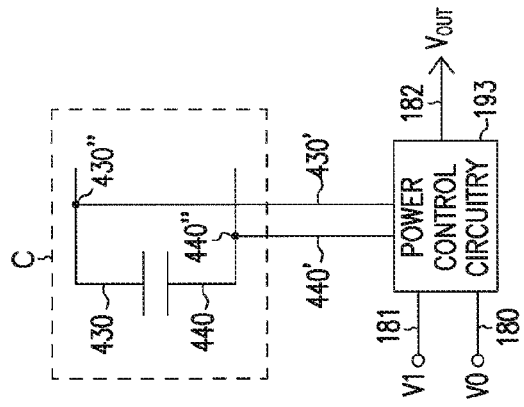
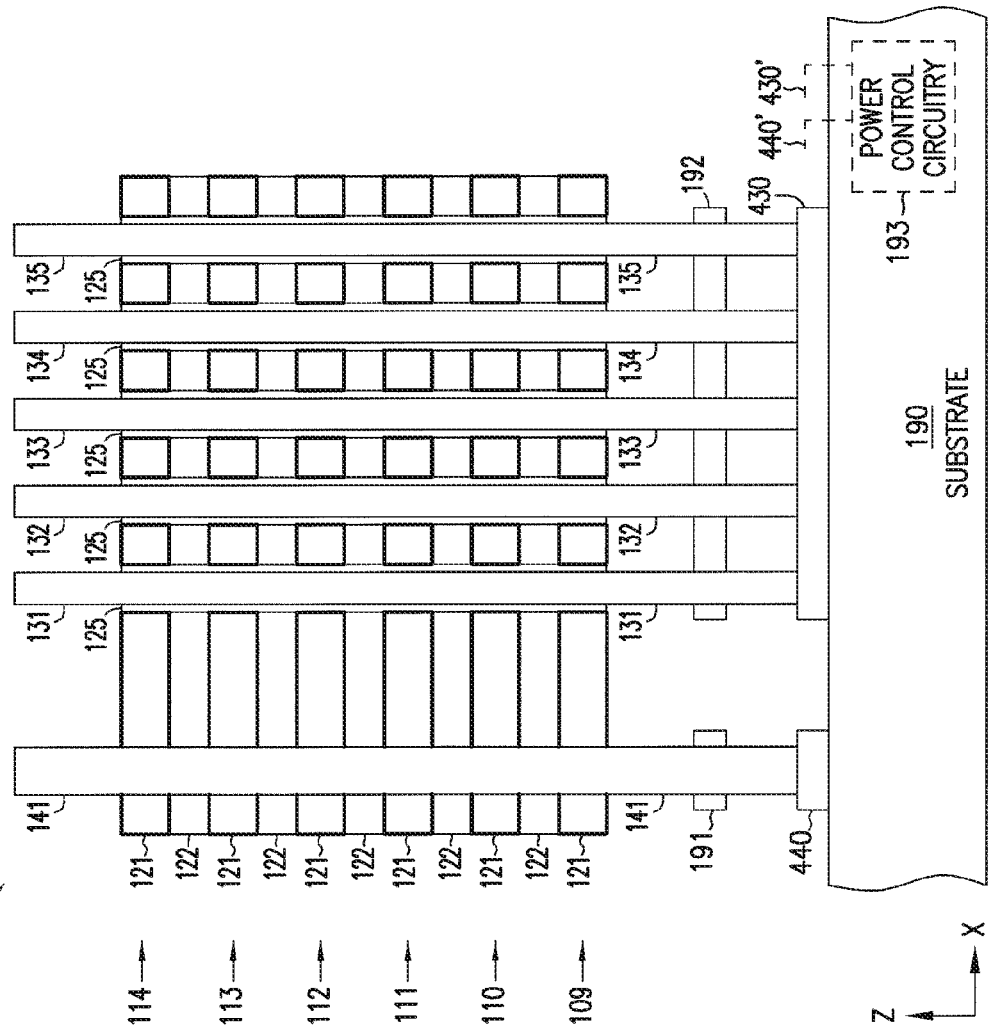
FIG. 5B
FIG. 5A

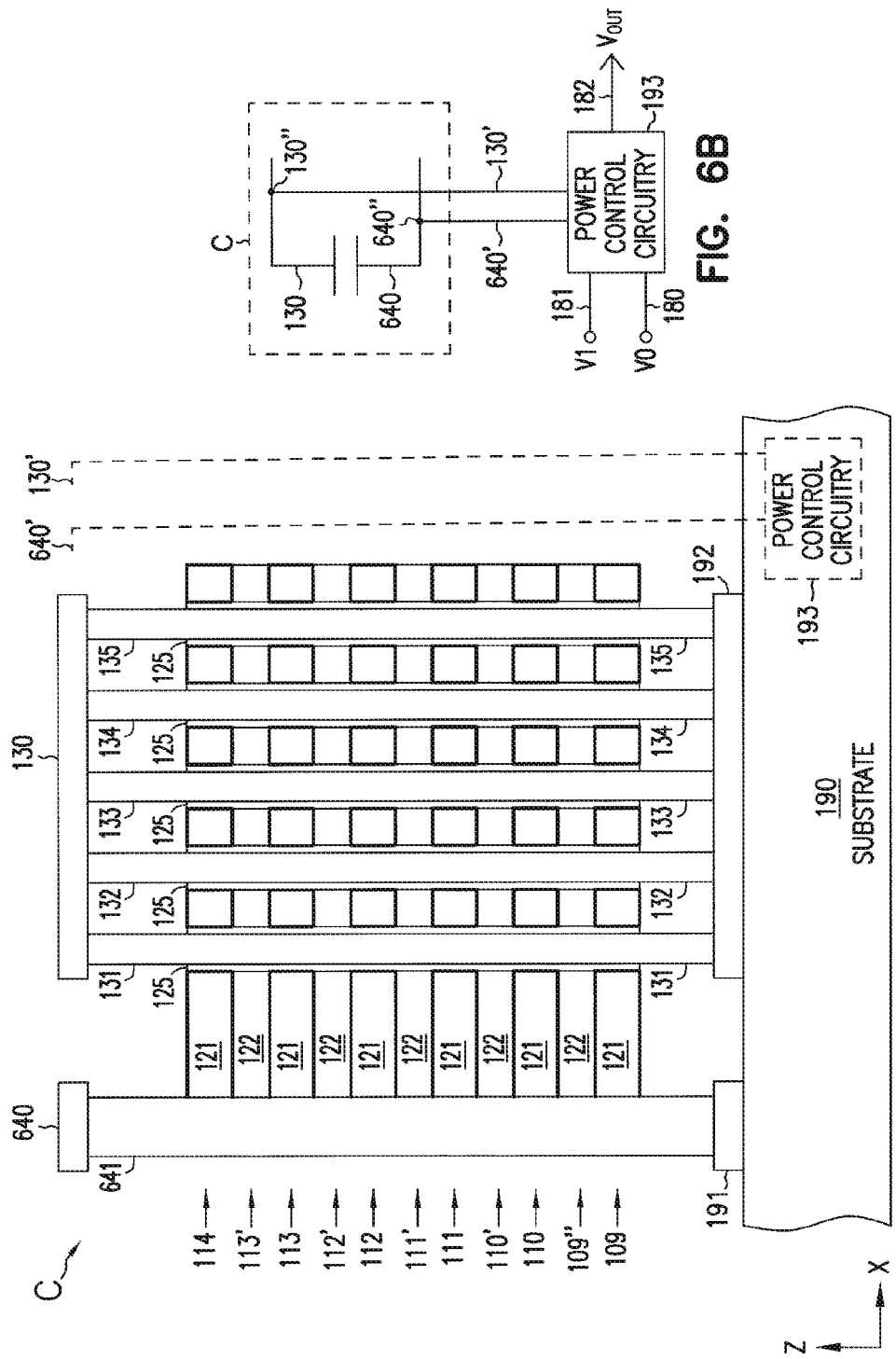

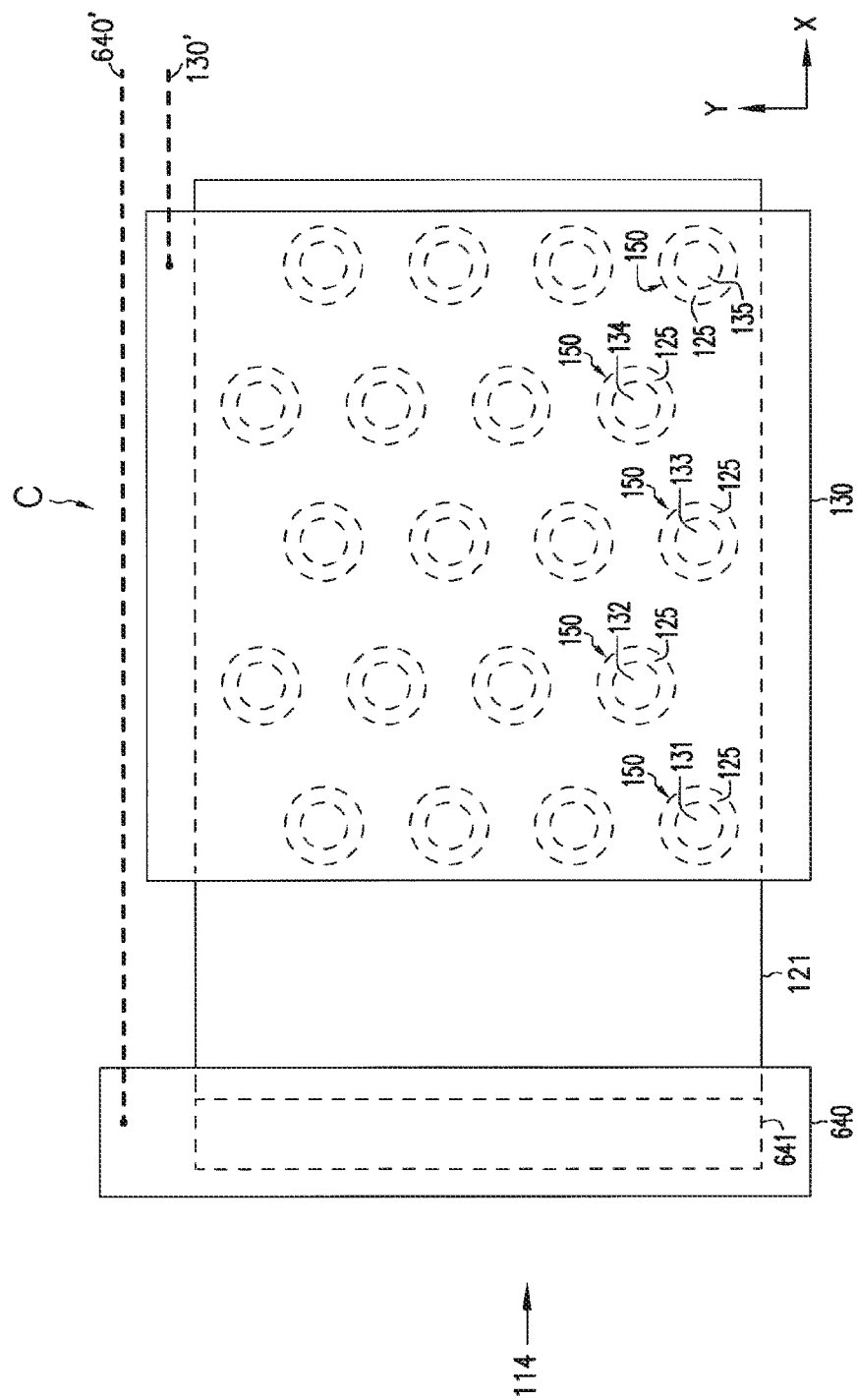

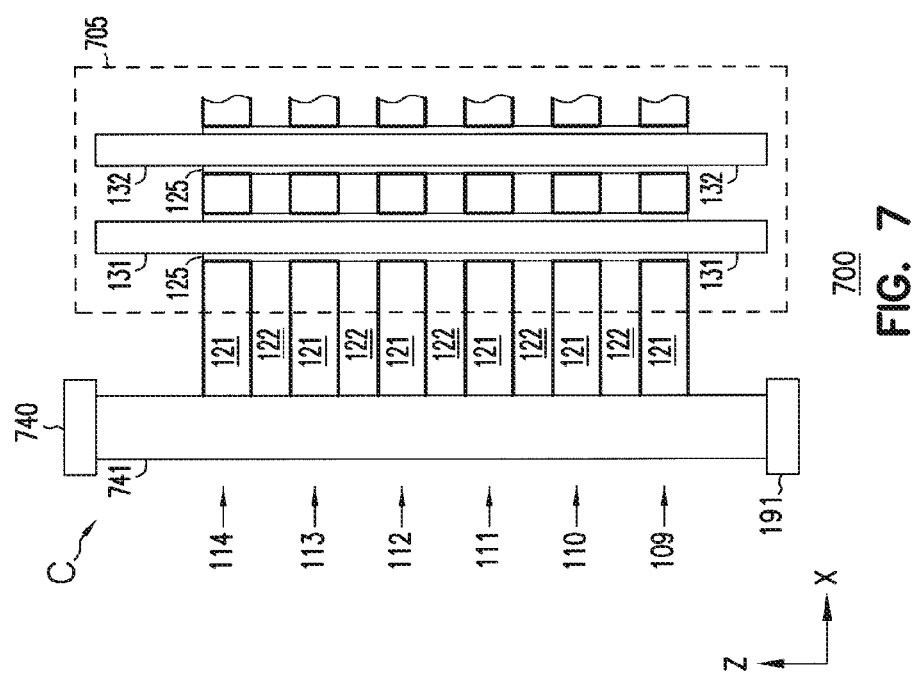

CAPACITORS HAVING VERTICAL CONTACTS EXTENDING THROUGH CONDUCTIVE TIERS

BACKGROUND

Capacitors are widely used in power circuitry and other circuitry in computers, mobile phones, and many other electronic items. Capacitors have many different physical structures. The structure of a capacitor can affect its size and efficiency. As presented in more details below, the capacitors described herein include structures that can overcome challenges faced by some conventional capacitors.

BRIEF DESCRIPTION OF THE DRAWINGS

FIG. 1A shows an apparatus in the form of an IC (integrated circuit) device including a structure of a capacitor C, according to some embodiments described herein.

FIG. 1B shows a schematic diagram of a portion of the IC device of FIG. 1A including capacitor C and capacitor nodes, according to some embodiments described herein.

FIG. 1C shows a partial top view of the IC device of FIG. 1A including conductive regions located over other elements of the IC device, according to some embodiments described herein.

FIG. 1D shows a partial top view at a level of the IC device of FIG. 1A including respective portions of holes and conductive contacts of the IC device, according to some embodiments described herein.

FIG. 1E shows a partial top view at another level of the IC device of FIG. 1A including respective portions of holes and conductive contacts of the IC device, according to some embodiments described herein.

FIG. 2C shows a partial top view of IC device of FIG. 2A including a conductive region located under conductive contacts of the IC device of FIG. 2A, according to some embodiments described herein.

FIG. 3C shows a partial top view of the IC device of FIG. 3A including a conductive region located under conductive contacts of the IC device, according to some embodiments described herein.

FIG. 5A shows an apparatus in the form of an IC device including a structure of a capacitor C having different conductive regions, according to some embodiments described herein.

FIG. 5B shows a schematic diagram of a portion of the IC device of FIG. 5A including a capacitor C, according to some embodiments described herein.

FIG. 6A shows an apparatus in the form of an IC device including a structure of a capacitor C having conductive contact formed at edges of conductive materials, according to some embodiments described herein.

FIG. 6B shows a schematic diagram of a portion of the IC device of FIG. 6A, including a capacitor C and a capacitor node, according to some embodiments described herein.

FIG. 6C shows a partial top view of the IC device of FIG. 6A including a conductive region located under a conductive contact of the IC device, according to some embodiments described herein.

FIG. 7 shows an apparatus in the form of an IC device including a structure of a capacitor C having a conductive contact formed at edges of conductive materials, according to some embodiments described herein.

DETAILED DESCRIPTION

Figure 2B:
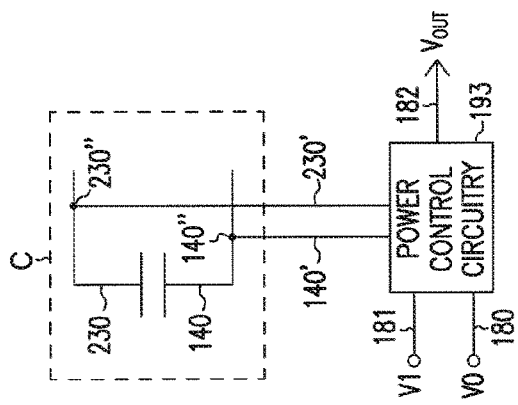
FIG. 2B shows a schematic diagram of a portion of the IC device of FIG. 2A, including capacitor C and a capacitor node, according to some embodiments described herein.

FIG. 1A shows an apparatus in the form of an IC device 100 including a structure of a capacitor C, according to some embodiments described herein. IC device 100 can include or be included in a memory device, a processor (e.g., a general processor), an application-specific integrated circuit (ASIC), a system on chip (SoC), or other electronic (e.g., semiconductor) devices. FIG. 1B shows a schematic diagram of capacitor C of FIG. 1A. The description of FIG. 1B is described below after the description of FIG. 1A.

As shown in FIG. 1A, IC device 100 can include a substrate 190 over which (above which) capacitor C can be formed. Substrate 190 can include monocrystalline (also referred to as single-crystal) semiconductor material. For example, substrate 190 can include monocrystalline silicon (also referred to as single-crystal silicon). The monocrystalline semiconductor material of substrate 190 can include impurities, such that substrate 190 can have a specific conductivity type (e.g., n-type or p-type). Substrate 190 can include power control circuitry 193 formed in substrate 190. Power control circuitry 193 can include components such as transistors, resistors, and other circuit components. Substrate 190 can also include other circuitries that are not shown for simplicity.

As shown in FIG. 1A, IC device 100 can include different levels (physical internal device levels) including levels 109 through 114 and levels 109' through 113', which are levels in the z-direction perpendicular to substrate 190 (e.g., vertical levels with respect to substrate 190). Capacitor C can include conductive materials 121 located in levels 109 through 114, and dielectric materials 122 located in levels 109' through 113'. As shown in FIG. 1A, conductive materials 121 (e.g., vertically spaced tiers of conductive material) and dielectric materials 122 (e.g., vertically spaced tiers of dielectric material) are formed in an alternating arrangement (e.g., an interleaved arrangement), such that one of conductive materials 121 can be between two of the dielectric materials 122, and one of the dielectric materials 122 can be between two of the conductive materials 121. Conductive materials 121 can include metal, conductively doped polysilicon, or other conductive materials. Dielectric materials 122 can include an oxide material (e.g., silicon dioxide $SiO_2$).

FIG. 1A shows an example of an alternating arrangement of six conductive materials 121 (e.g., six layers of conductive materials 121) and five dielectric materials 122 (e.g., five layers of dielectric materials 122). However, the number of conductive materials 121 (e.g., the number of layers of conductive materials 121) and the number of dielectric materials 122 (e.g., the number of layers of dielectric materials 122) can vary, depending on the number of tiers (e.g., vertical layers of conductive materials 121 and dielectric materials 122 in the z-direction) of a capacitor C of IC device 100. A tier of capacitor C of IC device 100 can include one of conductive materials 121 and an adjacent one of dielectric materials 122. For example, FIG. 1A shows an example where conductive materials 121 and dielectric materials 122 can be included in six tiers in capacitor C of IC device 100.

As shown in FIG. 1A, capacitor C can include conductive contacts 131 through 135 (a conductive pillar structure) going through the tiers (e.g., going through conductive materials 121 and dielectric materials 122 in the z-direction) of capacitor C. For example, each of conductive contacts 131 through 135 can have a length extending in a direction (e.g., z-direction) perpendicular to levels 109 through 114 and 109' through 113'. Capacitor C can include holes (e.g., vertical trenches) 150. In FIG. 1A, only two of holes 150 are labeled for simplicity. Each of holes 150 can extend through conductive materials 121 and dielectric materials 122. For example, each of holes 150 can include a vertical wall (e.g., sidewall) extending through conductive materials 121 and dielectric materials 122. Each of conductive contacts 131 through 135 can include a portion inside a respective hole 150. Conductive contacts 131 through 135 can include metal, conductively doped polysilicon, or other conductive materials. Each of conductive contacts 131 through 135 can be electrically separated (e.g., electrically isolated or electrically insulated) from conductive materials 121 by a respective dielectric material 125 (e.g., capacitor dielectric), which can include an oxide material (e.g., silicon dioxide $SiO_2$).

Capacitor C can include a conductive contact 141 (a conductive pillar structure) going through the tiers (e.g., going through conductive materials 121 and dielectric materials 122 in the z-direction) of capacitor C. Conductive contact 141 shown in FIG. 1A is one of multiple conductive contacts 141 (in the y-direction) shown in FIG. 1C (described in detail below). As shown in FIG. 1A, conductive contact 141 can have a length extending in a direction (e.g., z-direction) perpendicular to levels 109 through 114 and 109' through 113'. Conductive contact 141 can include a portion inside a respective hole 150. Conductive contact 141 can include the same material as (or different material from) conductive contacts 131 through 135. For example, conductive contact 141 can include metal, conductively doped polysilicon, or other conductive materials. Unlike each of conductive contacts 131 through 135 and conductive contact 141, a dielectric material (e.g., dielectric material 125) may not be between conductive contact 141 and conductive materials 121. Thus, conductive contact 141 is not electrically separated from (is not electrically isolated from) conductive materials 121. Conductive contact 141 can contact (can be electrically coupled to) a group of (some or all of) conductive materials 121. FIG. 1A shows an example where conductive contact 141 contacts all of conductive materials 121. However, conductive contact 141 may contact fewer than all of conductive materials 121. Thus, conductive contact 141 may contact a group of conductive materials 121, in which the group of conductive materials 121 can include either all of conductive materials 121 or fewer than all (e.g., only a portion of) conductive materials 121.

Similarly, conductive contact 141 can contact a group of (some or all of) dielectric materials 122. FIG. 1A shows an example where conductive contact 141 contacts all of dielectric materials 122. However, conductive contact 141 may contact fewer than all of dielectric materials 122. Thus, conductive contact 141 may contact a group of dielectric materials 122, in which the group of dielectric materials 122 can include either all of dielectric materials 122 or fewer than all (e.g., only a portion of) dielectric materials 122.

As shown in FIG. 1A, capacitor C can include conductive regions (e.g., top conductive regions) 130 and 140, and conductive regions (e.g., bottom conductive regions) 191 and 192. Conductive regions 191 and 192 are electrically separated from each other. Conductive regions 130 and 140 are electrically separated from each other. Each of conductive regions 130 and 140 can be part of a conductive line (e.g., metal line). Each of conductive regions 191 and 192 can be part of a conductive line (e.g., conductively doped polysilicon).

As shown in FIG. 1A, conductive region 130 can contact (can be electrically coupled to) conductive contacts 131 through 135 at an end (e.g., top end) of each of conductive contacts 131 through 135. Thus, conductive contacts 131 through 135 can be electrically coupled to each other through conductive region 130.

Conductive region 140 can contact (can be electrically coupled to) conductive contact 141 at an end (e.g., top end) of conductive contact 141.

Conductive region 192 can contact (can be electrically coupled to) conductive contacts 131 through 135 at an end (e.g., bottom end) of each of conductive contacts 131 through 135. Conductive region 191 can contact (can be electrically coupled to) conductive contact 141 at an end (e.g., bottom end) of conductive contact 141.

As shown in FIG. 1A, IC device 100 can include conductive paths 130' and 140'. Conductive path 130' can provide an electrical connection (e.g., a current path) between conductive contacts 131 through 135 of capacitor C and power control circuitry 193. Conductive path 140' can provide an electrical connection (e.g., a current path) between conductive contact 141 of capacitor C and power control circuitry 193.

For simplicity, FIG. 1A symbolically shows conductive paths 130' and 140' as dashed lines. However, the structure of conductive paths 130' and 140' can include physical dimensions (e.g., a structure that can have length, width, and thickness) and conductive materials (e.g., metal, conductively doped polysilicon, or other conductive materials). Conductive path 130' can be electrically coupled conductive to conductive region 130. Thus, conductive path 130' can be electrically coupled to conductive contacts 131 through 135 through conductive region 130. Conductive path 140' can be electrically coupled to conductive region 140. Thus, conductive path 140' can be electrically coupled to conductive contact 141 through conductive region 140.

FIG. 1B shows a schematic diagram of a portion of IC device 100 of FIG. 1A including capacitor C and capacitor nodes (e.g., capacitor terminals) 130" and 140", according to some embodiments described herein. In FIG. 1A, conductive contacts 131 through 135 (a conductive pillar structure), conductive region 130, and conductive path 130' can be part of (e.g., or alternatively can be coupled to) capacitor node 130" (FIG. 1B). Conductive contact 141 (a conductive pillar structure), conductive region 140, and conductive path 140' of FIG. 1A can be part of (e.g., or alternatively can be coupled to) capacitor node 140" (FIG. 1B). Conductive materials 121 of FIG. 1A can be part of the plates of capacitor C. As shown in FIG. 1B, capacitor nodes 130" and 140" can be coupled to power control circuitry 193 through conductive paths 130' and 140', respectively. Capacitor C can be used in a low voltage operation (e.g., a voltage from 1V to 5V) or a high voltage operation (e.g., a voltage greater than 5V). Thus, capacitor nodes 130" and 140" can be configured to operate at a low or high voltage (a voltage range from 1V to 20V or higher, depending on the function of capacitor C used in IC device 100).

As shown in FIG. 1B, power control circuitry 193 can include (or can be coupled to) nodes 180, 181, and 182. Nodes 180 and 181 can receive voltages V0 and V1, respectively. Voltage V1 can have a higher value (in volt unit) than voltage V0. As an example, voltage V1 can be a supply voltage (e.g., Vcc) of IC device 100, and voltage V0 can be ground (e.g., Vss). Node 182 can provide a voltage $V_{OUT}$. Power control circuitry 193 can operate such that voltage $V_{OUT}$ can have a negative value (e.g., can be less than voltage V0) or positive value (e.g., can be greater voltage V1). As an example, power control circuitry 193 can include a charge pump, such that node 182 can be an output node of the charge pump. The charge pump can be a positive charge pump, such that the value of voltage $V_{OUT}$ can be positive value (e.g., can be greater the supply voltage of IC device 100).

FIG. 1A and FIG. 1B show IC device 100 including only one capacitor C as an example. However, IC device 100 can include a multiple of capacitor C in which the multiple of capacitor C can form multiple stages of a charger pump (e.g., multi-stage charge pump) of IC device 100.

FIG. 1C shows a partial top view of IC device 100 of FIG. 1A including conductive regions 130 and 140 located over other elements of IC device 100, according to some embodiments described herein. As shown in FIG. 1C, conductive region 130 can be located over conductive material 121 and holes 150, and can contact (can be electrically coupled to) conductive contacts 131 through 135 (which are located in holes 150 below conductive region 130). FIG. 1C shows conductive region 130 being a piece (e.g., a single piece) of conductive material as an example. In an alternate structure of IC device 100, conductive region 130 can include (e.g., can be formed from) multiple pieces (e.g., multiple separate conductive regions) of conductive materials that can contact (can be electrically coupled to) respective conductive contacts 131 through 135. In the alternate structure, the multiple pieces of conductive materials can be electrically coupled to each other, such that conductive contacts 131 through 135 can be electrically coupled to each other through the multiple pieces of conductive materials.

As shown in FIG. 1C, conductive region 140 can be located over conductive material 121 and over a group of holes 150 (e.g., left-most holes 150) and can contact (can be electrically coupled to) conductive contacts 141 (which are located in holes 150 below conductive region 140). Conductive region 140 can be a piece (e.g., a single piece) of conductive material. Conductive region 140 can contact (can be electrically coupled to) conductive contact 141 at an end (e.g., top end) of each of conductive contacts 141. Thus, conductive contacts 141 (as shown in FIG. 1C) can be electrically coupled to each other through conductive region 140.

As shown in FIG. 1C, holes 150 can be arranged in rows and columns in the x-direction and y-direction (e.g., a plane which is perpendicular to the z-direction). FIG. 1C symbolically shows conductive paths 130' and 140' as dashed lines. However, as mentioned above, each of conductive path 130' and 140' can include conductive material to provide electrical conduction between power control circuitry 193 (FIG. 1A) and respective conductive contacts 141 and 131 through 135 (FIG. 1C).

FIG. 1D shows a partial top view of IC device 100 of FIG. 1A at level 114 including respective portions of holes 150 and conductive contacts 131 through 135 and 141, according to some embodiments described herein. As shown in FIG. 1D, each of conductive contacts 131 through 135 can include a portion formed in a respective hole 150 in conductive materials 121 and can be electrically separated from conductive materials 121 by a respective dielectric material 125. In a particular hole (among holes 150) that contacts conductive region 130, dielectric material 125 can be formed on a wall (e.g., sidewall) of that particular hole and can surround a respective conductive contact among conductive contacts 131 through 135. In a particular hole (among holes 150) that contacts conductive region 140, dielectric material 125 can be formed on a wall (e.g., sidewall) of that particular hole and can surround a respective conductive contact among conductive contacts 141.

FIG. 1E shows a partial top view of IC device 100 of FIG. 1A at level 113 including respective portions of holes 150 and conductive contacts 131 through 135 and 141, according to some embodiments described herein. As shown in FIG. 1E, the structure of IC device 100 of FIG. 1E at level 113 is the same as the structure of IC device 100 at level 114 (shown in FIG. 1D). Thus, detailed description of the same elements of IC device 100 of FIG. 1D and FIG. 1E are not repeated. The structure of IC device 100 of FIG. 1A at levels 109, 110, 111, and 112 are the same the structure of IC device 100 of FIG. 1A at levels 114 (FIG. 1D) and level 113 (FIG. 1E).

FIG. 1A shows conductive regions 130, 140, 191, and 192 being located in certain locations (e.g., certain levels) of IC device 100 as an example. However, conductive regions 130 and 140 can be located in locations different from the locations shown in FIG. 1A.

The following description discusses additional capacitors that are similar to (e.g., can be variations of) capacitor C of IC device 100 of FIG. 1A through FIG. 1E. Thus, for simplicity, similar or the same elements in the description herein are given the same labels, and the detailed descriptions of similar or the same elements are not repeated. Also for simplicity, cross-sectional lines of some elements (e.g., conductive contacts 131 through 135 and dielectric materials 125) of the IC devices described herein are omitted from the drawings.

Figure 2A:
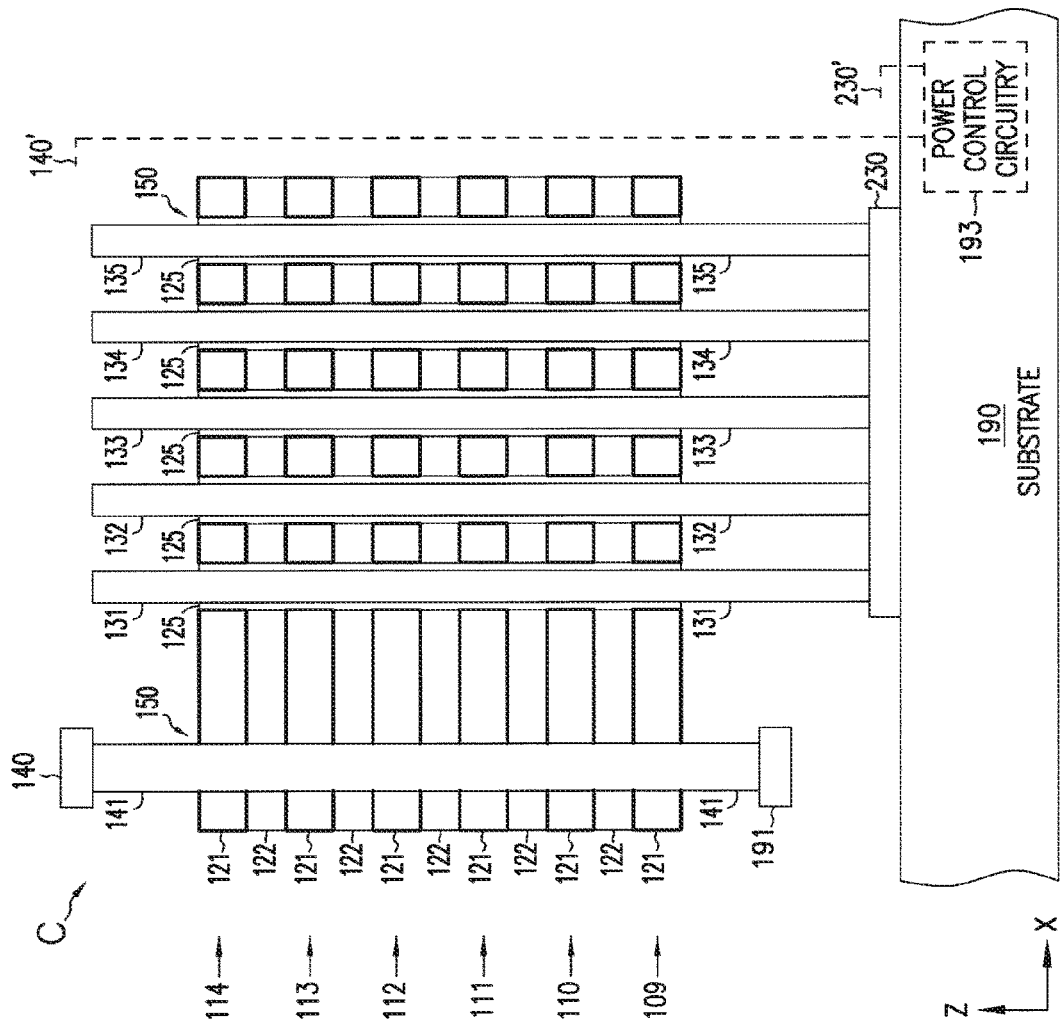
FIG. 2A shows an apparatus in the form of an IC device including a structure of a capacitor C having conductive regions located in different levels of the IC device, according to some embodiments described herein.

FIG. 2A shows an apparatus in the form of an IC device 200 including a structure of a capacitor C having conductive regions 140 and 230 located in different levels of IC device 200, according to some embodiments described herein. Conductive regions 140 and 230 are electrically separated from each other. Differences in structures between IC device 100 (FIG. 1A) and IC device 200 (FIG. 2A) are described below.

In FIG. 1A, conductive regions 130 and 140 can be located in the same level (e.g., a level above level 114) of IC device 100. For example, in FIG. 1A, each of conductive regions 130 and 140 can contact a respective conductive contact at an end (e.g., a portion of the respective conductive contact) that is located in a level above level 114. In FIG. 2A, conductive regions 140 and 230 can be located in different levels of IC device 200. For example, conductive region 230 can contact each respective conductive contact (131 through 135) at an end of the respective conductive contact that is located in a level below level 109 (which is below level 114). IC device 200 can include a conductive path 230' to provide an electrical connection between conductive region 230 and power control circuitry 193. For simplicity, FIG. 2A symbolically shows conductive path 230' as a dashed line. However, the structure of conductive path 230' can include physical dimensions (e.g., a structure that can have length, width, and thickness) and conductive materials (e.g., metal, conductively doped polysilicon, or other conductive materials).

FIG. 2B shows a schematic diagram of a portion of IC device 200 of FIG. 2A, including capacitor C and a capacitor node 230", according to some embodiments described herein. In FIG. 2A, conductive contacts 131 through 135, conductive region 230, and conductive path 230' of FIG. 2A can be part of (e.g., or alternatively can be coupled to) capacitor node (e.g., a capacitor terminal) 230" (FIG. 2B).

FIG. 2C shows a partial top view of IC device 200 of FIG. 2A including conductive region 230 located under conductive contacts 131 through 135 of IC device 200, according to some embodiments described herein. As shown in FIG. 2C, conductive region 230 can be located under conductive material 121 and holes 150. FIG. 2C shows conductive region 230 being a piece (e.g., a single piece) of conductive material as an example. In an alternate structure of IC device 200, conductive region 230 can include (e.g., can be formed from) multiple pieces (e.g., multiple separate conductive regions) of conductive materials that can contact (e.g., can be electrically coupled to) respective conductive contacts 131 through 135. In the alternate structure, the multiple pieces of conductive materials can be electrical coupled to each other, such that conductive contacts 131 through 135 can be electrically coupled to each other through the multiple pieces of conductive materials.

Figure 3B:
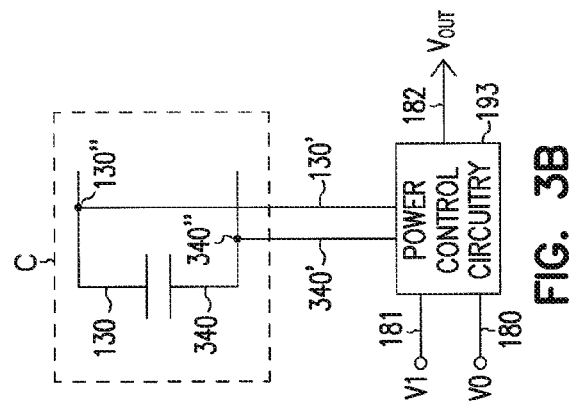
FIG. 3B shows a schematic diagram of a portion of the IC device of FIG. 3A, including the capacitor C and a capacitor node, according to some embodiments described herein.
Figure 3A:
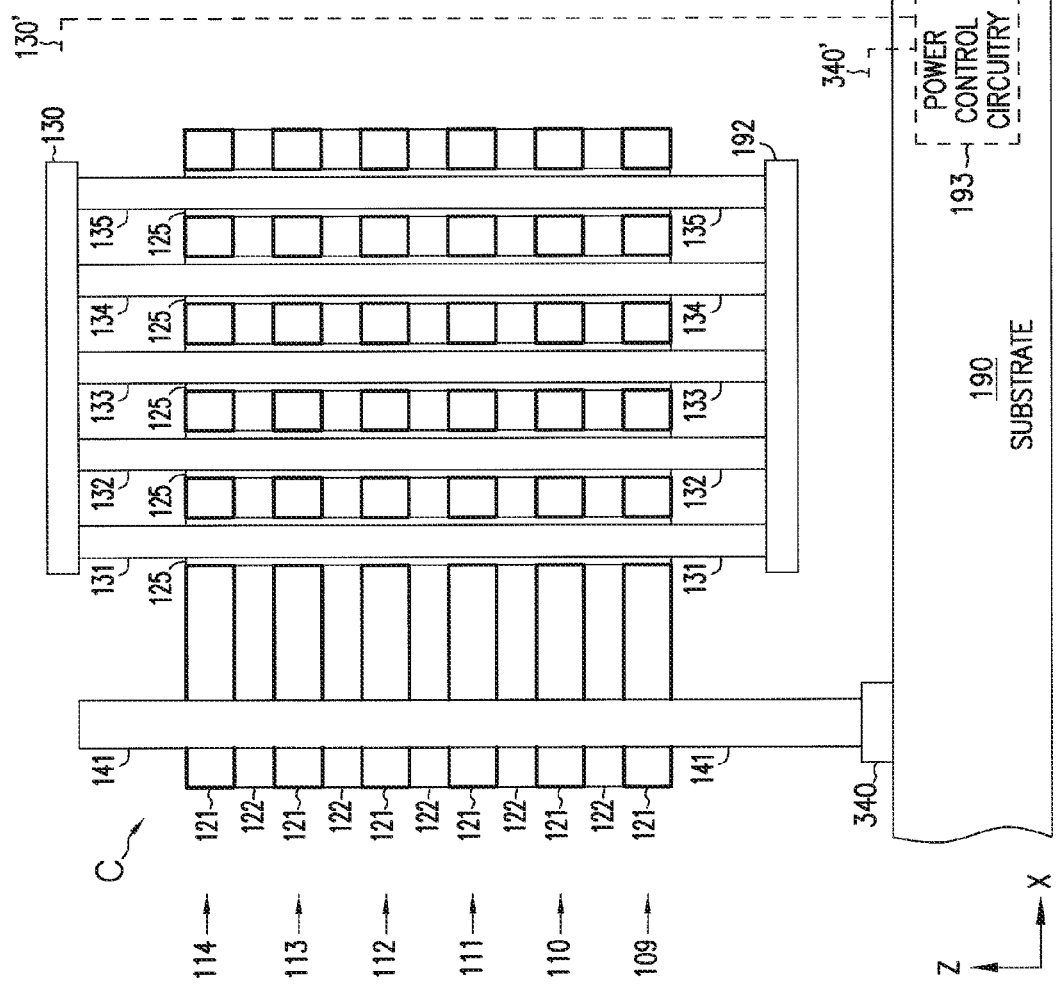
FIG. 3A shows an apparatus in the form of an IC device including a structure of another capacitor C having conductive regions located in different levels of the IC device, according to some embodiments described herein.

FIG. 3A shows an apparatus in the form of an IC device 300 including a structure of a capacitor C having conductive regions 130 and 340 located in different levels of IC device 300, according to some embodiments described herein. Conductive regions 140 and 340 are electrically separated from each other. Differences in structures between IC device 100 (FIG. 1A) and IC device 300 (FIG. 3A) are described below.

As described above with reference to FIG. 1A, conductive regions 130 and 140 can be located in the same level (e.g., a level above level 114) of IC device 100. In FIG. 3A, conductive regions 130 and 340 can be located in different levels of IC device 200. For example, conductive region 340 can contact conductive contact 141 at an end of conductive contact 141 that is located in a level below level 109 (which is below level 114). IC device 300 can include a conductive path 340' to provide an electrical connection between conductive region 340 and power control circuitry 193. For simplicity, FIG. 3A symbolically shows conductive path 340' as a dashed line. However, the structure of conductive path 340' can include physical dimensions (e.g., a structure that can have length, width, and thickness) and conductive materials (e.g., metal, conductively doped polysilicon, or other conductive materials).

FIG. 3B shows a schematic diagram of a portion of IC device 300 of FIG. 3A, including capacitor C and a capacitor node 340", according to some embodiments described herein. In FIG. 3A, conductive contact 141, conductive region 340, and conductive path 340' of FIG. 3A can be part of (e.g., or alternatively can be coupled to) a capacitor node 340" (FIG. 3B).

FIG. 3C shows a partial top view of IC device 300 of FIG. 3A including conductive region 340 located under conductive contact 141 of IC device 300, according to some embodiments described herein. Conductive region 130 can be the same conductive region 130 in FIG. 1C.

Figure 4A:
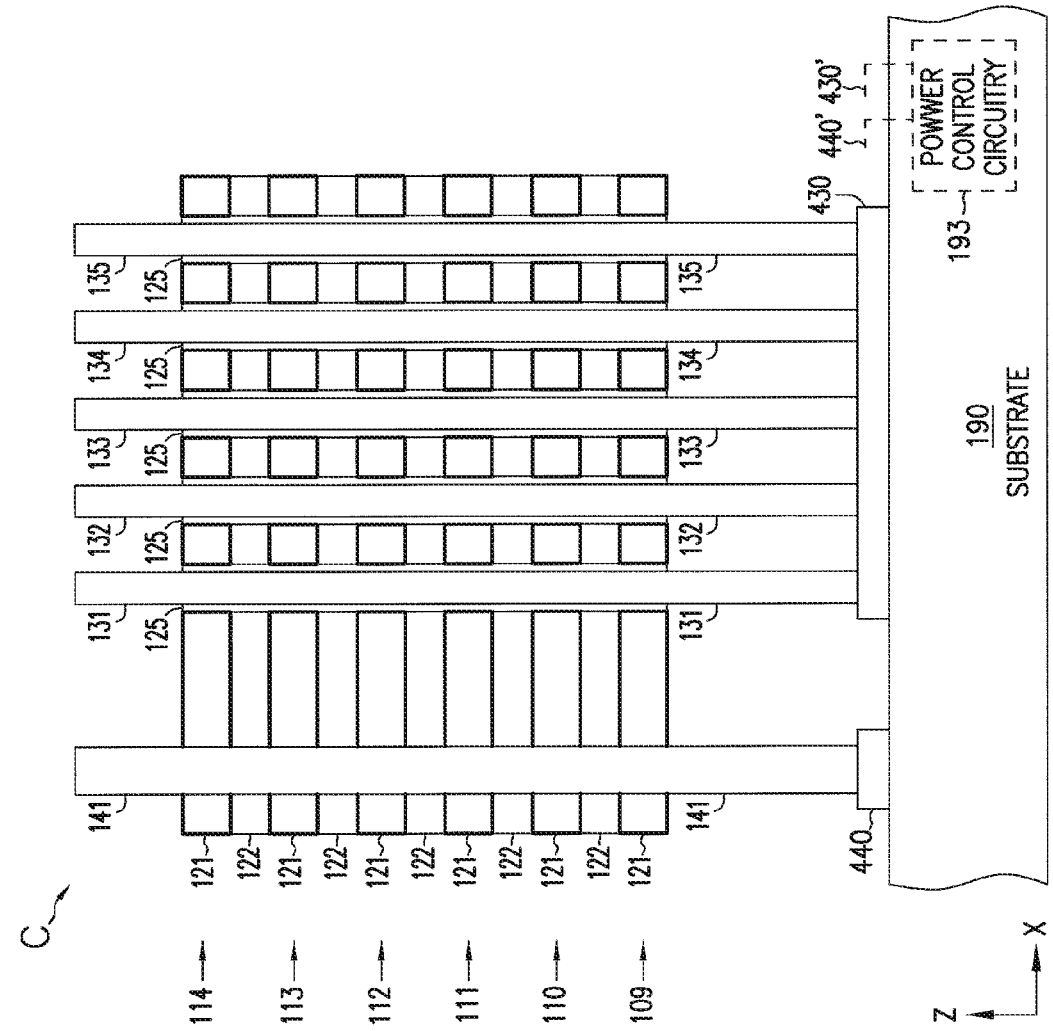
FIG. 4A shows an apparatus in the form of an IC device including a structure of a capacitor C having conductive regions located in the same level and below the conductive materials of the IC device, according to some embodiments described herein.

FIG. 4A shows an apparatus in the form of an IC device 400 including a structure of a capacitor C having conductive regions 430 and 440 located in the same level and below conductive materials 121 of IC device 400, according to some embodiments described herein. Conductive regions 430 and 440 are electrically separated from each other. Differences in structures between IC device 100 (FIG. 1A) and IC device 400 (FIG. 4A) are described below.

In FIG. 1A, conductive regions 130 and 140 can be located in the same level that is above level 114 of IC device 100. In FIG. 4A, conductive regions 430 and 440 are also located in the same level. However, conductive regions 430 and 440 are below level 114 of IC device 400. IC device 400 can include a conductive path 430' to provide an electrical connection between conductive region 430 and power control circuitry 193. IC device 400 can include a conductive path 440' to provide an electrical connection between conductive region 440 and power control circuitry 193. For simplicity, FIG. 4A symbolically shows each of conductive path 430' and 440' as a dashed line. However, the structure of each of conductive path 430' and 440' can include physical dimensions (e.g., a structure that can have length, width, and thickness) and conductive materials (e.g., metal, conductively doped polysilicon, or other conductive materials).

Figure 4B:
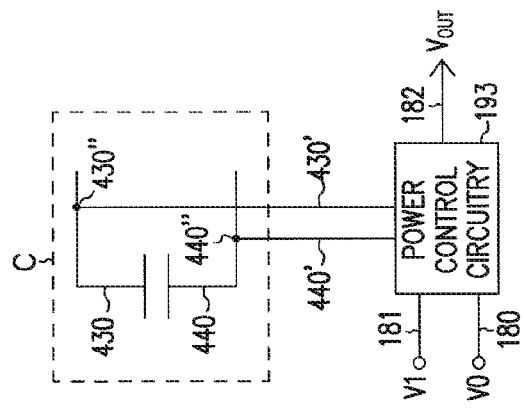
FIG. 4B shows a schematic diagram of a portion of the IC device of FIG. 4A, including capacitor C and capacitor nodes, according to some embodiments described herein.

FIG. 4B shows a schematic diagram of a portion of IC device 400 of FIG. 4A, including capacitor C and capacitor nodes 430" and 440", according to some embodiments described herein. In FIG. 4A, conductive contacts 131 through 135, conductive region 430, and conductive path 430' of FIG. 4A can be part of (e.g., or alternatively, can be coupled to) capacitor node 430" (FIG. 4B). Conductive contact 141, conductive region 440, and conductive path 440' of FIG. 4A can be part of (e.g., or alternatively, can be coupled to) capacitor node 440" (FIG. 4B).

Figure 4C:
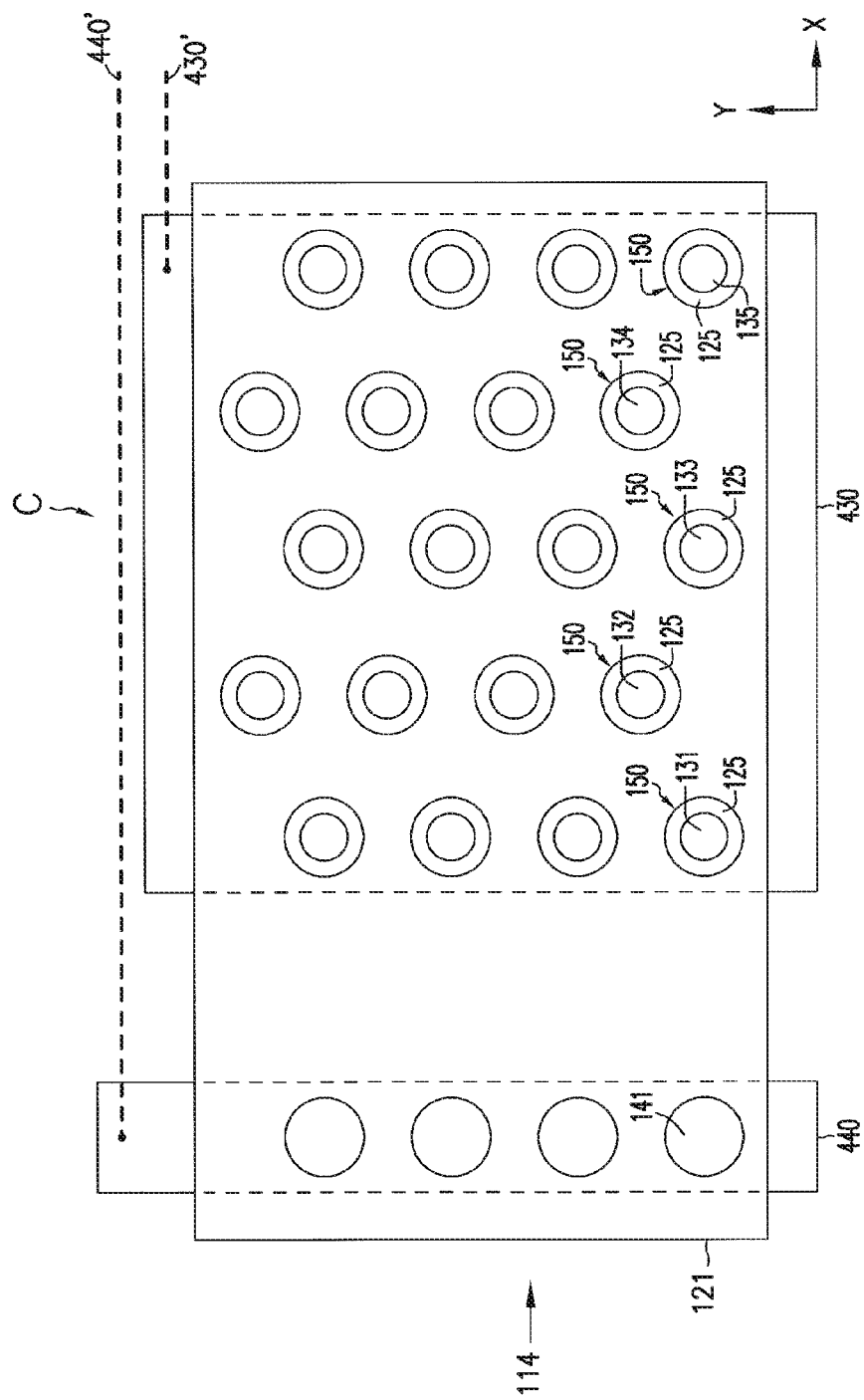
FIG. 4C shows a partial top view of the IC device of FIG. 4A including conductive regions located under conductive contacts of the IC device, according to some embodiments described herein.

FIG. 4C shows a partial top view of IC device 400 of FIG. 4A including conductive region 430 located under conductive contacts 131 through 135 and conductive region 440 located under conductive contact 141 of IC device 400, according to some embodiments described herein. As shown in FIG. 4C, conductive region 430 can be located under conductive material 121 and holes 150. FIG. 4C shows conductive region 430 being a piece (e.g., a single piece) of conductive material as an example. In an alternate structure of IC device 400, conductive region 430 can include (e.g., can be formed from) multiple pieces (e.g., multiple separate conductive regions) of conductive materials that can contact (e.g., can be electrically coupled to) respective conductive contacts 131 through 135. In the alternate structure, the multiple pieces of conductive materials can be electrically coupled to each other, such that conductive contacts 131 through 135 can be electrically coupled to each other through the multiple pieces of conductive materials.

FIG. 5A shows an apparatus in the form of an IC device 500 including a structure of a capacitor C having conductive regions 191, 192, 430, and 440, according to some embodiments described herein. Differences in structures between IC devices 400 and 500 include the addition of conductive regions 191 and 192 in FIG. 5A. In a structure of IC device 500, conductive regions 191 and 192 (which are also present in IC device 100 of FIG. 1A) may be parts of conductive lines (e.g., source, not shown) to carry signals to other components (not shown) of IC device 500. Conductive regions 191 and 192 may be unused portions of such conductive lines and may remain under conductive materials 121 of capacitor C. Therefore, as shown in FIG. 5A, conductive contacts 131 through 135 can go through conductive region 192 and contact conductive region 430. Conductive contacts 131 through 135 may or may not be electrically coupled to (e.g., may or may not contact) conductive region 192. Similarly, conductive contact 141 can go through conductive region 191 and contact conductive region 440. Conductive contact 141 may or may not be electrically coupled to (e.g., may or may not contact) conductive region 191.

FIG. 5B shows a schematic diagram of a portion of IC device 500 of FIG. 5A, including capacitor C, according to some embodiments described herein. The schematic diagram of IC device 500 of FIG. 5A can be the same as the schematic diagram of IC device 400 of FIG. 4A.

FIG. 6A shows an apparatus in the form of an IC device 600 including a structure of a capacitor C having conductive contact 641 formed at edges of conductive materials 121, according to some embodiments described herein. Differences in structures between IC device 100 (FIG. 1A) and IC device 600 (FIG. 6A) are described below.

As described above with reference to FIG. 1A, conductive contact 141 can be formed in a hole (e.g., hole 150). In FIG. 6A, conductive contact 641 may not be formed in a hole. Conductive contact 641 may be formed at edges (e.g., left-most edges) of conductive materials 121 and can contact (can be electrically coupled to) a group of (some or all of) conductive materials 121. FIG. 6A shows an example where conductive contact 641 contacts all of conductive materials 121. However, conductive contact 641 may contact fewer than all of conductive materials 121. Thus, conductive contact 641 may contact a group of conductive materials 121, in which the group of conductive materials 121 can include either all of conductive materials 121 or fewer than all (e.g., only a portion of) conductive materials 121.

IC device 600 can include a conductive region 640, which can contact (can be electrically coupled to) a top portion (e.g., top end) of conductive contact 641. IC device 600 can include a conductive path 640' to provide an electrical connection between conductive region 640 and power control circuitry 193. For simplicity, FIG. 6A symbolically shows conductive path 640' as a dashed line. However, the structure of conductive path 640' can include physical dimensions (e.g., a structure that can have length, width, and thickness) and conductive materials (e.g., metal, conductively doped polysilicon, or other conductive materials).

FIG. 6B shows a schematic diagram of a portion of IC device 600 of FIG. 6A, including capacitor C and a capacitor node 640", according to some embodiments described herein. In FIG. 6A, conductive contact 641, conductive region 640, and conductive path 640' can be part of (e.g., or alternatively can be coupled to) capacitor node (e.g., a capacitor terminal) 640" (FIG. 6B).

FIG. 6C shows a partial top view of IC device 600 of FIG. 6A including conductive region 640 located under conductive contact 641 of IC device 600, according to some embodiments described herein. As shown in FIG. 6C, conductive region 640 can be located over conductive material 121 and conductive contact 641. Conductive contact 641 may not be located in a hole. Conductive contact 641 can be a piece (e.g., a single piece) of conductive material (e.g., metal, conductively doped polysilicon, or other conductive materials). Conductive contact 641 includes a portion (e.g., top end portion) contacting (electrically coupled to) conductive region 640.

FIG. 7 shows an apparatus in the form of an IC device 700 including a structure of a capacitor C having conductive contact 741 formed at edges of conductive materials 121, according to some embodiments described herein. IC device 700 can be a variation of IC device 600 of FIG. 6A. For example, IC device 700 can include conductive contact 741 and conductive region 740 that can be similar to conductive contact 641 and conductive region 640, respectively, of IC device 600 of FIG. 6A. IC device 700 can include other elements (e.g., a substrate conductive region and conductive paths) similar to those of IC devices shown in FIG. 1A, FIG. 2A, FIG. 3A, FIG. 4A, FIG. 5A, and FIG. 6A. However, for simplicity, such elements are omitted from FIG. 7.

As shown in FIG. 7, capacitor C of IC device 700 can include a portion 705. Portion 705 can include other elements that are omitted from FIG. 7 for simplicity. For example, portion 705 of capacitor C of IC device 700 can include a portion of capacitor C (e.g., conductive contacts 131 through 135 associated conductive regions and conductive paths) described above with reference to FIG. 1A, FIG. 2A, FIG. 3A, FIG. 4A, FIG. 5A, and FIG. 6A.

Figure 8:
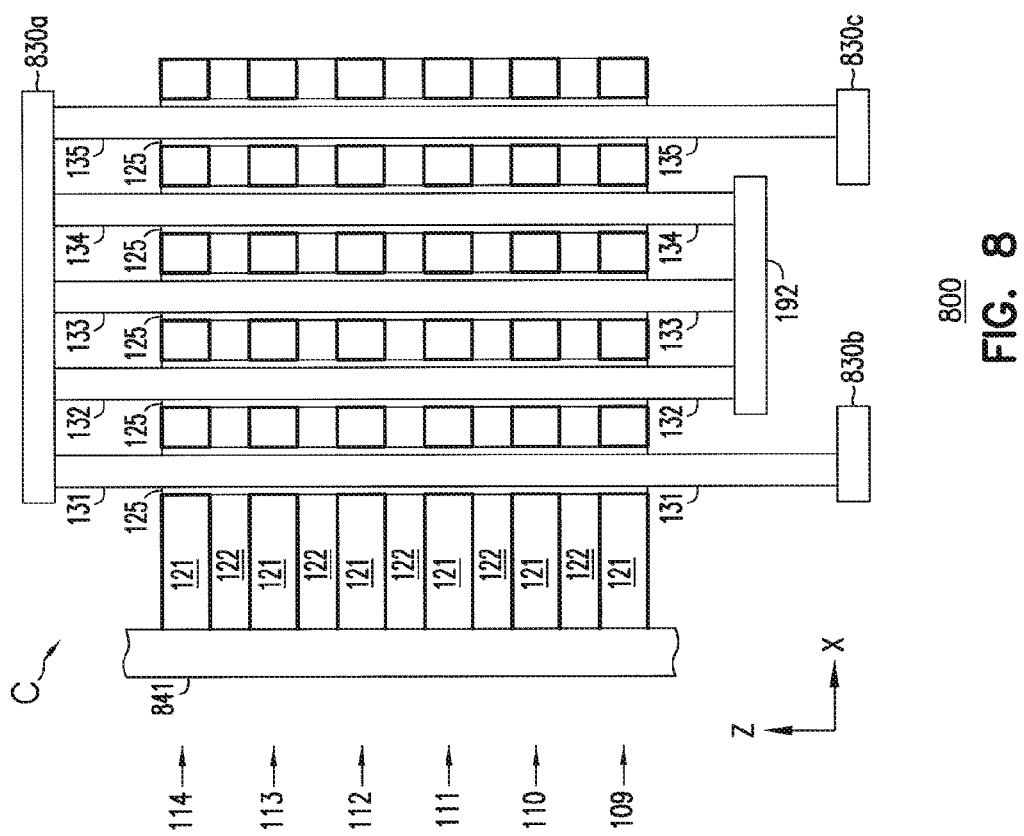
FIG. 8 shows an apparatus in the form of an IC device including a structure of a capacitor C having conductive contacts coupled to different conductive regions (e.g., bottom conductive regions), according to some embodiments described herein.

FIG. 8 shows an apparatus in the form of an IC device 800 including a structure of a capacitor C having conductive contacts 131 through 135 coupled to different conductive regions (e.g., bottom conductive regions) 830a, 830b, and 830c, according to some embodiments described herein. IC device 800 can include other elements (e.g., a substrate, conductive regions, and conductive paths) similar to those of IC devices shown in FIG. 1A, FIG. 2A, FIG. 3A, FIG. 4A, FIG. 5A, FIG. 6A, and FIG. 7. However, such elements are omitted from FIG. 8 for simplicity.

As shown in FIG. 8, each of conductive contacts 131 through 135 can include an end (e.g., top end) contacting (electrically coupled to) conductive region 830*a*. Conductive contacts 131 through 135 can have ends (e.g., bottom ends) contacting (electrically coupled to) different conductive regions among conductive regions 192, 830*b*, and 830*c*. For example, a bottom end of each of conductive contacts 132, 133, and 134 can contact (can be electrically coupled to) conductive region 192; bottom ends of corresponding conductive contacts 131 and 135 can contact conductive regions 830*b* and 830*c*, respectively. Conductive regions 830*b* and 830*c* can be electrically coupled to each other (e.g., coupled to each other through an additional conductive region (e.g., conductive line), not shown in FIG. 8).

As shown in FIG. 8, there are open spaces (e.g., spaces in the x-direction) between conductive regions 830*b* and 830*c*. Thus, coupling conductive contacts 131 through 135 to respective conductive regions 192, 830*b*, and 830*c* may allow more room (e.g., room at the open spaces) for other connections (e.g., bottom conductive routings at the level of conductive regions 830*b* and 830*c*) of other components (not shown) of IC device 800.

Figure 9:
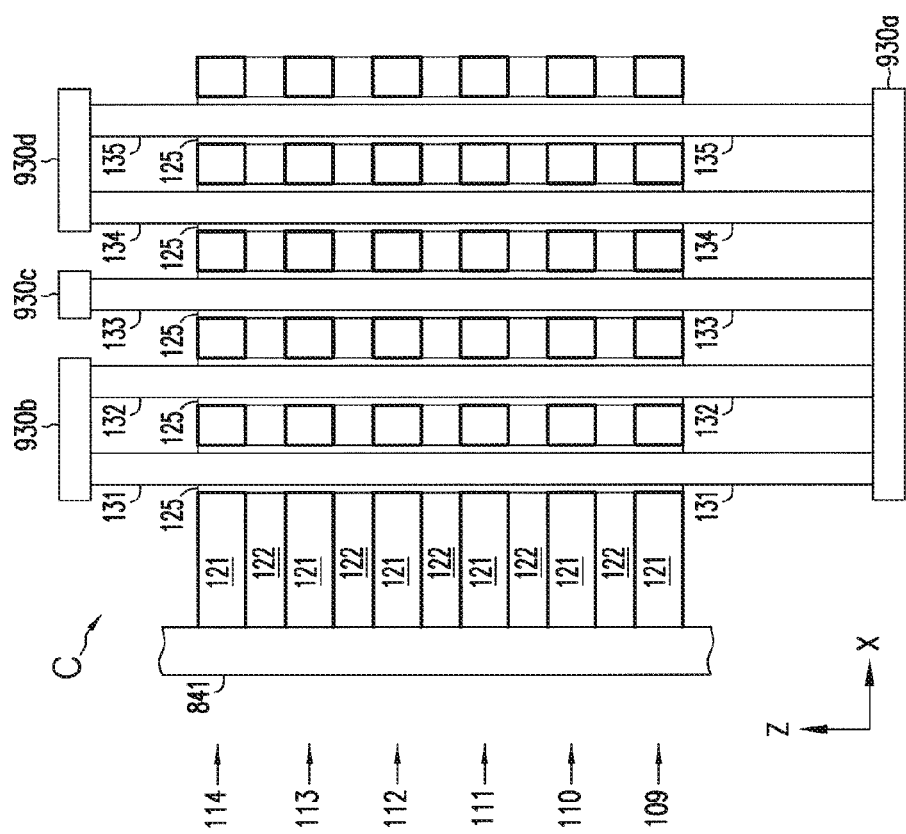
FIG. 9 shows an apparatus in the form of an IC device including a structure of a capacitor C having conductive contacts coupled to different conductive regions (e.g., top conductive regions), according to some embodiments described herein.

FIG. 9 shows an apparatus in the form of an IC device 900 including a structure of a capacitor C having conductive contacts 131 through 135 coupled to different conductive regions (e.g., top conductive regions) 930*a*, 930*b*, and 930*c*, according to some embodiments described herein. IC device 900 can include other elements (e.g., a substrate, conductive regions, and conductive paths) similar to those of IC devices shown in FIG. 1A, FIG. 2A, FIG. 3A, FIG. 4A, FIG. 5A, FIG. 6A, and FIG. 7. However, such elements are omitted from FIG. 9 for simplicity.

As shown in FIG. 9, each of conductive contacts 131 through 135 can include an end (e.g., a bottom end) contacting (electrically coupled to) conductive region 930*a*. Conductive contacts 131 through 135 can have ends (e.g., top ends) contacting (electrically coupled to) different conductive regions among conductive regions 930*a*, 930*b*, and 930*c*. For example, a top end of each of conductive contacts 131 and 132 can contact (can be electrically coupled to) conductive region 930*b*, a top end of conductive contact 133 can contact conductive region 930*c*, and a top end of each of conductive contacts 134 and 135 can contact (can be electrically coupled to) conductive region 930*d*. Conductive regions 930*a*, 930*b*, and 930*c* can be electrically coupled to each other (e.g., coupled to each other through an additional conductive region (e.g., conductive line) or through additional conductive regions (e.g., conductive lines), not shown in FIG. 8).

As shown in FIG. 9, there are open spaces (e.g., spaces in the x-direction) between conductive regions 930*b*, 930*c*, and 930*d*. Thus, coupling conductive contacts 131 through 135 to respective conductive regions 930*b*, 930*c*, and 930*d* may allow more room (e.g., room at the open spaces) for other connections (e.g., top conductive routings at the level of conductive regions 930*b*, 930*c*, and 930*d*) of other components (not shown) of IC device 900.

FIG. 10 through FIG. 21 show cross-sectional views of elements during processes of forming an IC device 1000 including a structure of a capacitor, according to some embodiments of the invention. Some of the processes of forming an IC device 1000 can be used to form some of the IC devices (e.g., IC device 100) described above with reference to FIG. 1A through FIG. 9.

Figure 10:
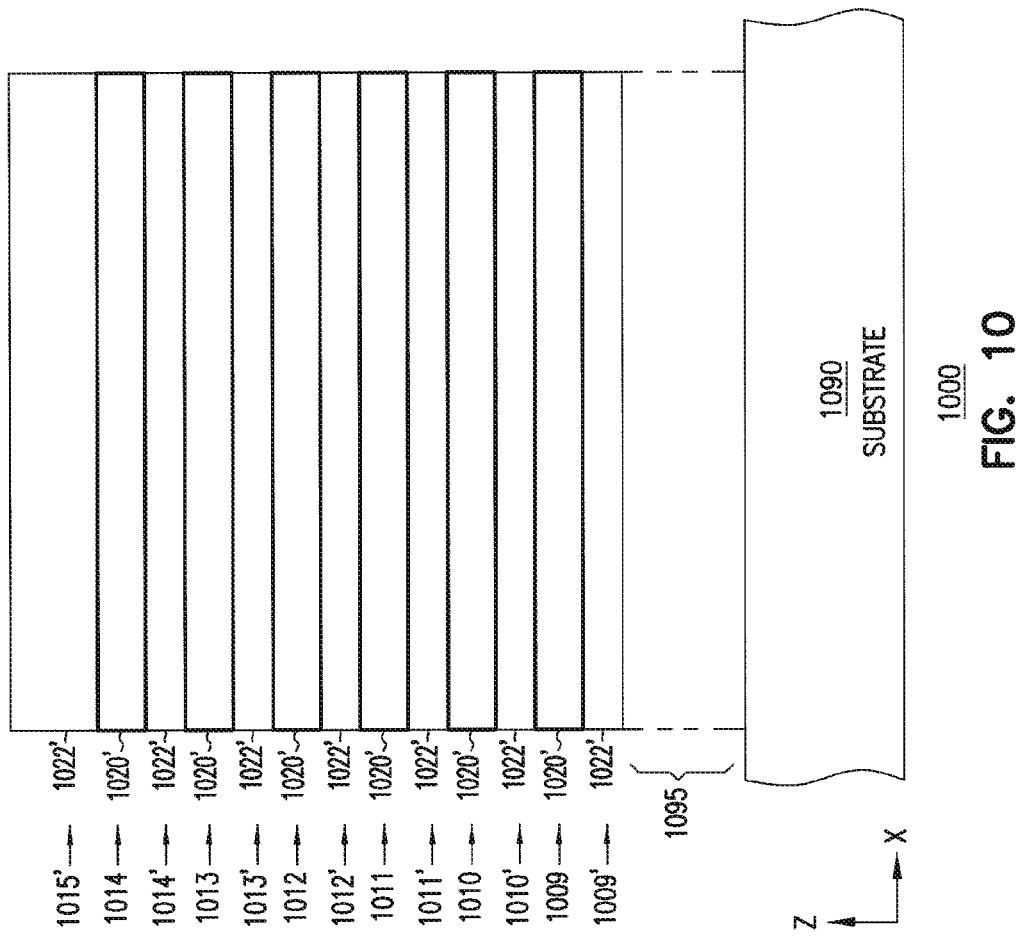
FIG. 10 through FIG. 21 show cross-sectional views of elements during processes of forming an IC device including a processes of forming a capacitor, according to some embodiments of the invention.

FIG. 10 shows IC device 1000 after dielectric materials 1020' are formed in respective levels 1009 through 1014 in the z-direction, and after dielectric materials 1022' are formed in respective levels 1009' through 1015' in the z-direction. The z-direction (e.g., vertical direction) is a direction perpendicular to (e.g., outward from) substrate 1090. The z-direction is also perpendicular to the x-direction. Substrate 1090 can be similar to (or the same as) substrate 190 described above with reference to FIG. 1A. As shown in FIG. 10, dielectric materials 1020' and 1022' can be formed over a portion 1095 of IC device 1000. In order not to obscure the embodiments (e.g., structures of an IC device) described herein, the processes of forming the structure of portion 1095 of IC device 1000 are omitted. However, one skilled in the art can recognize that portion 1095 can be formed (e.g., formed before dielectric materials 1020' and 1022' are formed) to include other elements of IC device 1000. Such other elements can include conductive regions such as conductive regions (e.g., 191, 192, 230, 340, 430, 440, 830*a*, 830*b*, and 930*a*) described above with reference to FIG. 1A through FIG. 9.

In FIG. 10, forming dielectric materials 1020' and 1022' can include depositing alternating dielectric materials (e.g., alternating layers of dielectric materials 1020' and layers of dielectric materials 1022') in respective levels 1009 through 1014 and 1009' through 1015' over substrate 1090 (e.g., over portion 1095 of substrate 1090). Dielectric materials 1020' can include a nitride material (e.g., silicon nitride $SiNO_4$). Dielectric materials 1022' can include an oxide material (e.g., silicon dioxide $SiO_2$).

FIG. 10 shows an example of 13 alternating dielectric materials 1020' and 1022' (e.g., 13 layers of alternating dielectric materials 1020' and 1022'). The number of dielectric materials 1020' and 1022' (e.g., the number of alternating layers of dielectric materials 1020' and 1022') can be different from 13, depending on the number of tiers of a capacitor (e.g., capacitor C in FIG. 20) to be formed in IC device 1000.

Figure 11:
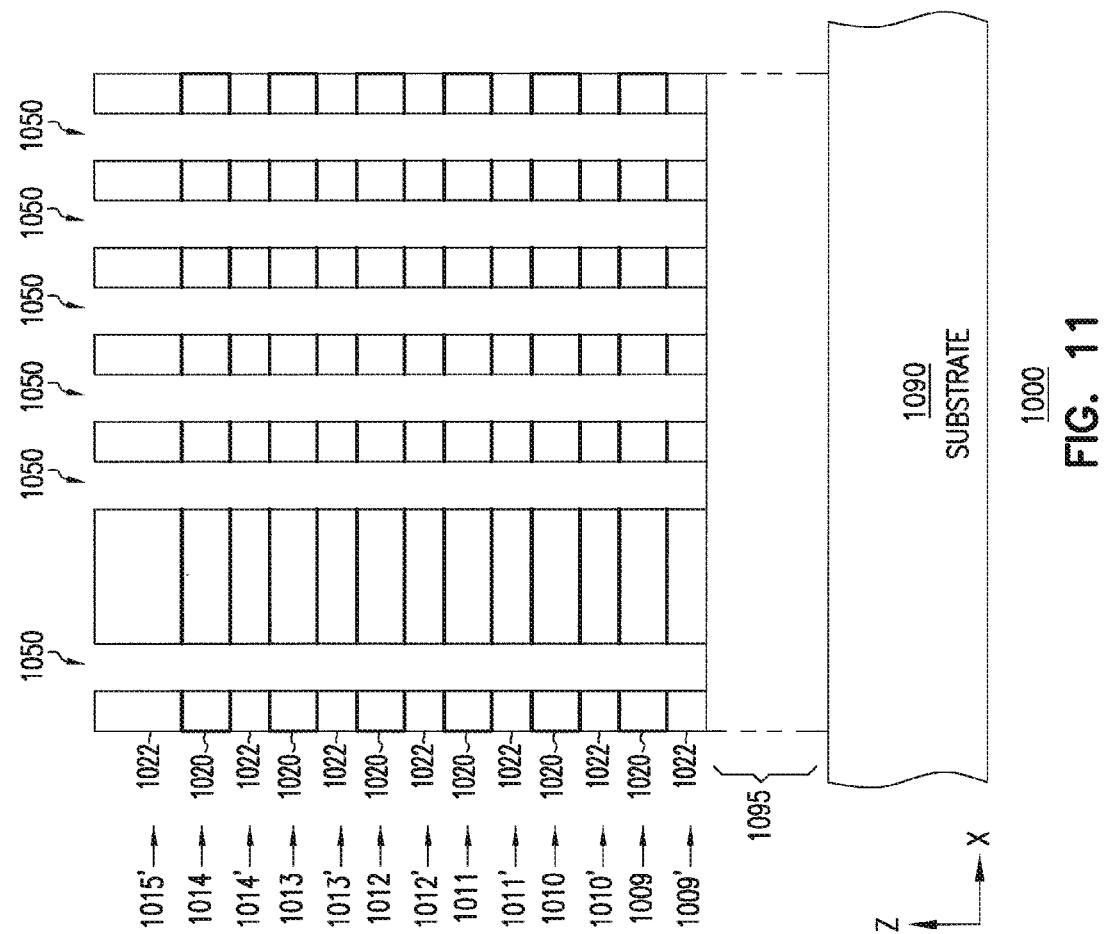

FIG. 11 shows IC device 1000 after holes 1050 are formed. Holes 1050 can include openings (e.g., vertical trenches) in dielectric materials 1020' and 1022'. Forming holes 1050 can include removing parts of dielectric materials 1020' and 1022' (at the locations of holes 1050) leaving a remaining part of dielectric materials 1020 and 1022 (FIG. 10) unremoved, which are dielectric materials 1020 and 1022, respectively, in FIG. 11. Removing parts of dielectric materials 1020' and 1022' (to form holes 1050) can include drilling, etching, or other techniques for removing material.

Figure 12:
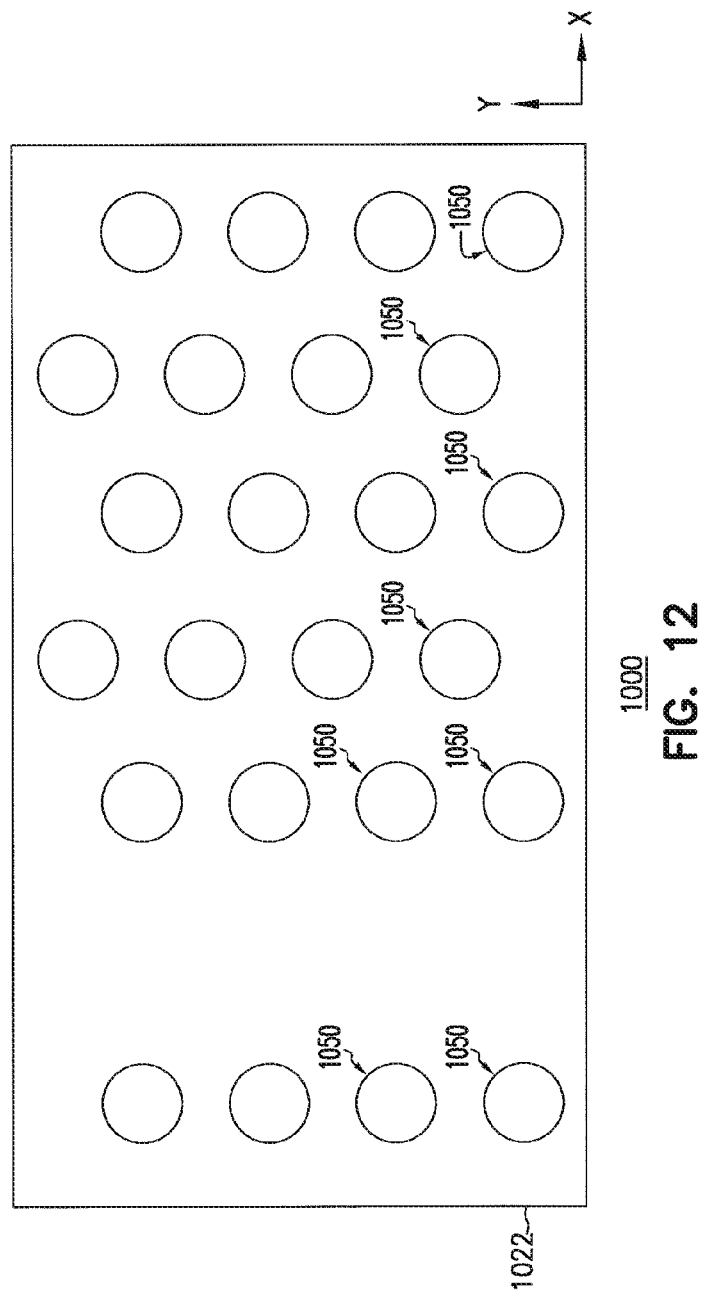

FIG. 12 shows a top view of IC device 1000 of FIG. 11. As shown in FIG. 12, holes 1050 can be formed in rows and columns in the x-direction and y-direction (e.g., a plane which is perpendicular to the z-direction).

Figure 13:
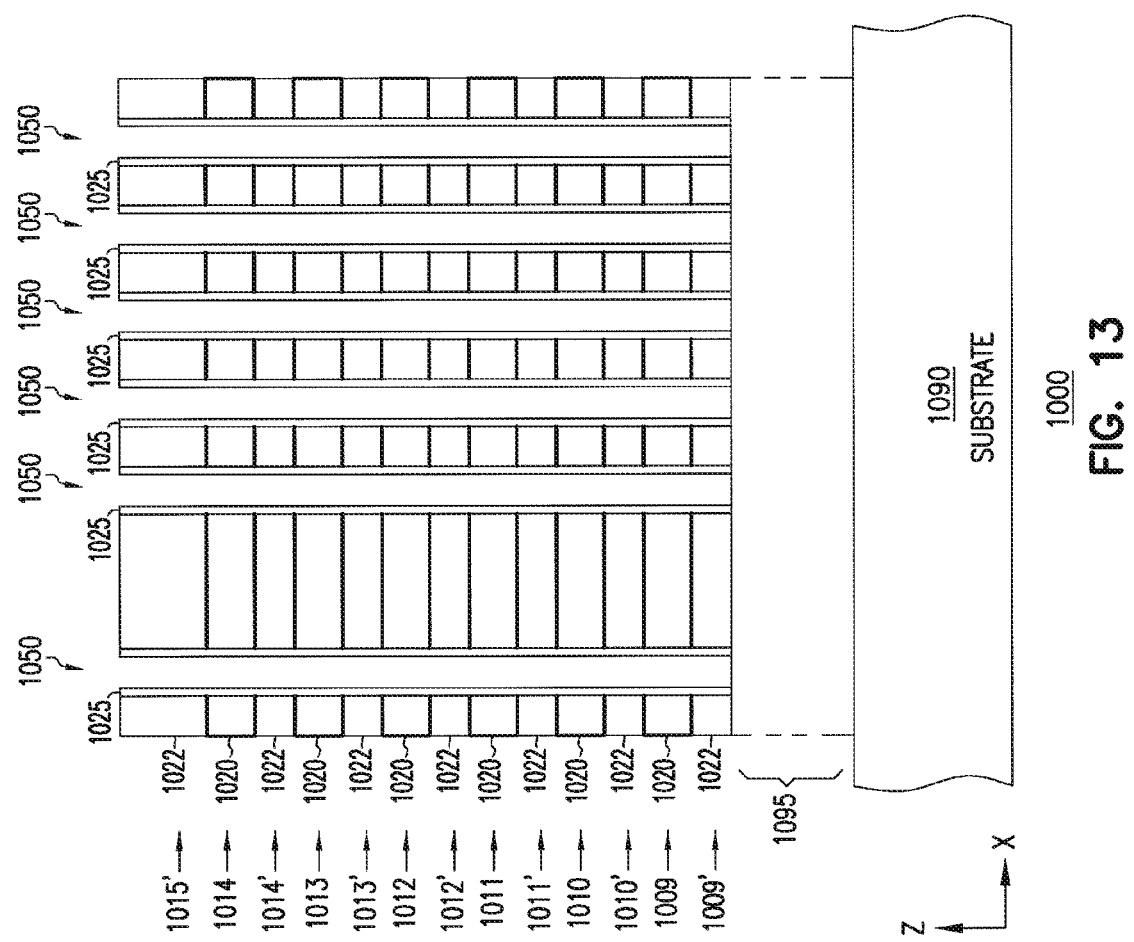

FIG. 13 shows IC device 1000 after dielectric materials 1025 are formed in holes 1050. Forming dielectric materials 1025 can include depositing dielectric materials on a wall (e.g., sidewall) of each of holes 1050. Dielectric materials 1025 can include an oxide material (e.g., silicon dioxide $SiO_2$) or other dielectric materials.

Figure 14:
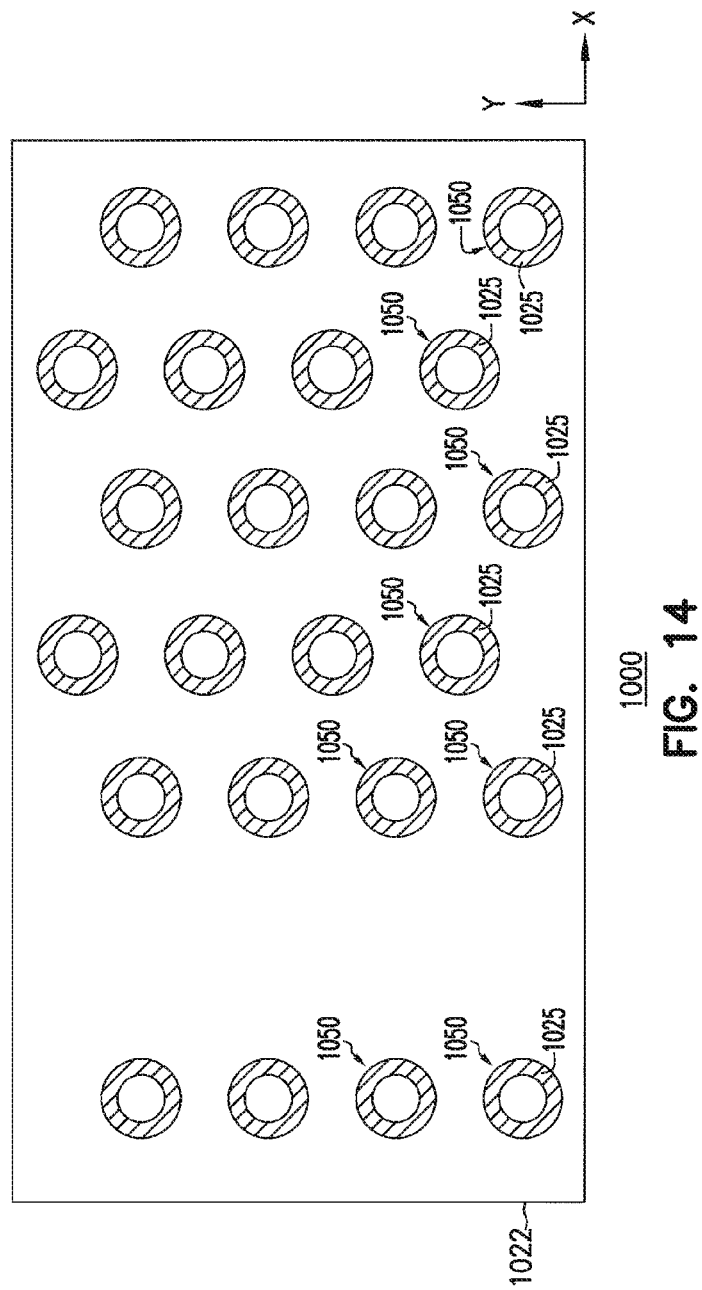

FIG. 14 shows a top view of IC device 1000 of FIG. 13. As shown in FIG. 14, in a respective hole among holes 1050, dielectric material 1025 can be a relatively thin dielectric liner conformal to the wall of the respective hole.

Figure 15:
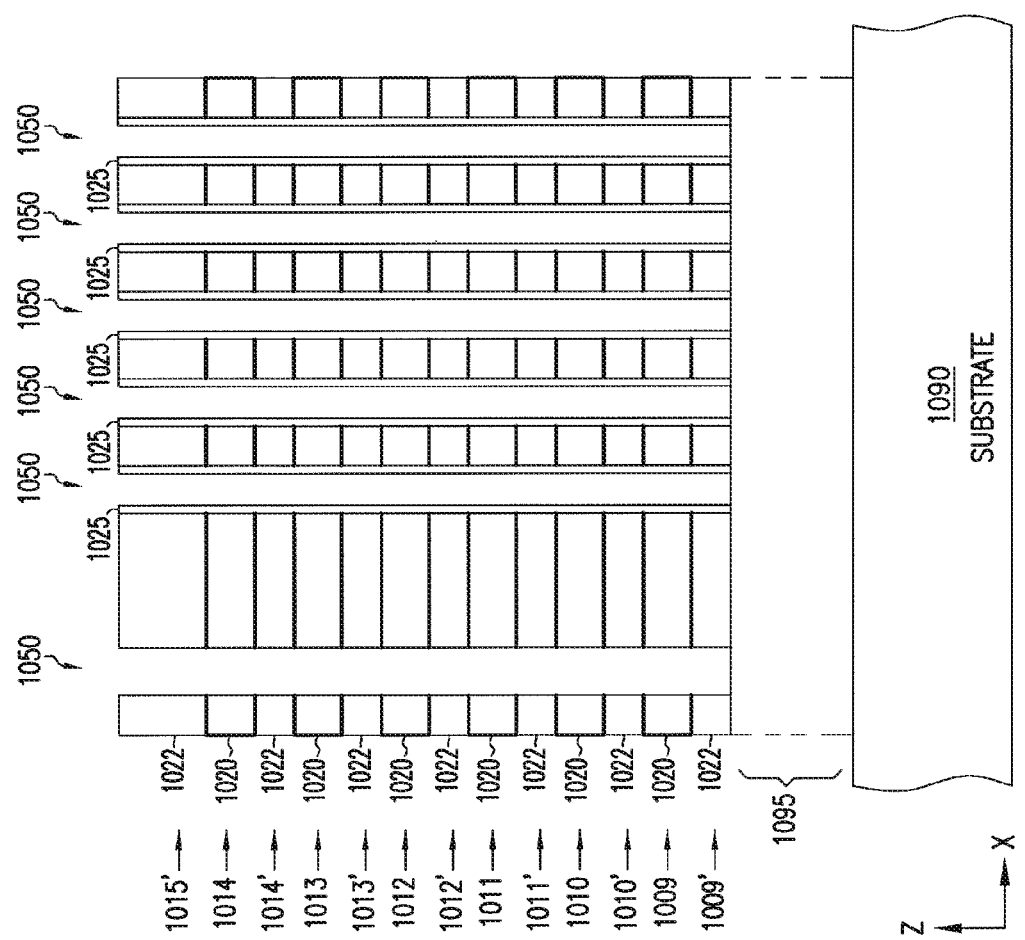
Figure 16:
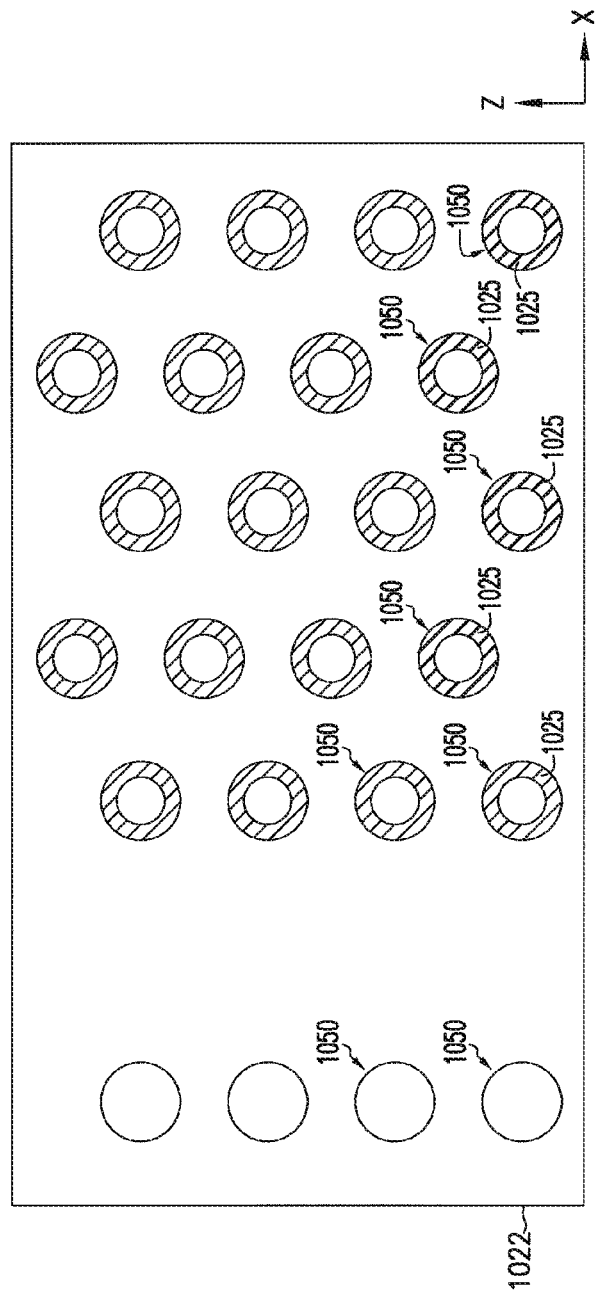

FIG. 15 shows IC device 1000 after some (e.g., a group) of dielectric materials 1025 are removed from some (e.g., a group) of holes 1050. FIG. 16 shows a top view of IC device

1000 of FIG. 15. As shown in FIG. 15 and FIG. 16, a group of dielectric materials 1025 are removed from a group of holes 1050 (e.g., the left-most holes among holes 1050). Another group of (e.g., the rest of) dielectric materials 1025 can be kept (is not removed) in another group (e.g., the rest) of holes 1050.

Figure 17:
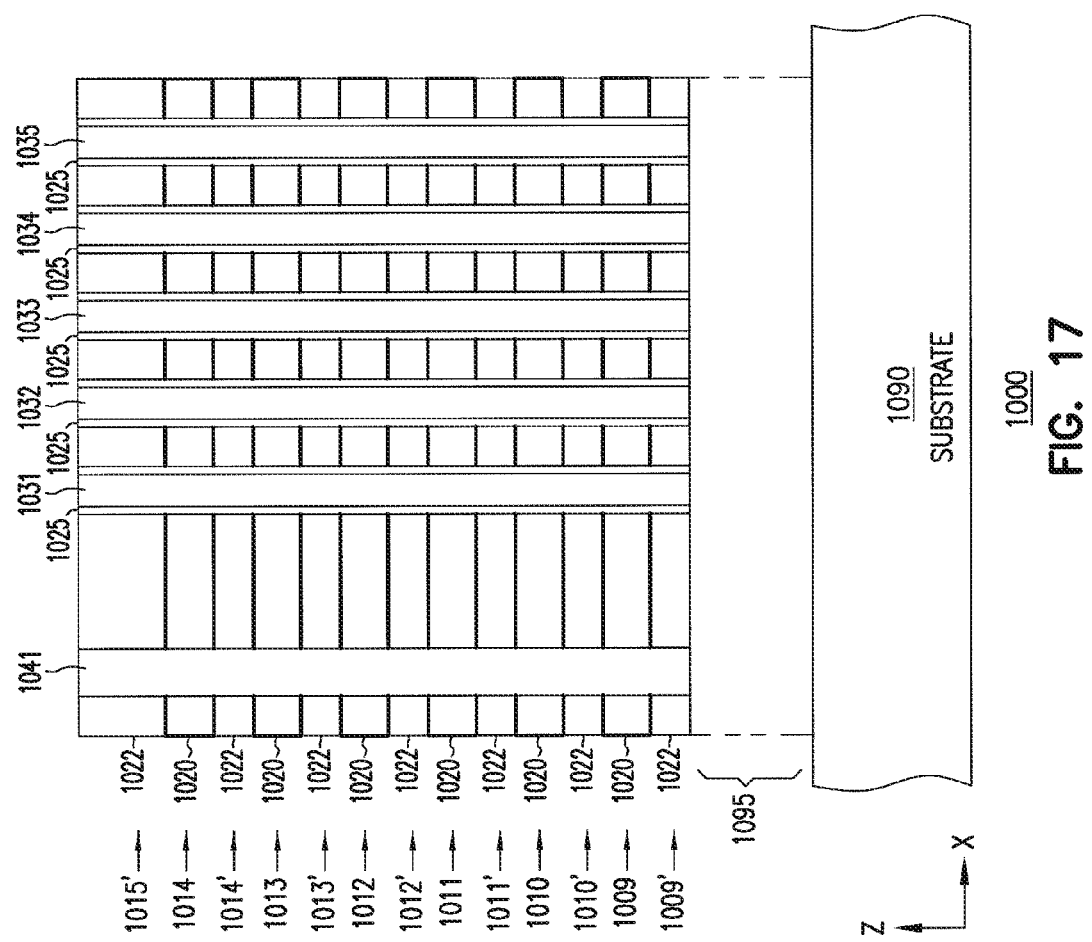

FIG. 17 shows IC device 1000 after conductive contacts 1041 and 1031 through 1035 are formed in respective holes 1050. Conductive contacts 1041 and 1031 through 1035 can be concurrently formed (e.g., formed in the same process step). For example, forming conductive contacts 1041 and 1031 through 1035 can include depositing conductive materials in holes 1050. The conductive materials (that form conductive contacts 1041 and 1031 through 1035) can include conductively doped polysilicon or other conductive materials. Conductive contacts 1031 through 1035 and 1041 can correspond to conductive contacts 141 and 131 through 135, respectively, of a capacitor C of one of IC devices 100, 200, 300, 400, 500, 600, 700, 800, and 900 described above.

Figure 18:
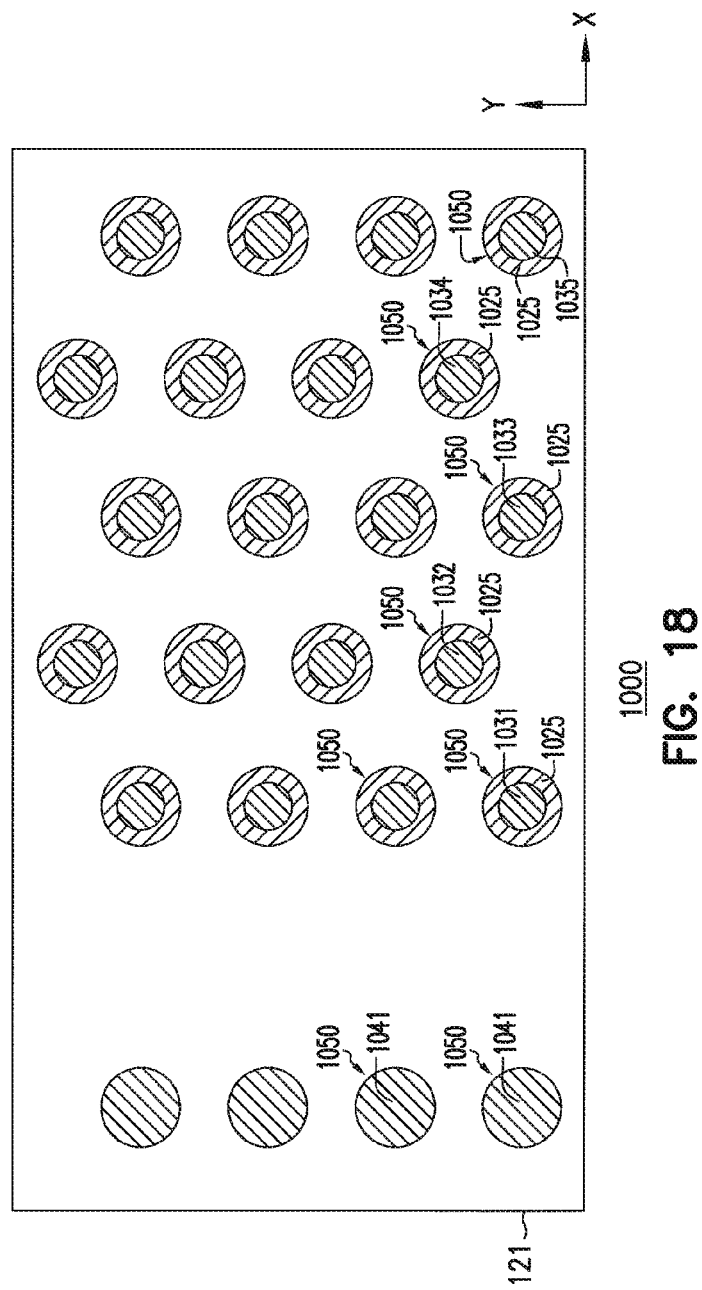

FIG. 18 shows a top view of IC device 1000 of FIG. 17. As shown in FIG. 18, conductive contact 1041 in a respective hole 1050 is not surrounded by a dielectric material 1025. However, each of conductive contacts 1031 through 1035 in a respective hole among holes 1050 is surrounded by a dielectric material 1025.

Figure 19:
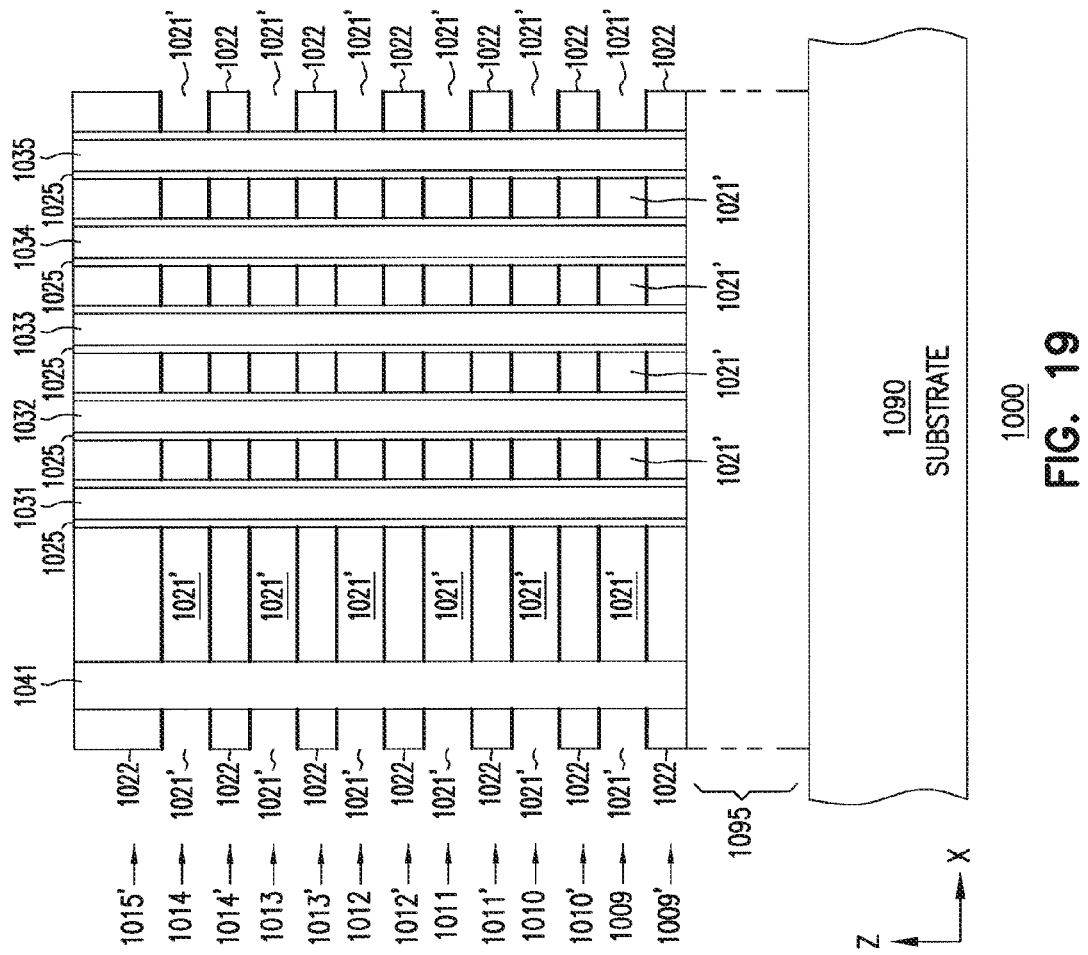

FIG. 19 shows IC device 1000 after dielectric materials 1020 (FIG. 17) are removed from locations 1021'. An etch process can be used to remove dielectric materials 1020 from locations 1021'. Locations 1021' are empty spaces (voids) adjacent conductive contact 1041, dielectric materials 1022, and dielectric materials 1025. As shown in FIG. 19, conductive contact 1041, dielectric materials 1022, and dielectric materials 1025 (surrounding conductive contacts 1031 through 1035) are not removed from IC device 1000. In FIG. 19, conductive contacts 141 and 131 through 135 (and dielectric materials 1025) can be support structures to prevent dielectric materials 1022 from collapsing.

Figure 20:
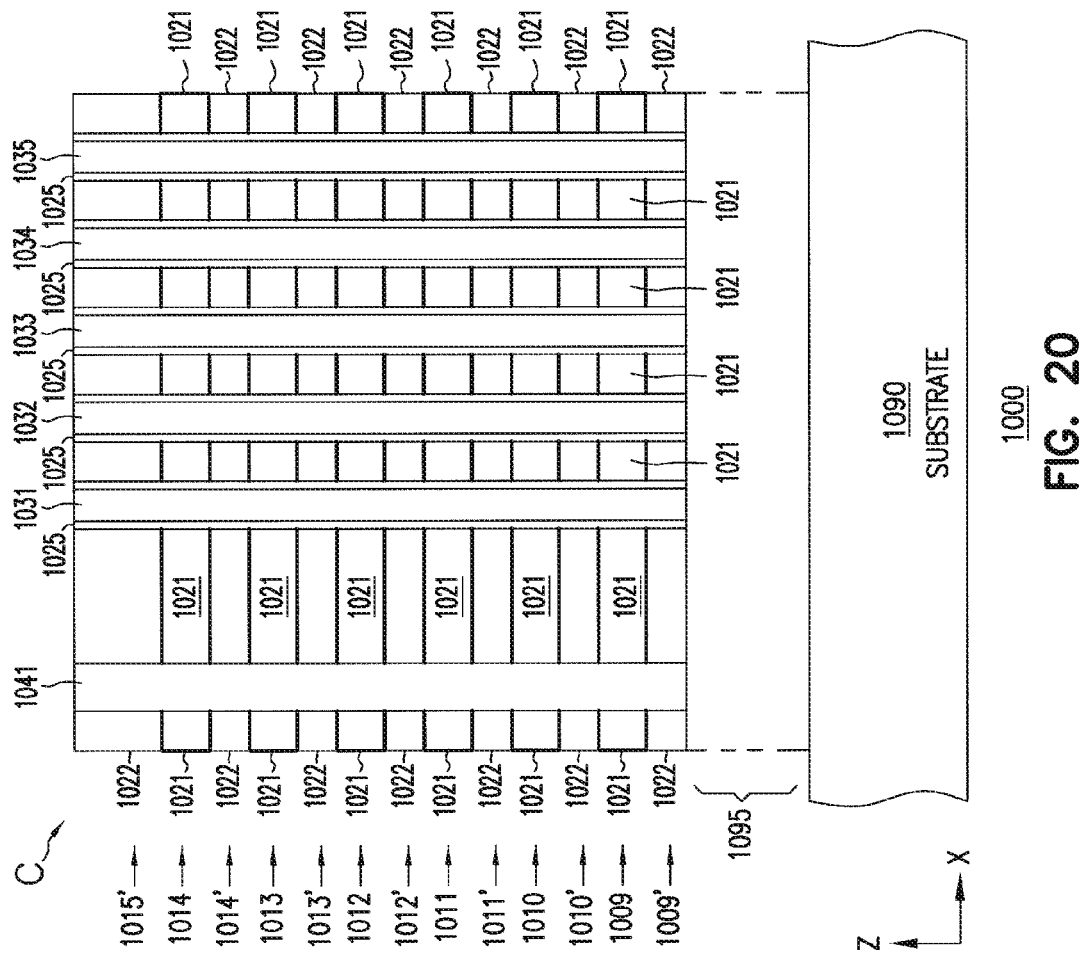

FIG. 20 shows IC device 1000 after conductive materials 1021 are formed in locations 1021' (FIG. 19). Each of conductive materials 1021 can be metal. Alternatively, each of conductive materials 1021 can be other conductive materials. In FIG. 20, forming conductive materials 1021 can include depositing a conductive material (e.g., tungsten or other metals) in locations 1021' (FIG. 19). As shown in FIG. 20, each of conductive contacts 1031 through 1035 can be electrically separated (e.g., can be electrically isolated) from conductive materials 1021 by dielectric materials 1025. However, conductive contact 1041 is not electrically separated (is not electrically isolated) from conductive materials 1021. Conductive contact 1041 can contact (can be electrically coupled to) conductive materials 1021.

Conductive materials 1021, dielectric materials 1022 and 1025, and conductive contacts 1041 and 1031 through 1035 in FIG. 20 can be parts of capacitor C of IC device 1000. Conductive materials 1021 and dielectric materials 1022 can correspond to conductive materials 121 and dielectric materials 122, respectively, of capacitor C of one of IC devices 100, 200, 300, 400, 500, 600, 700, 800, and 900 described above.

Figure 21:
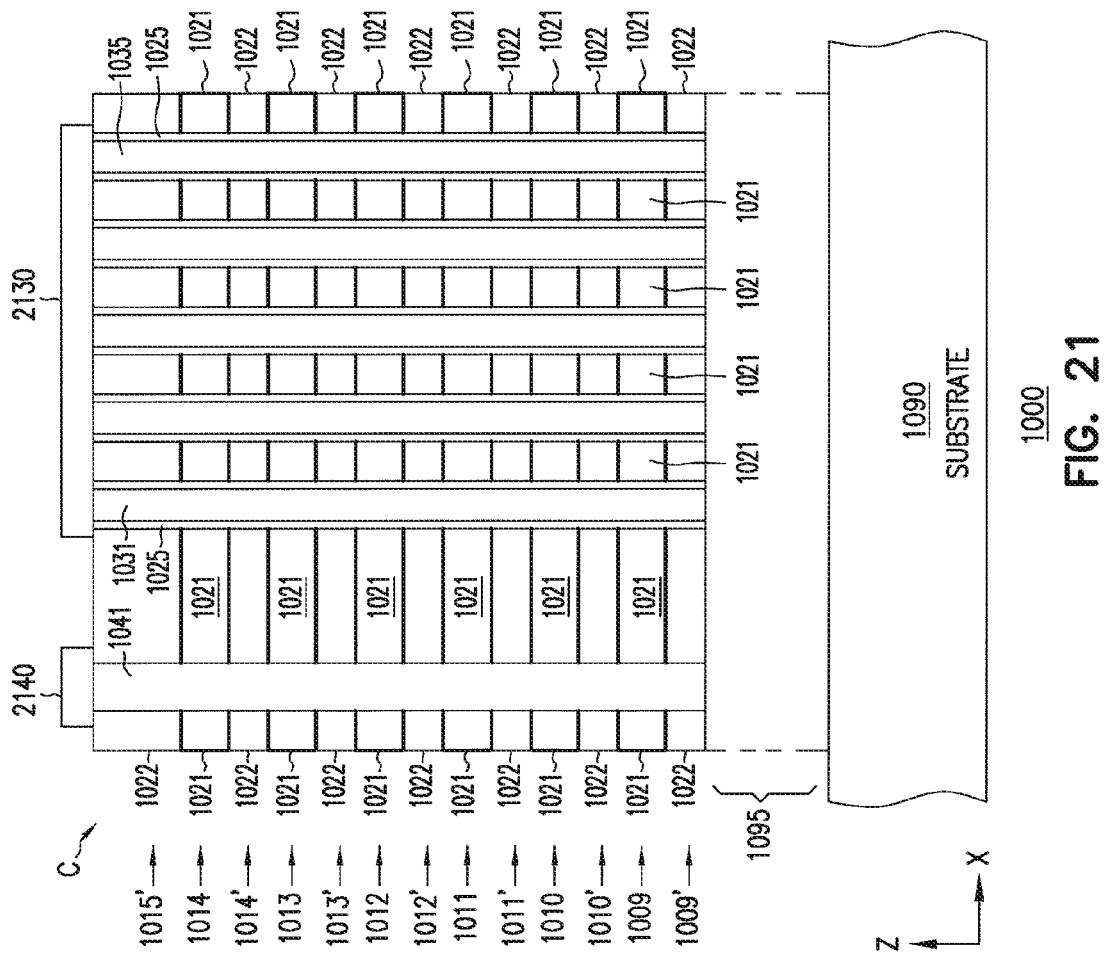
Figure 22:
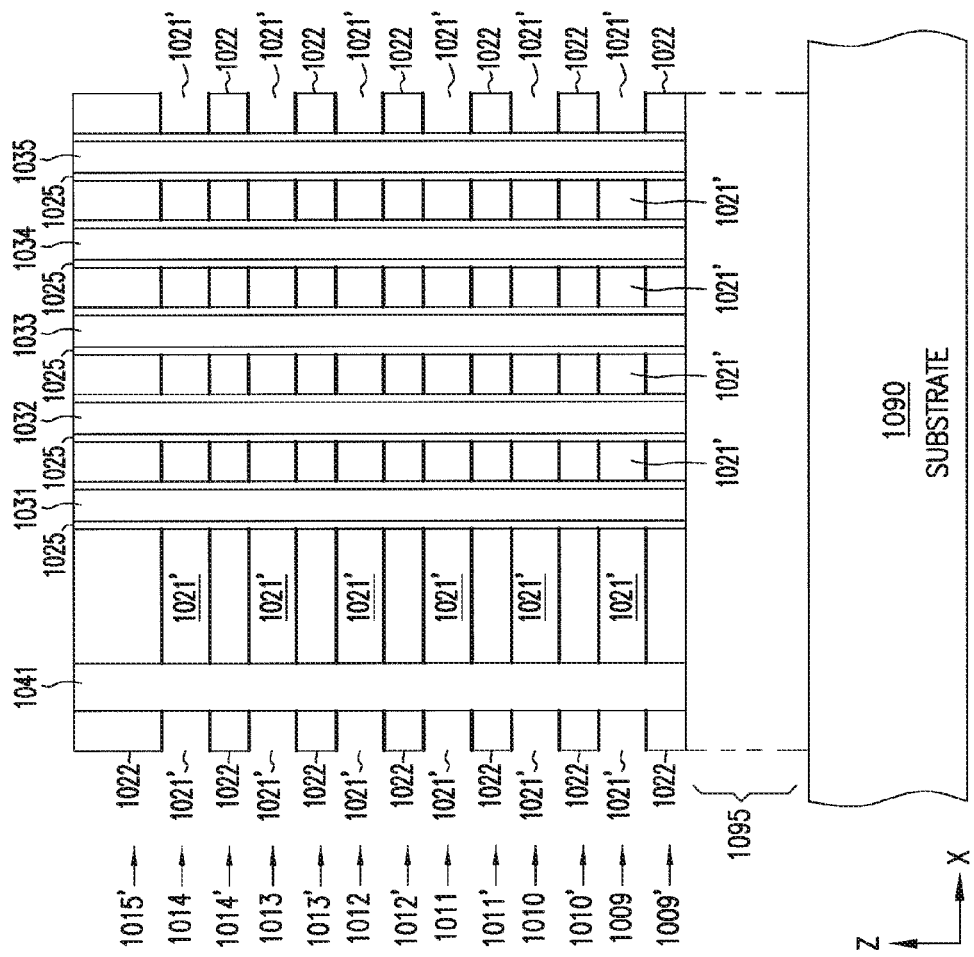
FIG. 22 through FIG. 25 show cross-sectional views of elements during processes of forming an IC device including dielectric material liners, according to some embodiments described herein.

FIG. 21 shows IC device 1000 after other elements of capacitor C of IC device 1000 are formed. For example, conductive regions 2130 and 2140 can be formed, such that conductive region (e.g., conductive line) 2130 can contact each of conductive contacts 1031 through 1035, and conductive region (e.g., conductive line) 2140 can contact conductive contact 1041. Conductive regions 2130 and 2140 are formed to have structures as shown in FIG. 21 as an example. However, conductive regions 2130 and 2140 can be formed to have other structures, such that capacitor C of IC device 1000 can include elements similar to (or the same as) capacitor C of one of IC devices 100, 200, 300, 400, 500, 600, 700, 800, and 900 described above. In FIG. 21, additional elements can be formed for IC device 1000 by techniques known to those skilled in art, such that IC device 1000 can include elements similar to (or the same as) one of IC devices 100, 200, 300, 400, 500, 600, 700, 800, and 900 described above.

The processes of forming capacitor C of IC device 1000 can be adjusted (e.g., modified) such that some of the processes, materials, or both, described above with reference to FIG. 10 through FIG. 21, can be modified, omitted, or both. For example, in FIG. 10, dielectric materials 1020' are formed in respective levels 1009 through 1014. However, in an alternate technique (e.g., method) of forming capacitor C of IC device 1000, dielectric materials 1020' can be replaced with conductive materials (e.g., conductively doped polysilicon or other conductive materials).

In the alternate technique where dielectric materials 1020' (FIG. 10) are replaced with conductive materials, some of the processes (e.g., process steps) described above with reference to FIG. 10 through FIG. 21 can be omitted. For example, the alternate technique can include processes similar to (or the same as) the processes described above with reference to FIG. 10 through FIG. 18. However, the processes associated with FIG. 19 and FIG. 20 can be omitted from the alternate technique. For example, after the processes associated with FIG. 17 and FIG. 18 (described above), the alternate technique can omit processes associated with FIG. 19 and FIG. 20 and continue with the processes associated with FIG. 21. This means that the alternate technique can omit the processes of forming conductive materials 1021 (associated with FIG. 19 and FIG. 20) because materials 1020 in FIG. 17 in the alternate technique are already conductive materials (e.g., conductively doped polysilicon) that were initially formed in the processes associated with FIG. 10. Thus, in the alternate technique, conductive materials (which replace dielectric materials 1020' in FIG. 10) can be formed before conductive contacts 1041 and 1031 through 1035 are formed (e.g., formed in the processes associated with FIG. 17). In contrast, in capacitor C of IC device 1000, conductive materials 1021 (FIG. 19) are formed after conductive contacts 1041 and 1031 through 1035 are formed. The structure of the capacitor formed from the alternate technique can be similar to (or the same as) the structure of capacitor C of IC device 1000 shown in FIG. 21, except that conductive materials 1021 in FIG. 21 in the alternate technique would replace dielectric materials 1020' in FIG. 10.

The capacitor described herein (e.g., capacitor C of IC devices 100 and 1000 and other devices described herein) can have improvements and benefits over some conventional capacitors. For example, some conventional capacitors may have a structure (e.g., a staircase structure), such that many layers in such a structure are unused in order to avoid defects (e.g., due to process variations) and to improve functionality of such some conventional capacitors. Such unused layers may limit the capacitor density of the conventional capacitors. In capacitor C of IC device 1000, since the conductive contacts (e.g., conductive contacts 1041 and 1031 through 1035) of capacitor C go through the tiers (e.g., go through conductive materials 1021) of capacitor C, no unused conductive materials 1021 may be present in capacitor C of IC device 1000. This allows capacitor C of IC device 1000 to have a relatively higher capacitor density than some conventional capacitors for a given device area (e.g., a given device area in the z-direction).

Moreover, some conventional capacitors may have a structure (e.g., a staircase structure), such that the size (e.g., the size relative to the x-y directions) of such conventional capacitors becomes larger when the number of layers (e.g., layers in a staircase structure) grows to accommodate an increase the capacitance value. In capacitor C of IC device 1000, since the conductive contacts (e.g., conductive contacts 1041 and 1031 through 1035) go through the tiers (e.g., go through conductive materials 1021) of capacitor C, the structure of capacitor C can be different from the structure (e.g., different from a staircase structure) of some conventional capacitors. Thus, an increase in the number of tiers (e.g., in order to increase the capacitance value) of capacitor C may cause a negligible or no change in the size (e.g., the size relative to the x-y directions) of capacitor C. Thus, for a given capacitor value, the size (e.g., the size relative to the x-y directions) of capacitor C of IC device 1000 can be relative smaller than the size of some conventional capacitors.

Further, conventional capacitors having a certain structure (e.g., a staircase structure, as discussed above) may need additional support structures during processes of forming such conventional capacitors. The additional support structures remain in the structure of such conventional capacitors after the conventional capacitors are formed. Such additional support structures may create parasitic components (e.g., parasitic capacitance) that may reduce the efficiency of the conventional capacitors. In capacitor C of IC device 1000, since conductive contacts (e.g., conductive contacts 1041 and 1031 through 1035) are parts of capacitor C, additional support structures may not be needed during the processes of forming capacitor C. For example, as shown in FIG. 19, conductive contacts 1041 and 1031 through 1035 (and dielectric materials 1025) can be support structures that can prevent dielectric materials 1022 from collapsing when dielectric materials 1020 (FIG. 17) were removed from locations 1021' (FIG. 19). The absence of additional support structures in capacitor C may allow capacitor C to have relatively less parasitic components in comparison with some conventional capacitors. Thus, capacitor C can be more efficient than some conventional capacitors for a given capacitor value.

The improvements and benefit of capacitor C of IC devices 100 and 1000 discussed above can also be applied to the capacitor C of other devices described below with reference to FIG. 22 through FIG. 37.

FIG. 22 through FIG. 25 show cross-sectional views of elements during processes of forming an IC device 2200, according to some embodiments described herein. IC device 2200 can be a variation of IC device 1000. Thus, some of the processes (described above with reference to FIG. 10 through FIG. 21) used to form IC device 1000 can be used to form IC device 2200 of FIG. 22 through FIG. 25. For example, the elements of IC device 2200 in FIG. 22 can be formed by similar or the same processes that are used to form the elements of IC device 1000 of FIG. 19. Thus, IC device 2200 in FIG. 22 can be formed using processes described above with reference to FIG. 11 through FIG. 19.

Figure 23:
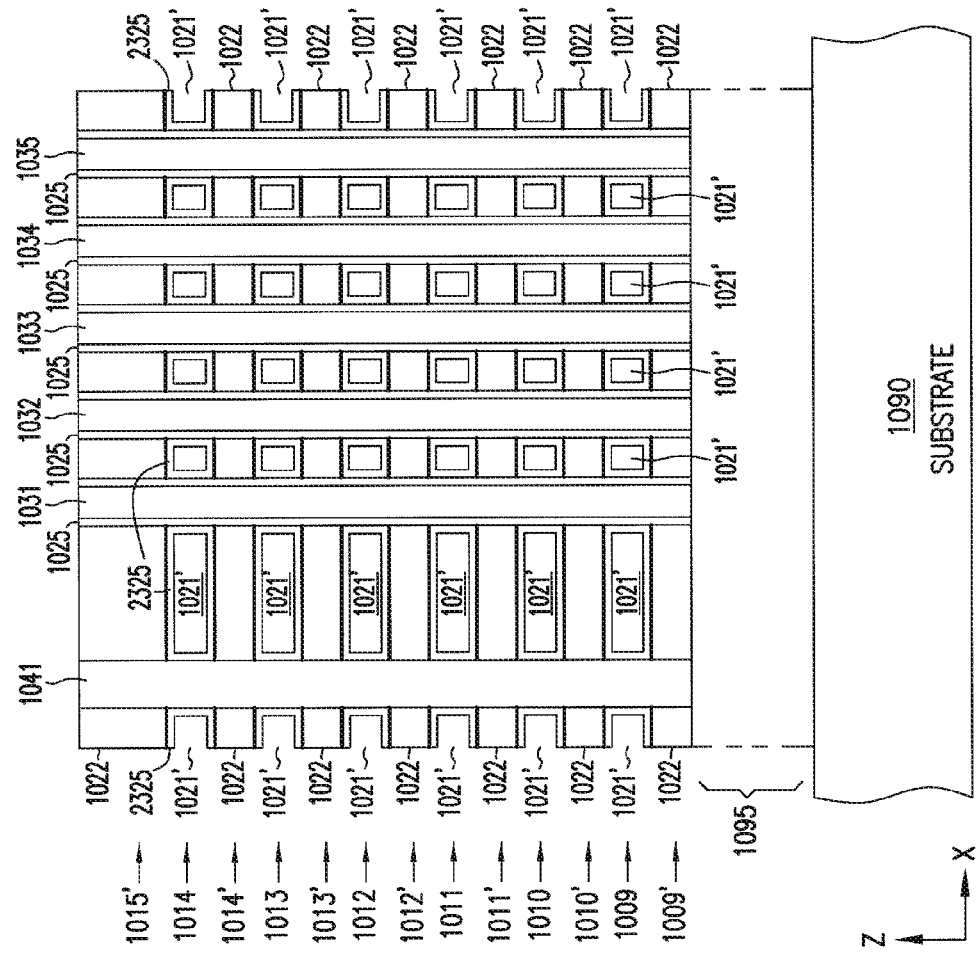

FIG. 23 shows IC device 2200 after dielectric materials (e.g., dielectric liners) 2325 are formed in locations 1021'. Dielectric materials 2325 can include an oxide material (e.g., silicon dioxide SiO$_2$) or other dielectric materials. Dielectric materials 2325 can be formed on walls of materials at locations 1021' leaving portions (e.g., middle portions) of locations 1021' unfilled (e.g., void of dielectric materials 2325). For example, as shown in FIG. 23, dielectric materials 2325 can be formed on walls of dielectric materials 1022 at locations 1021', walls of dielectric materials 1025 at locations 1021', and walls of conductive contact 1041 at locations 1021'.

Figure 24:
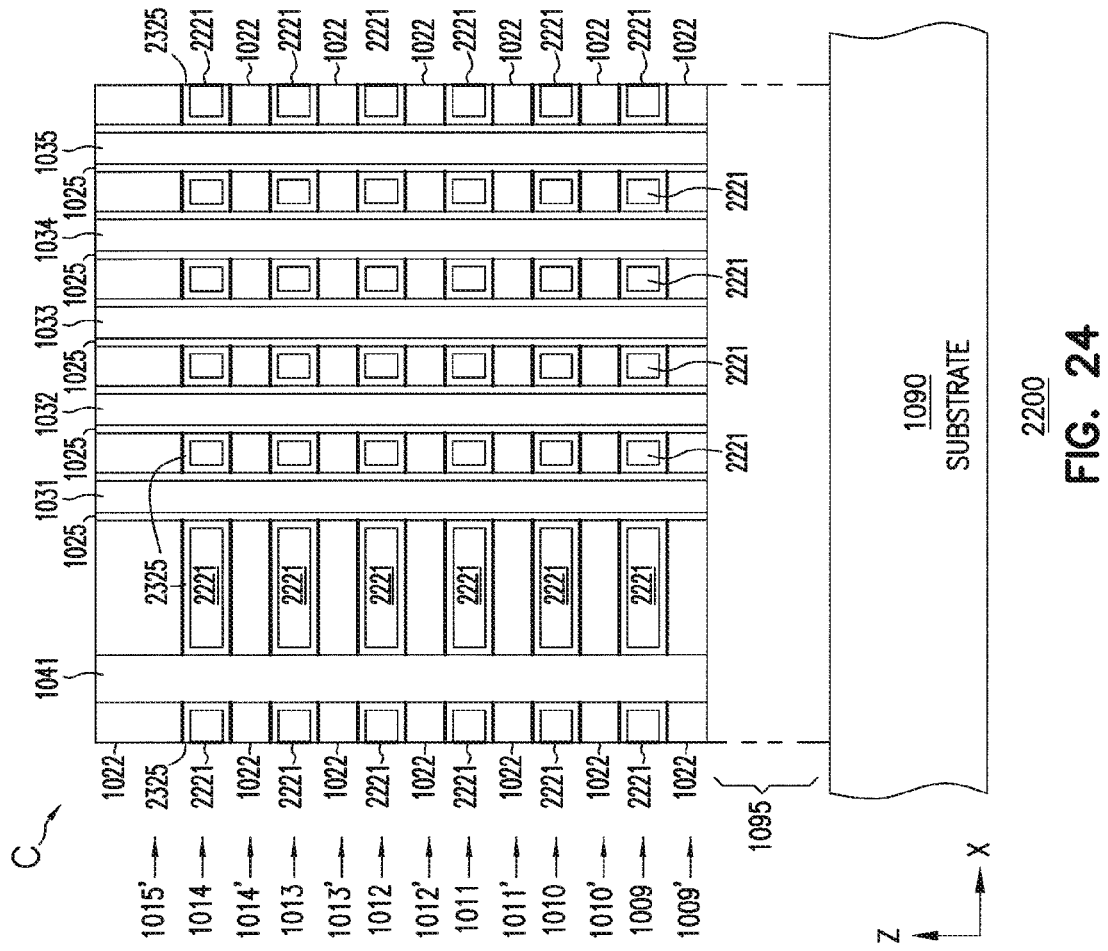

FIG. 24 shows IC device 2200 after conductive materials 2221 are formed in locations 1021' (FIG. 23). Each of conductive materials 2221 can be metal. Alternatively, each of conductive materials 2221 can be other conductive materials. In FIG. 24, forming conductive materials 2221 can include depositing a conductive material (e.g., tungsten or other metals) in locations 1021' (FIG. 23) that are not occupied by dielectric materials 2325. For example, conductive materials 2221 can be deposited on dielectric materials 2325 in locations 1021'. As shown in FIG. 24, each of conductive contacts 1031 through 1035 can be electrically separated from conductive materials 2221 by dielectric materials 1025 and 2325. Conductive contact 1041 can be electrically separated from conductive materials 2221 by dielectric materials 2325. Conductive materials 2221, dielectric materials 1022, 1025, and 2325, and conductive contacts 1041 and 1031 through 1035 can be parts of capacitor C of IC device 2200. Dielectric materials 2325 may be omitted from the structure of capacitor C of C of IC device 2200. However, the inclusion of dielectric materials 2325 can improve the structure and operations of capacitor C of IC device 2200.

Figure 25:
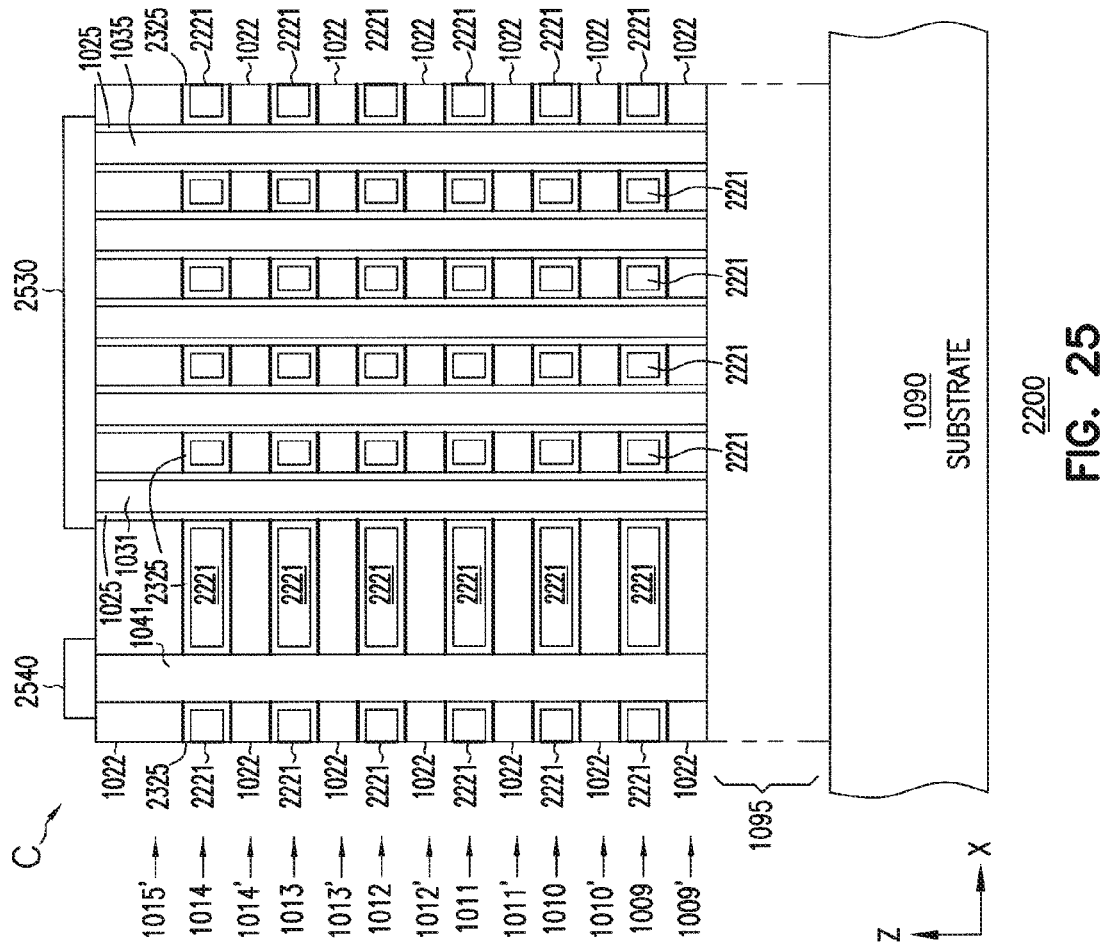
Figure 26:
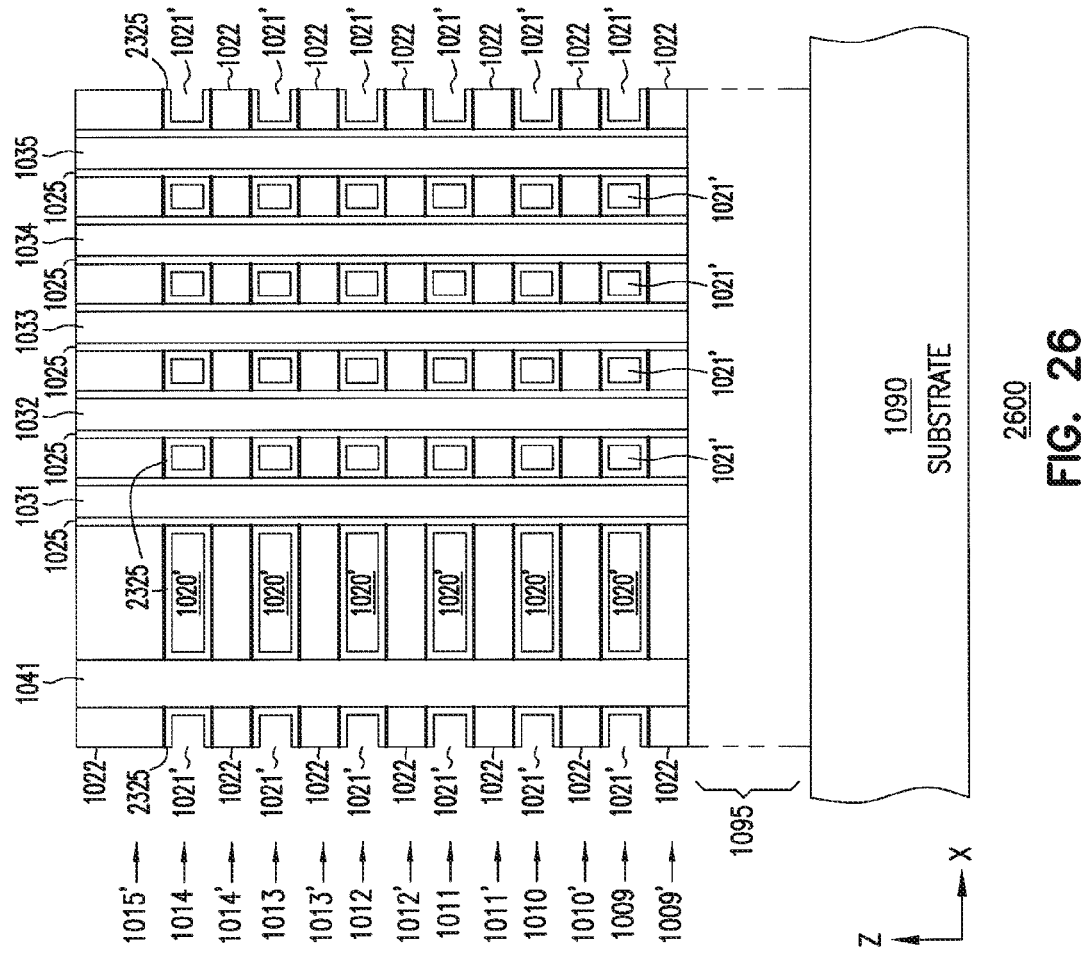
FIG. 26 through FIG. 29 show cross-sectional views of elements during processes of forming an IC device including selective dielectric material liners, according to some embodiments described herein.

FIG. 25 shows IC device 2200 after other elements of capacitor C of IC device 2200 are formed. For example, conductive regions 2530 and 2540 can be formed, such that conductive region (e.g., conductive line) 2530 can contact each of conductive contacts 1031 through 1035, and conductive region (e.g., conductive line) 2540 can contact conductive contact 1041. Conductive regions 2530 and 2540 are formed to have structures as shown in FIG. 25 as an example. However, conductive regions 2530 and 2540 can be formed to have other structures, such that capacitor C of IC device 2200 can include elements similar to (or the same as) capacitor C of one of IC devices 100, 200, 300, 400, 500, 600, 700, 800, and 900 described above. In FIG. 25, additional elements can be formed for IC device 220 by techniques known to those skilled in the art, such that IC device 2200 can include elements similar to (or the same as) one of IC devices 100, 200, 300, 400, 500, 600, 700, 800, and 900 described above.

FIG. 26 through FIG. 29 show cross-sectional views of elements during processes of forming an IC device 2600, according to some embodiments described herein. IC device 2600 can be a variation of IC device 2200. Thus, some of the processes (described above with reference to FIG. 10 through FIG. 25) used to form IC device 1000 and 2200 can be used to form IC device 2600 of FIG. 26 through FIG. 29. For example, the elements of IC device 2600 in FIG. 22 can be formed by similar or the same processes that are used to form the elements of IC device 2200 of FIG. 23. Thus, IC device 2600 in FIG. 26 can be formed using processes described above with reference to FIG. 11 through FIG. 23.

Figure 27:
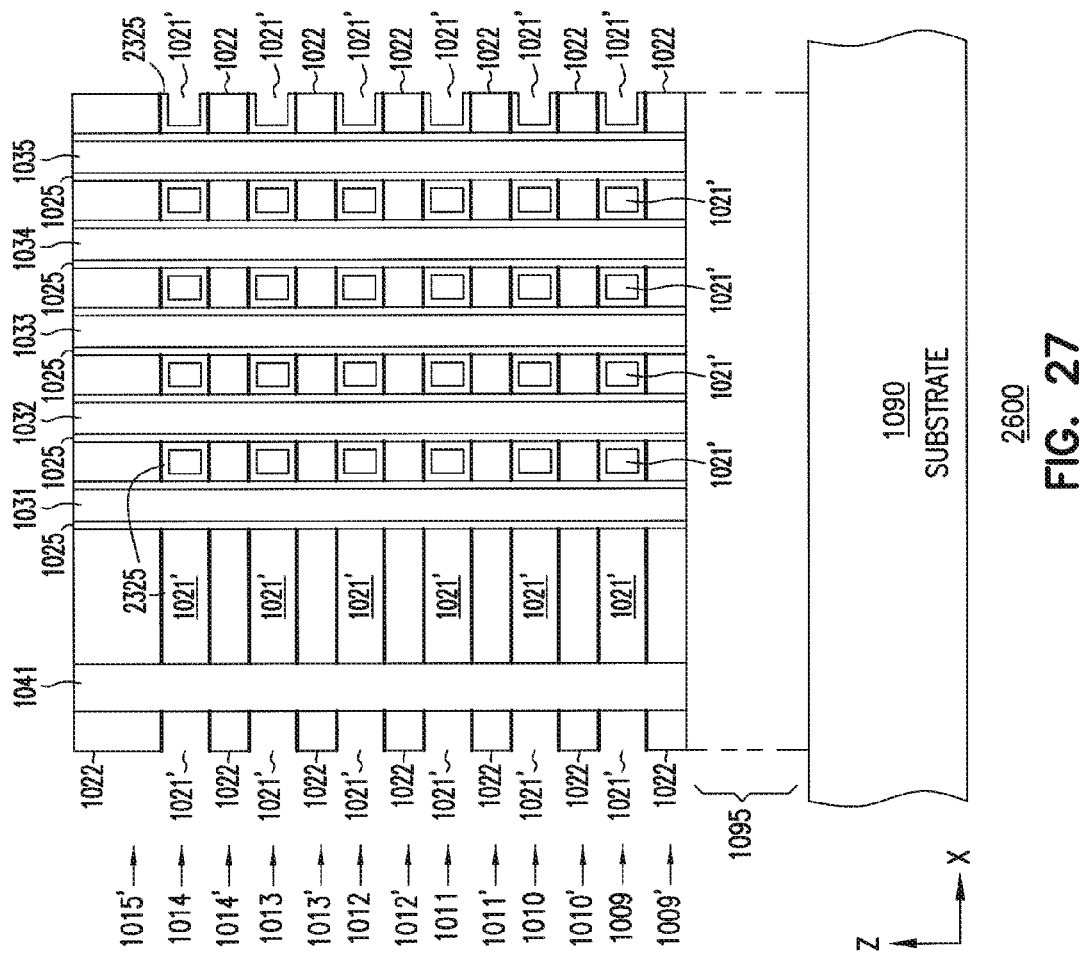

FIG. 27 shows IC device 2600 after a group of (e.g., some of) dielectric materials (e.g., dielectric liners) 2325 are removed from some of locations 1021'. For example, a group of dielectric materials 2325 is removed from the walls (e.g., sidewalls) of conductive contact 1041 at locations 1021' and from the walls of dielectric materials 1022 and 1025 at locations 1021' adjacent (e.g., immediately next to) conductive contact 1041.

Figure 28:
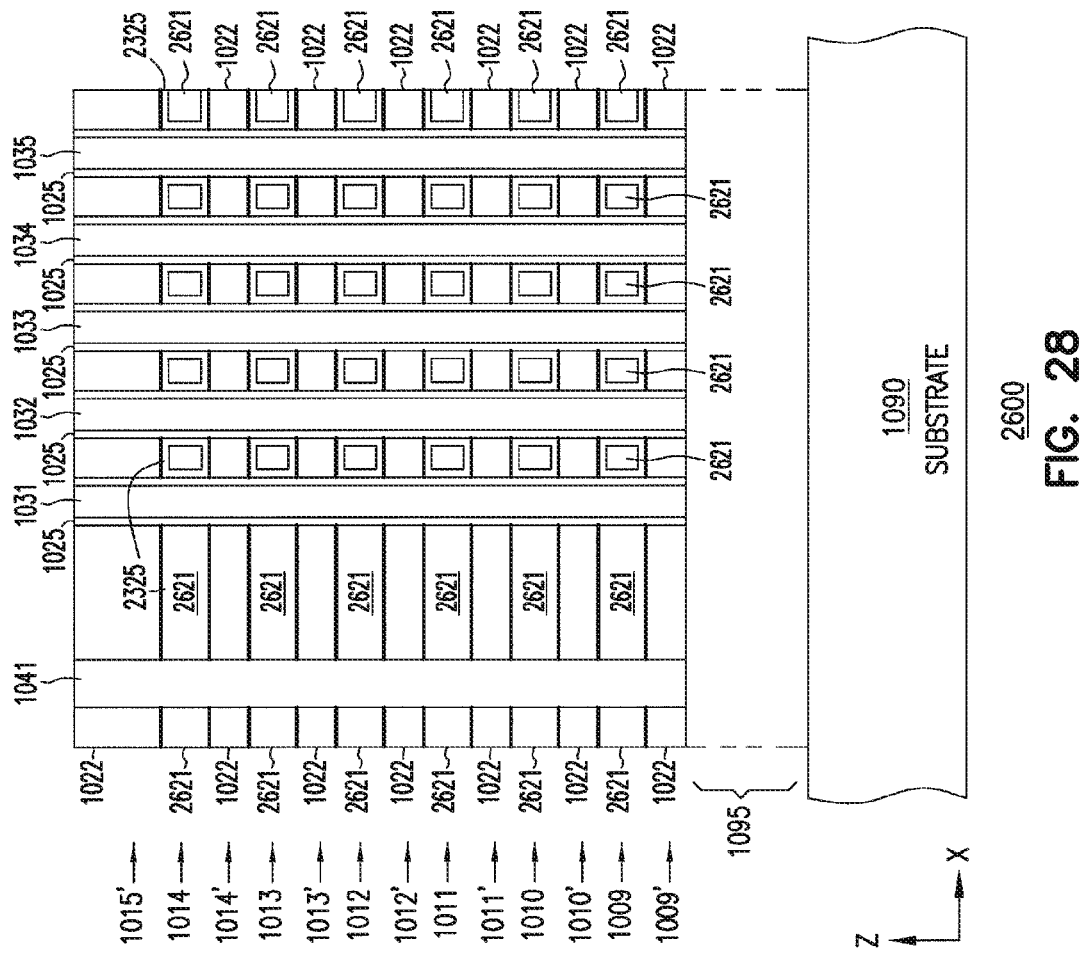

FIG. 28 shows IC device 2600 after conductive materials 2621 are formed in locations 1021' (FIG. 27). Each of conductive materials 2621 can be metal. Alternatively, each of conductive materials 2221 can be other conductive materials. In FIG. 28, forming conductive materials 2621 can include depositing a conductive material (e.g., tungsten or other metals) in locations 1021' (FIG. 27). As shown in FIG. 28, at least one of conductive contacts 1031 through 1035 can be electrically separated from conductive materials 2621 by one or both of dielectric materials 1025 and 2325. However, conductive contact 1041 is not electrically separated from conductive materials 2621. Conductive contact 1041 can contact (can be electrically coupled to) at least a group (e.g., some or all of) conductive materials 2621.

Figure 29:
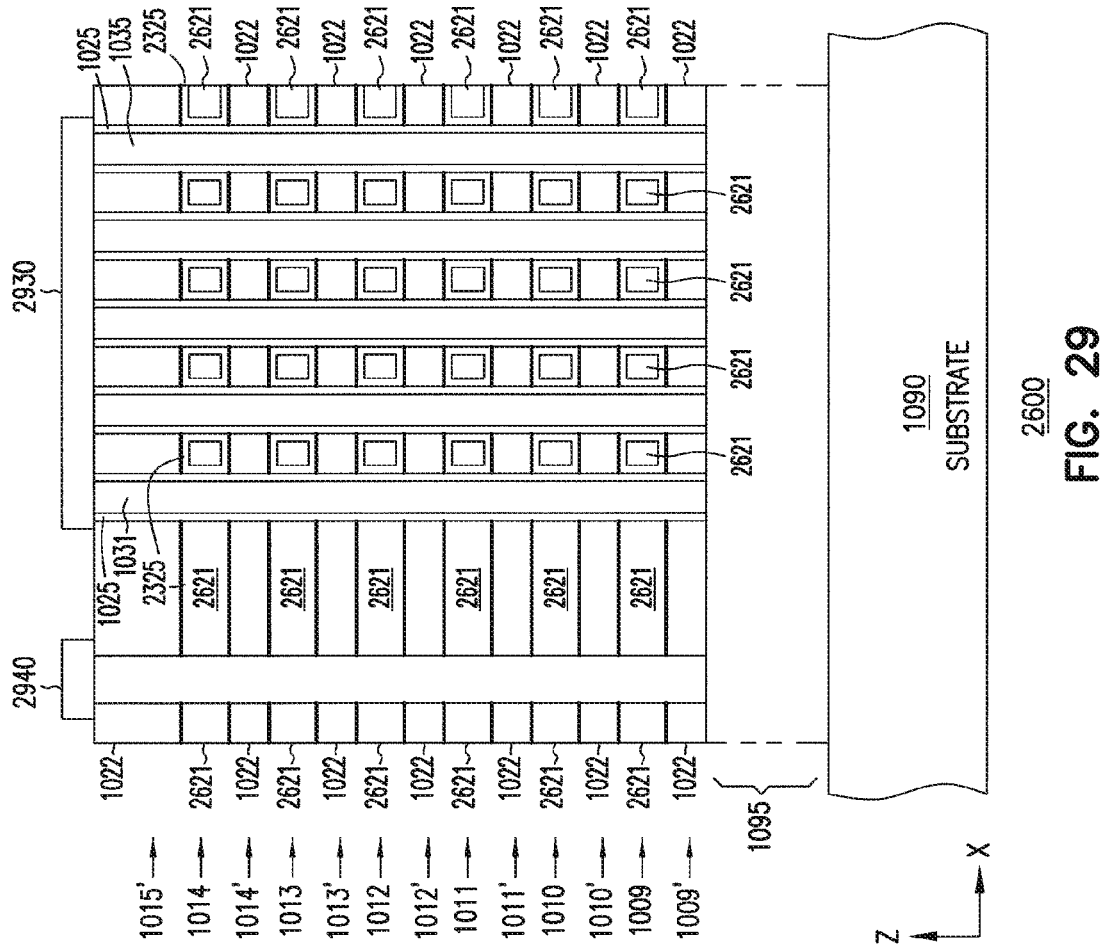

FIG. 29 shows IC device 2600 after other elements of capacitor C of IC device 2600 are formed. For example, conductive regions 2930 and 2940 can be formed, such that conductive region (e.g., conductive line) 2930 can contact each of conductive contacts 1031 through 1035, and conductive region (e.g., conductive line) 2940 can contact conductive contact 1041. Conductive regions 2930 and 2940 are formed to have structures as shown in FIG. 29 as an example. However, conductive regions 2930 and 2940 can be formed to have other structures, such that capacitor C of IC device 2600 can include elements similar to (or the same as) capacitor C of one of IC devices 100, 200, 300, 400, 500, 600, 700, 800, and 900 described above. In FIG. 29, additional elements can be formed for IC device 2600 by techniques known to those skilled in art, such that IC device 2600 can include elements similar to (or the same as) one of IC devices 100, 200, 300, 400, 500, 600, 700, 800, and 900 described above.

Figure 30:
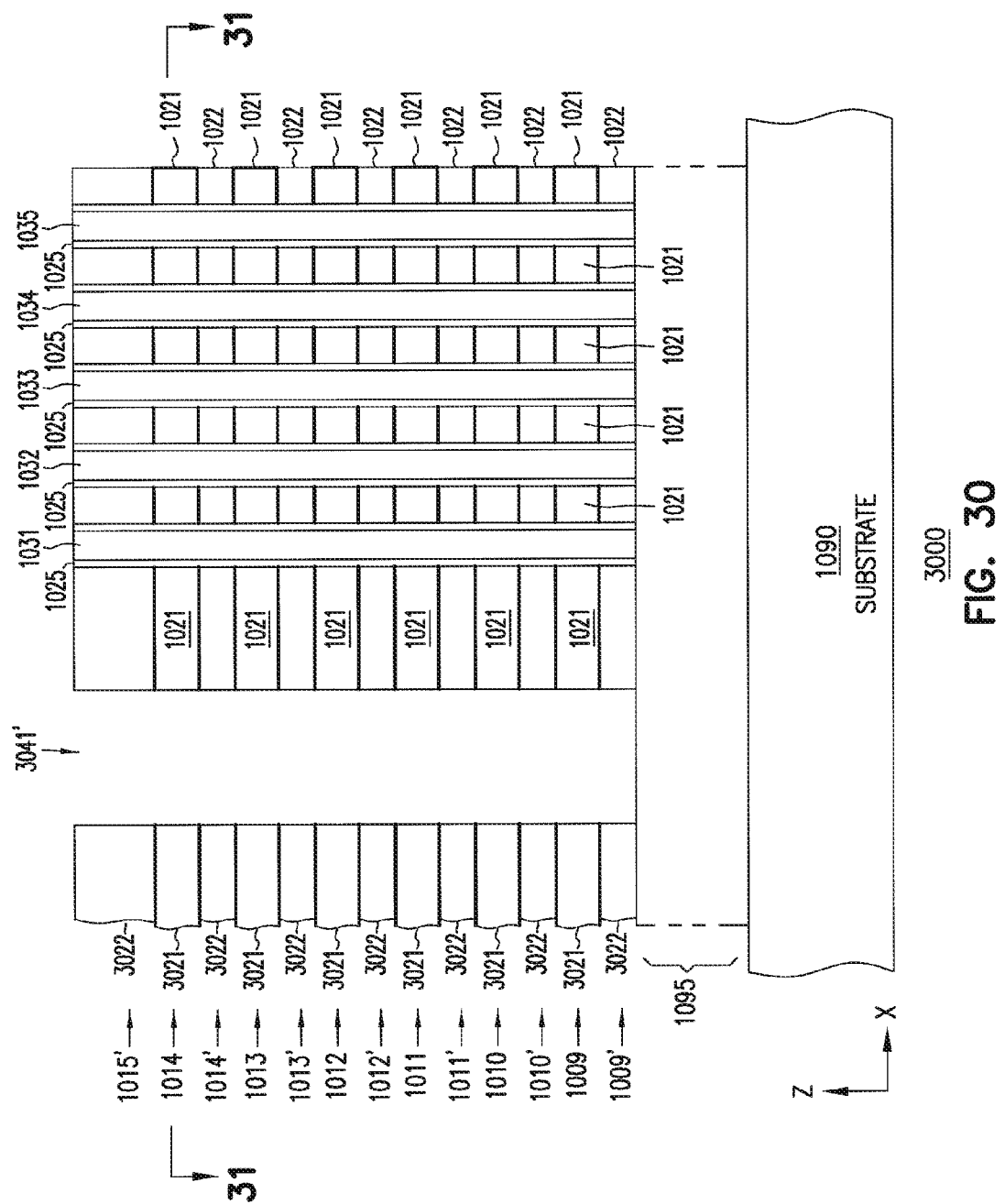
FIG. 30 through FIG. 34 show cross-sectional views of elements during processes of forming an IC device including conductive contacts formed at edges of conductive materials, according to some embodiments described herein.
Figure 31:
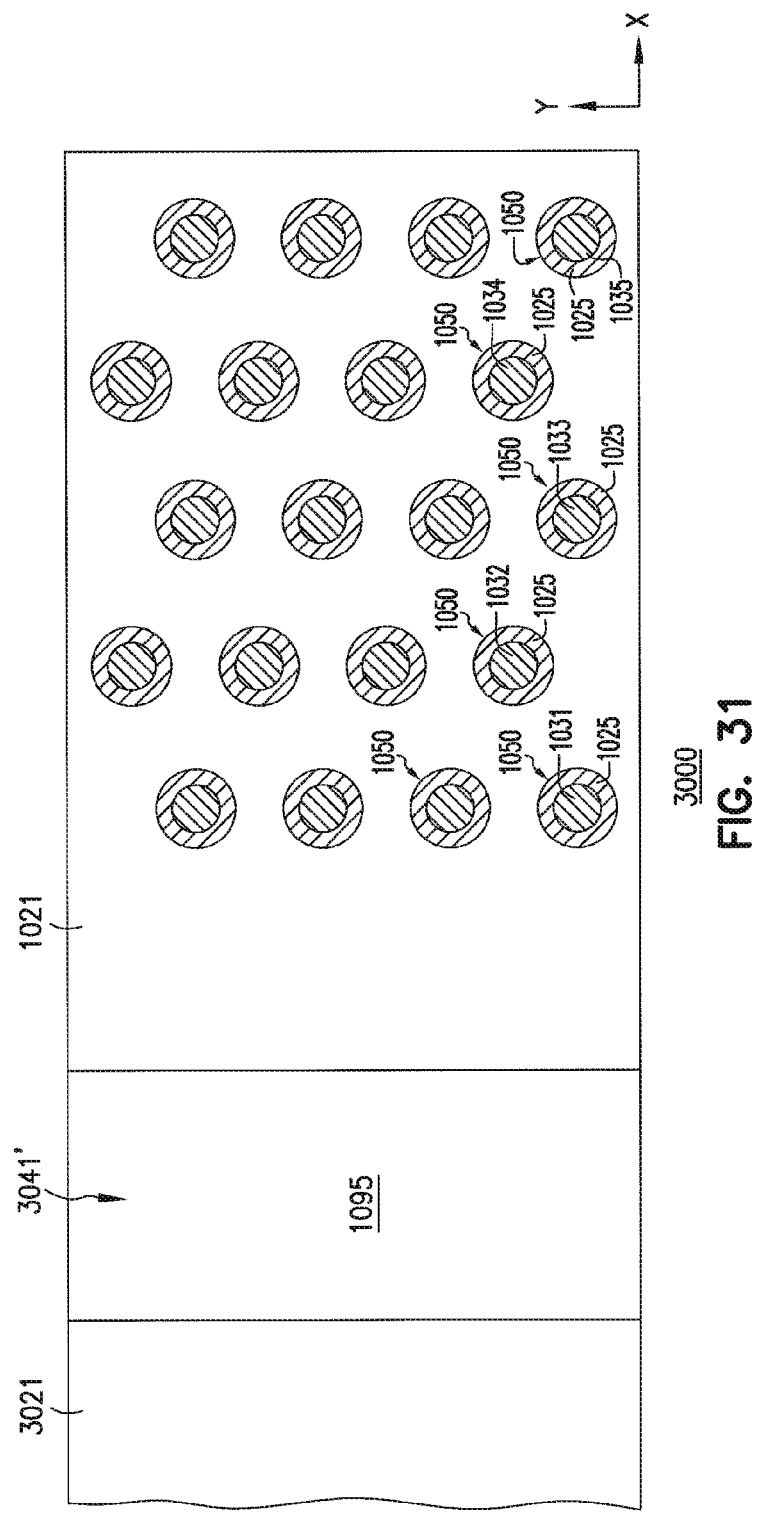

FIG. 30 through FIG. 34 show cross-sectional views of elements during processes of forming an IC device 3000, according to some embodiments described herein. FIG. 31 shows a cross-section (e.g., partial top view) of IC device 3000 taken from sectional lines 31 of FIG. 30. IC device 3000 can be a variation of IC device 1000. Thus, some of the processes (described above with reference to FIG. 10 through FIG. 21) used to form IC device 1000 can be used to form IC device 3000 of FIG. 30 through FIG. 34. For example, some of the elements of IC device 3000 in FIG. 30 can be formed by similar or the same processes that are used to form the elements of IC device 1000 of FIG. 20. Thus, for simplicity, similar or the same elements between IC devices 1000 and 3000 are given the same labels and the detailed descriptions of similar or the same elements are not repeated. Differences in structures and processes of forming IC device 1000 (FIG. 10 through FIG. 21) and IC devices 3000 (FIG. 30 and FIG. 31) are described below.

As shown in FIG. 30 and FIG. 31, unlike IC device 1000 in FIG. 18, device 3000 of FIG. 30 and FIG. 31 may not include holes (e.g., left-most holes 1050 of IC device 1000 in FIG. 18) besides holes 1050 where conductive contacts 1031 through 1035 are located. IC device 3000 may include conductive materials 3021 located in respective levels 1009 through 1014 and dielectric materials 3022 located in respective level 1009' through 1015'.

Dielectric materials 3022 can be formed concurrently (e.g., formed at the same time in the same process steps) with dielectric materials 1022. Alternatively, dielectric materials 3022 can be formed at a different time (e.g., formed before or formed after) than dielectric materials 1022 are formed. Dielectric materials 3022 can have the same material (e.g., silicon dioxide $SiO_2$) as dielectric materials 1022. Alternatively, conductive materials 3021 and 1021 can have different materials.

IC device 3000 may include non-volatile memory cells (not shown) formed in levels 1009 through 1014. The non-volatile memory cells can be flash (e.g., 3D (three dimensional) NAND) memory cells. Conductive materials 3021 in FIG. 30 can be parts of control gates (e.g., local word lines) that are used to control access to such non-volatile memory cells of IC device 3000. In FIG. 30, conductive materials 3021 can be formed concurrently (e.g., formed at the same time in the same process steps) with conductive materials 1021. Alternatively, conductive materials 3021 can be formed at a different time (e.g., formed before or formed after) than conductive materials 1021 are formed.

Conductive materials 3021 and 1021 can have the same conductive material (e.g., metal, conductively doped polysilicon, or other conductive materials). Alternatively, conductive materials 3021 and 1021 can have different materials. For example, conductive materials 1021 can be metal and conductive materials 3021 can be conductively doped polysilicon or other conductive materials.

As shown in FIG. 30 and FIG. 31, IC device 3000 can include an opening 3041' (e.g., a split or a gap). Opening 3041' is void of materials. For example, opening 3041' is void of (e.g., does not include) conductive materials 1021 and 3021 and dielectric materials 1022 and 3022. This means that opening 3041' may include no materials that electrically couple conductive materials 3021 to conductive materials 1021.

Figure 32:
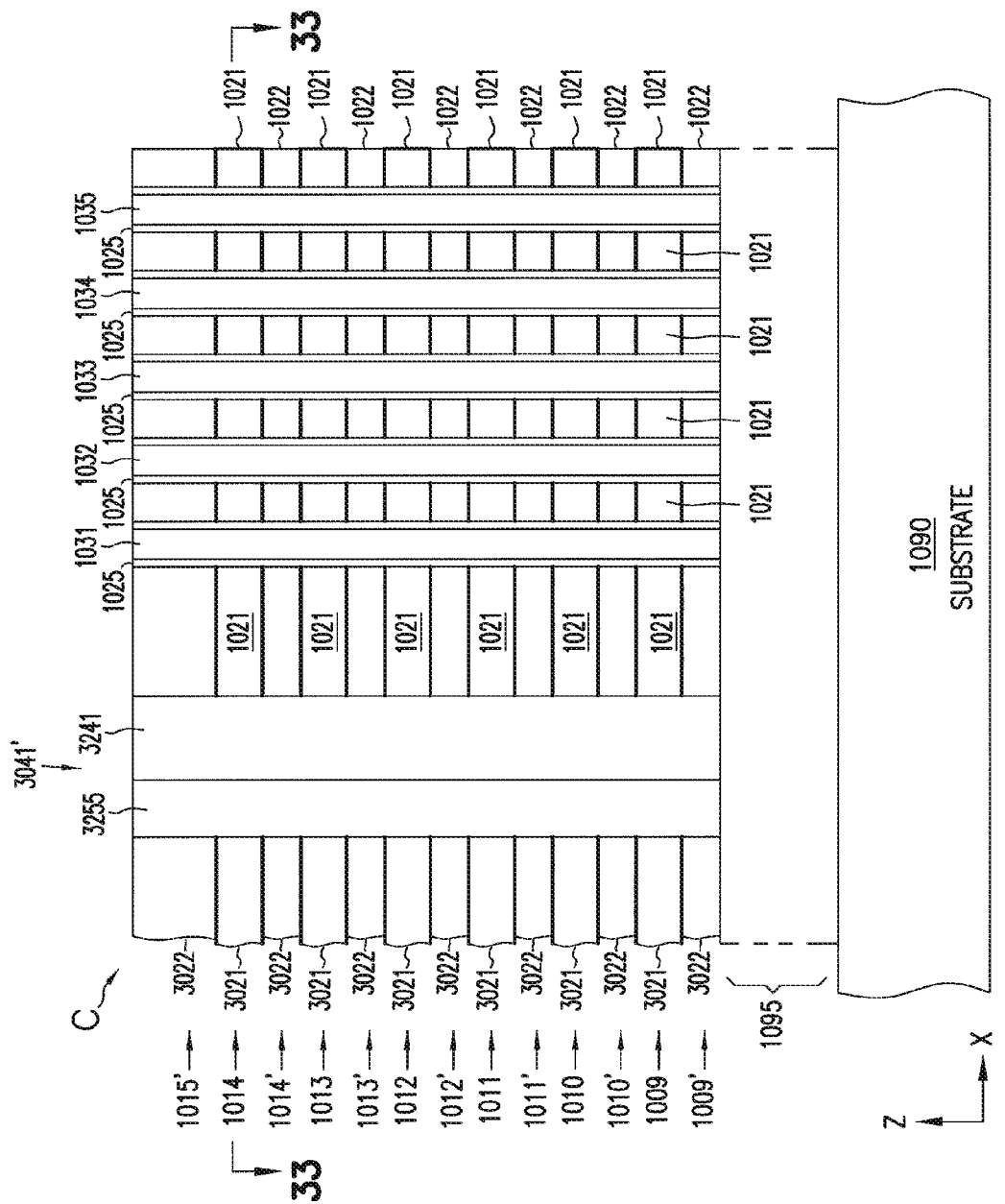
Figure 33:
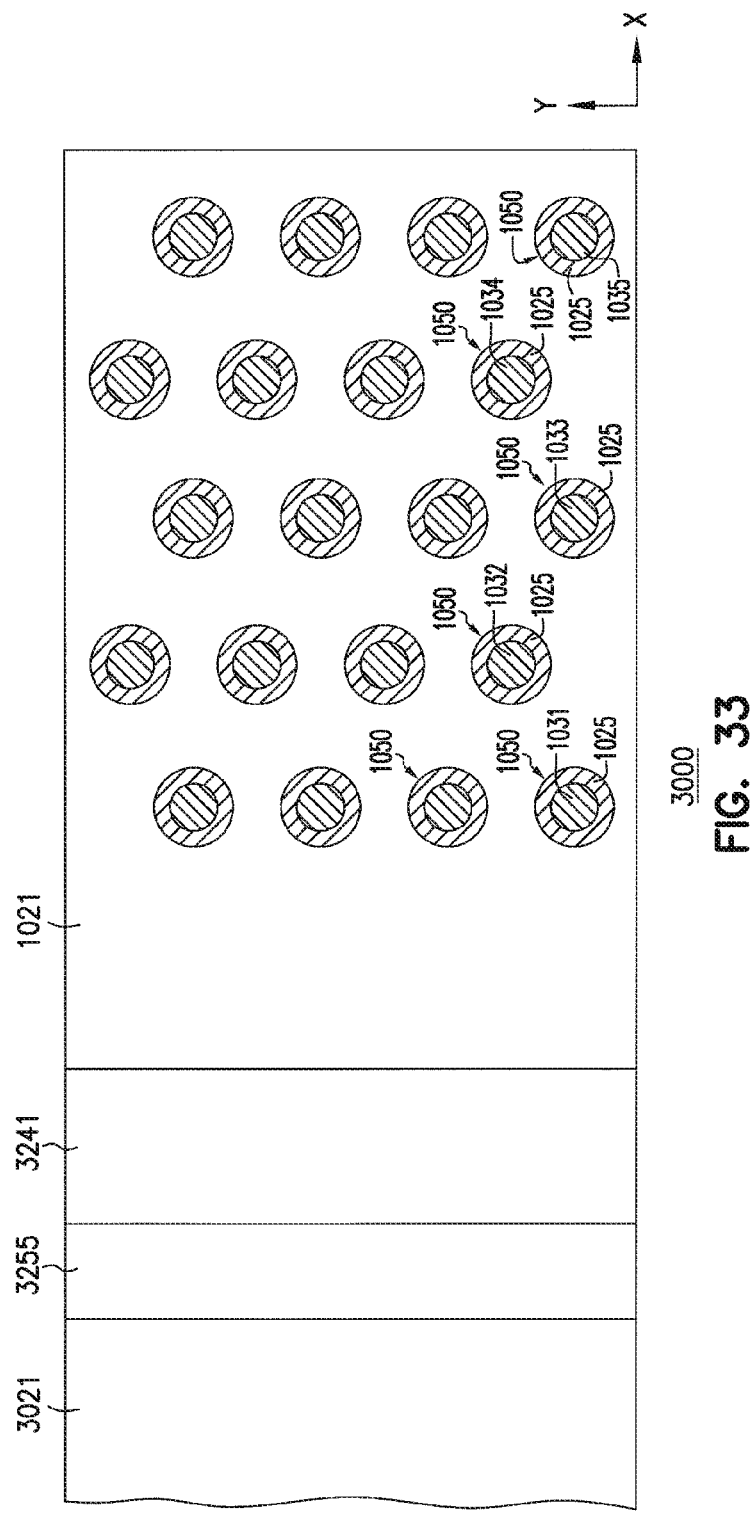

FIG. 32 shows IC device 3000 after a conductive contact 3241 and dielectric material 3255 are formed in opening 3241'. FIG. 33 shows a cross-section (e.g., partial top view) of IC device 3000 taken from sectional lines 33 of FIG. 32. Conductive contact 3241 is formed to electrically couple multiple conductive materials 1021 (some or all of conductive materials 1021) to each other. Conductive contact 3241 can correspond to conductive contact 641 (FIG. 6A) of capacitor C of IC device 600. In FIG. 32, forming conductive contact 3241 can include depositing a conductive material in opening 3041'. Conductive contact 3241 can be metal, conductively doped polysilicon, or other conductive materials. Thus, conductive contact 3241 is formed after conductive contacts 1031 through 1035 are formed.

Conductive contact 3241 may be formed at edges of conductive materials 1021 and can contact (can be electrically coupled to) multiple conductive materials 1021 (contact a group of (some or all of) conductive materials 1021). FIG. 32 shows an example where conductive contact 3241 contacts all of conductive materials 1021. However, conductive contact 3241 may contact fewer than all of conductive materials 1021. Thus, conductive contact 3241 may contact a group of conductive materials 3021, in which the group of conductive materials 1021 can include either all of conductive materials 1021 or fewer than all (e.g., only a portion of) conductive materials 1021.

Dielectric material 3255 can be formed to electrically separate (electrically isolate) conductive contact 3241 from conductive materials 3021 (which also means electrically separate conductive materials 3021 from conductive materials 1021). This prevents conductive materials 3021 from becoming electrically coupled to each other (e.g., from inadvertently becoming shorted to each other) by conductive contact 3241. Dielectric material 3255 can be an oxide material (e.g., silicon dioxide $SiO_2$) or other dielectric materials. Dielectric material 3255 can be formed before or after conductive contact 3241 is formed. Forming dielectric material 3255 can include depositing a dielectric material in opening 3041'.

Figure 34:
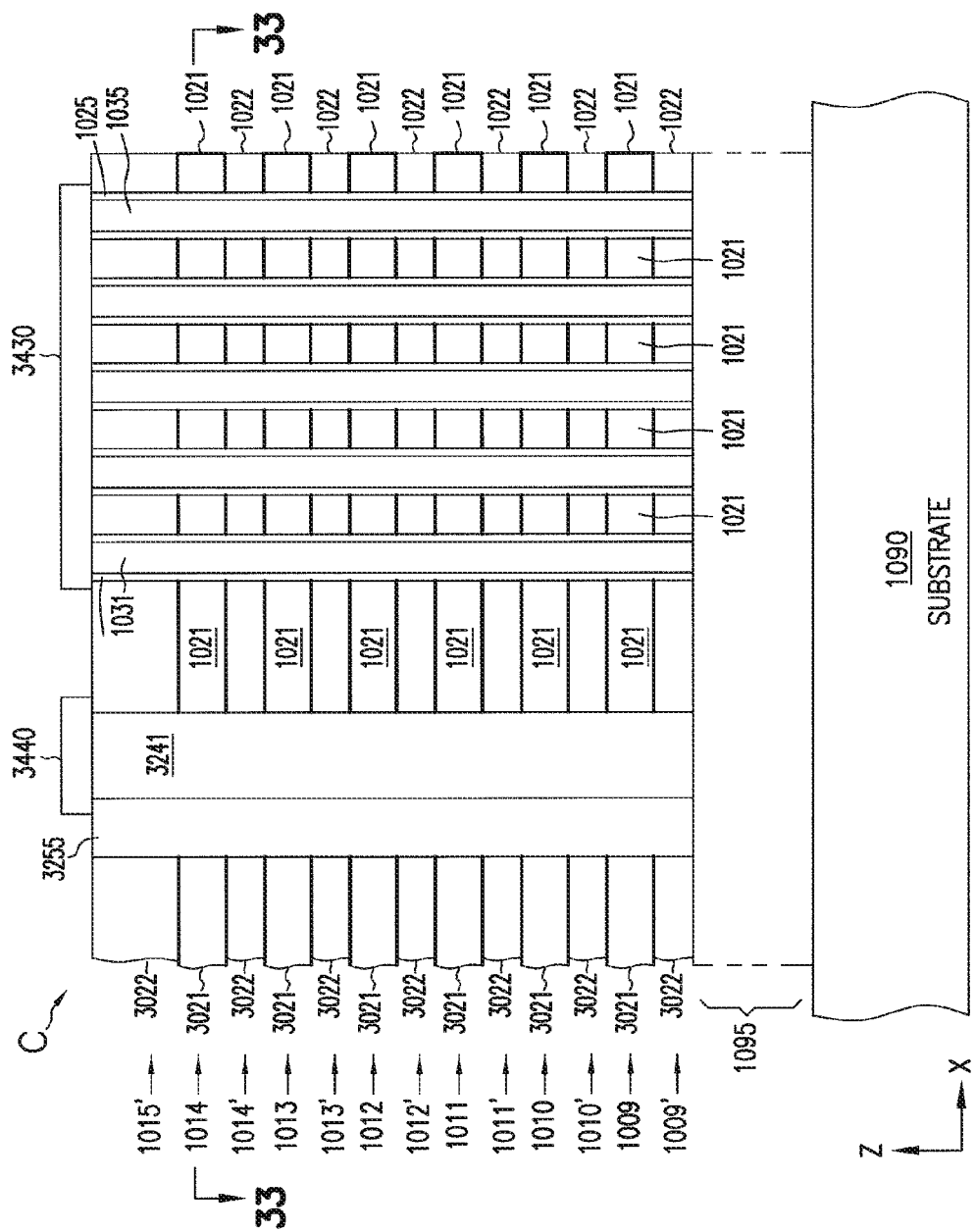

FIG. 34 shows IC device 3000 after other elements of capacitor C of IC device 3000 are formed. For example, conductive regions 3430 and 3440 can be formed such that conductive region (e.g., conductive line) 3430 can contact each of conductive contacts 1031 through 1035, and conductive region (e.g., conductive line) 3440 can contact conductive contact 3241. Conductive regions 3430 and 3440 are formed to have structures as shown in FIG. 34 as an example. However, conductive regions 3430 and 3440 can be formed to have other structures, such that capacitor C of IC device 3000 can include elements similar to (or the same as) capacitor C of one of IC devices 100, 200, 300, 400, 500, 600, 700, 800, and 900 described above. In FIG. 34, additional elements can be formed for IC device 3000 by techniques known to those skilled in art, such that IC device 3000 can include elements similar to (or the same as) one of IC devices 100, 200, 300, 400, 500, 600, 700, 800, and 900 described above.

The above description with reference to FIG. 1A through FIG. 34 describes a capacitor (e.g., capacitor C) and the processes of forming such a capacitor. The capacitor C described above can be formed in (e.g., integrated in) a semiconductor device, such as any of the IC device with reference to FIG. 1A through FIG. 34. An example of the capacitor C described above with reference to FIG. 1A through FIG. 34 can also be formed in (e.g., integrated in) a memory device, such as any of the memory devices described below with reference to FIG. 35 through FIG. 37.

Figure 35:
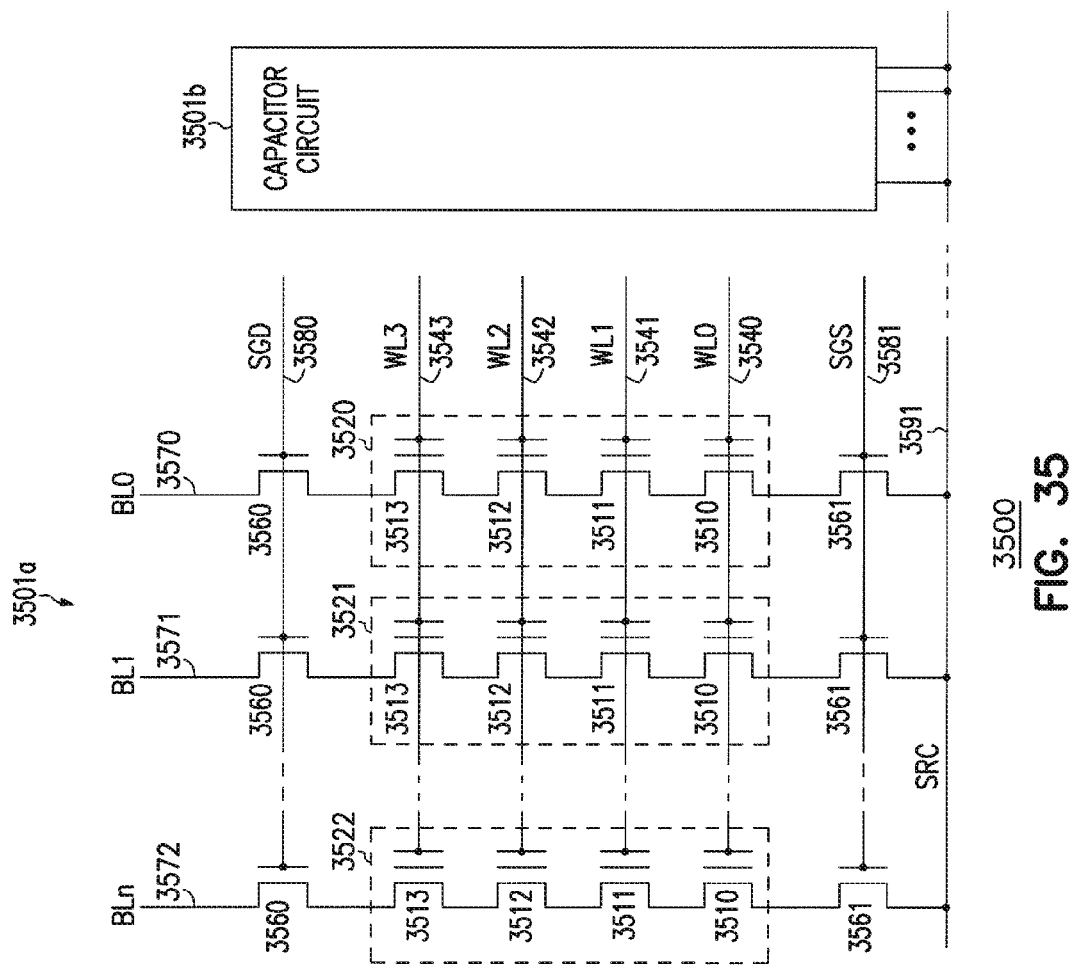
FIG. 35 shows an apparatus in the form of a memory device including a memory array and a capacitor circuit, according to some embodiments described herein.

FIG. 35 shows an apparatus in the form of a memory device 3500 including a memory array (or multiple memory arrays) 3501a and a capacitor circuit 3501b, according to some embodiments described herein. Memory device 3500 can include or can be part of any of IC devices described above with reference to FIG. 1A through FIG. 34. Thus, capacitor circuit 3501b can include at least one (e.g., only one or two or more) of any of the capacitors C described be described above with reference to FIG. 1A through FIG. 34.

In FIG. 35, memory device 3500 can include a non-volatile memory device. Examples of memory device 3500 include a 3D (e.g., vertical) NAND memory device and other non-volatile memory devices. As shown in FIG. 35, memory device 3500 can include memory cells 3510, 3511, 3512, and 3513, which can be charge trap memory cells (e.g., charge trap flash), floating gate memory cells, or other types of non-volatile memory cells. As shown in FIG. 35, memory cells 3510, 3511, 3512, and 3513 can be arranged in memory cell strings 3520, 3521, and 3522 between a source (e.g., source line) 3591 and respective data lines (e.g., bit lines) 3570, 3571, and 3572, which can carry corresponding signals (e.g., bit line signals) BL0, BL1, and BL2. Memory device 3500 can include select transistors 3560 and 3561, select line 3580 (and signal SGD) to control select transistors 3560, and select line 3581 (and signal SGS) to control select transistors 3561. Memory device 3500 can include control gates (e.g., word lines) 3540, 3541, 3542, and 3543, which can carry signals (e.g., word line signals) WL0, WL1, WL2, and WL3, to control access to memory cells 3510, 3511, 3512, and 3513, respectively.

One of ordinary skill in the art may recognize that a memory device (e.g., a 3D NAND memory device) such as memory device 3500 can include other components. However, such components are not shown in FIG. 35 so as to not to obscure the example embodiments described herein.

Figure 36:
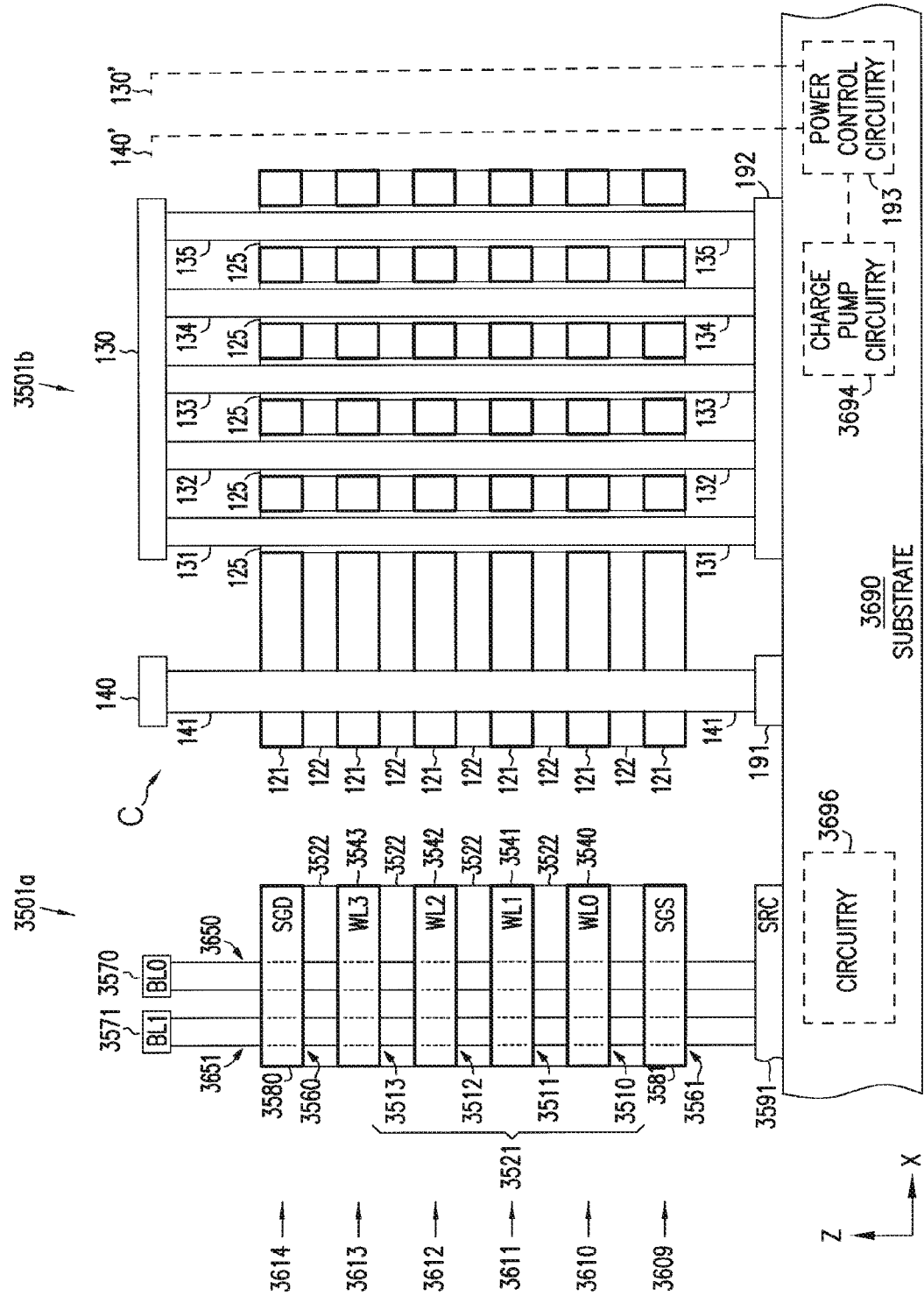
FIG. 36 shows a side view of a structure of a portion of the memory device of FIG. 35, according to some embodiments described herein.

FIG. 36 shows a side view of a structure of a portion of memory device 3500 of FIG. 35, according to some embodiments described herein. For simplicity, cross-sectional lines (e.g., hatch lines) are omitted from the elements of memory device 3500 shown in FIG. 36. Also for simplicity, FIG. 36 omits some elements (e.g., data line 3572 and other elements) of memory device 3500 that are schematically shown in FIG. 35.

As shown in FIG. 36, memory device 3500 can include a substrate 3690 over which memory cells 3510, 3511, 3512, and 3513 can be formed (e.g., formed vertically with respect to substrate 3690). Memory device 3500 includes different levels 3609 through 3614 with respect to a z-dimension. Levels 3609 through 3614 are internal device levels between substrate 3690 and data lines 3570 and 3571 of memory device 3500. As shown in FIG. 36, memory cells 3510, 3511, 3512, and 3513 can be located (e.g., located vertically with respect to substrate 3690) in levels 3610, 3611, 3612 and 3613, respectively.

Control gates 3540, 3541, 3542, and 3543 (associated with memory cells 3510, 3511, 3512, and 3513, respectively) can also be located (e.g., located vertically with respect to substrate 3690) in levels 3610, 3611, 3612, and 3613 respectively. Select line 3580 and select transistor 3560 can be located in level 3614. Select line 3581 and select transistor 3561 can be located in level 3609. Memory device 3500 can also include dielectric materials (e.g., silicon dioxide $SiO_2$) 3522 between control gates 3540, 3541, 3542, and 3543, as shown in FIG. 36.

Substrate 3690 can be similar to substrate 190 or 1090 described above with reference to FIG. 1A through FIG. 34. As shown in FIG. 36, substrate 190 can include power control circuitry 193 formed in substrate 3690 and charge pump circuitry 3694. FIG. 36 shows charge pump circuitry 3694 being separated from power control circuitry 193 as an example. However, charge pump circuitry 3694 can be part of power control circuitry 193, such that capacitor C can be part of charge pump circuitry 3694 and can be controlled by power control circuitry 193.

Substrate 3690 can also include circuitry 3696 formed in substrate 3690. Circuitry 3696 can include sense amplifiers, page buffer circuits, decoder circuitry (e.g., row and column access circuitry to access memory cells 3510, 3511, 3512, and 3513), and other circuitry of a memory device such as memory device 3500.

Source 3591 (e.g., source region) can include a conductive material (e.g., a conductive region) and can be formed over a portion of substrate 3690 (e.g., by depositing a conductive material over substrate 3690). Alternatively, source 3591 can be formed in or formed on a portion of substrate 3690 (e.g., by doping a portion of substrate 3690).

As shown in FIG. 36, memory device 3500 can include pillars (conductive pillars) 3650 and 3651 having lengths extending in a direction perpendicular to (e.g., a vertical direction in the z-direction of memory device 3500) substrate 3690. Each of pillars 3650 and 3651 can include conductive material (e.g., a conductive channel) to allow a conductive path (e.g., current path) to form source 3591 and a respective data line (e.g., data line 3570 or 3571) during an operation (e.g., read, write, or erase) of memory device 3500.

As shown in FIG. 36, memory cells 3510, 3511, 3512, and 3513 can be located along different segments of a respective pillar (e.g., pillar 3650 or 3651). Control gates 3540, 3541, 3542, and 3543 (associated with respective memory cells 3510, 3511, 3512, and 3513) can also be located along different segments of a respective pillar (e.g., pillar 3650 or 3651). Each of control gates 3540, 3541, 3542, and 3543 can be used to control access to the memory cell (or memory cells) on a respective level. For example, control gate 3540 associated with signal WL0 can be used to control access to memory cell 3510, and control gate 3541 associated with signal WL1 can be used to control access to memory cell 3511.

Capacitor circuit 3501b can include a capacitor C. FIG. 36 shows an example where capacitor C of capacitor circuit 3501b includes the same elements (which are given the same labels) of capacitor C of IC device 100 of FIG. 1A. As shown in FIG. 36, capacitor C of circuit 3501b can include components (e.g., capacitor components) located in levels 3609 through 3614, which are the same levels of memory cells 3510, 3511, 3512, and 3513. For example, conductive materials 121 and control gates 3540, 3541, 3542, and 3543 can be located in the same respective levels among levels 3609 through 3614, and dielectric materials 122 and 3622 can be can be located in the same respective levels between levels 3609 through 3614. Conductive materials 121 and control gates 3540, 3541, 3542, and 3543 can have the same material or different materials.

Conductive materials 121 can be formed concurrently (e.g., formed at the same time in the same process steps) with control gates 3540, 3541, 3542, and 3543. Thus, conductive materials 121 and control gates 3540, 3541, 3542, and 3543 can have the same material (e.g., metal).

In an alternate structure of memory device 3500, conductive materials 121 can be formed at a time (e.g., formed before or formed after) that is different from the time that control gates 3540, 3541, 3542, and 3543 are formed. In the alternate structure, conductive materials 121 can have a material (or materials) different from (or alternatively the same as) the material (or materials) of control gates 3540, 3541, 3542, and 3543. As an example, conductive materials 121 can be metal and control gates 3540, 3541, 3542, and 3543 can be conductively doped polysilicon or other conductive materials. In another example, control gates 3540, 3541, 3542, and 3543 can be metal and conductive materials 121 can be conductively doped polysilicon or other conductive materials.

FIG. 36 shows an example where capacitor C of capacitor circuit 3501b can include capacitor C of IC device 100 of FIG. 1A. However, capacitor circuit 3501b of FIG. 36 can include capacitor C of FIG. 34, such that control gates 3540, 3541, 3542, and 3543 can be parts of respective conductive materials 3021 (e.g., four of conductive materials 3021) of FIG. 34, and dielectric materials 3622 can be parts of respective dielectric materials 3022 (e.g., four of dielectric materials 3022) of FIG. 34.

The description above with reference to FIG. 35 and FIG. 36 gives an example where capacitor C of capacitor circuit 3501b can include capacitor C FIG. 1A or capacitor C of FIG. 34. However, capacitor C of capacitor circuit 3501b of FIG. 36 can include any of the capacitor C described above with reference to FIG. 1A through FIG. 34.

Figure 37:
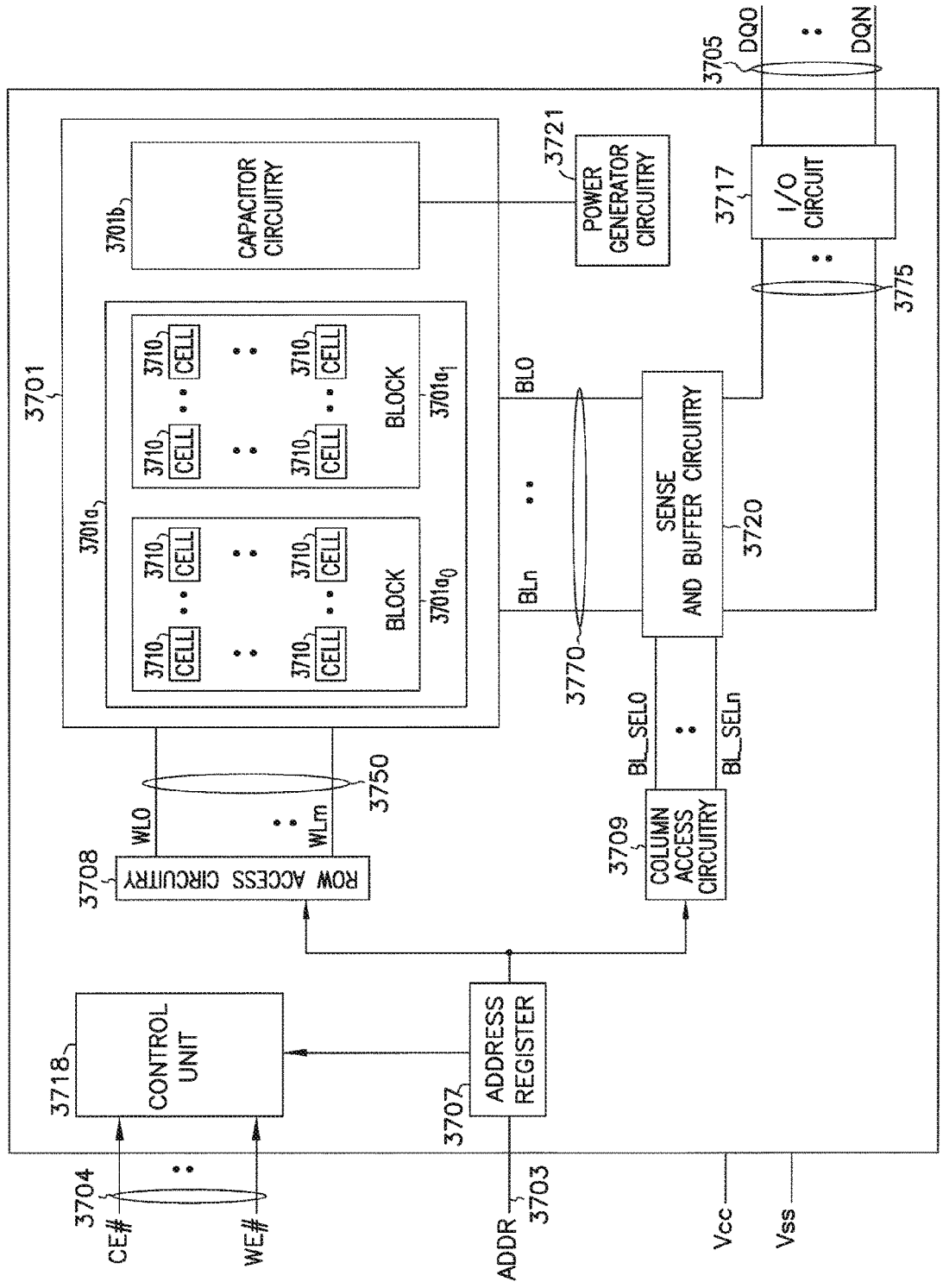
FIG. 37 shows a block diagram of an apparatus in the form of a memory device having a device area including a memory device and a capacitor circuit, according to some embodiments described herein.

FIG. 37 shows a block diagram of an apparatus in the form of a memory device 3700, according to some embodiments described herein. Memory device 3700 can include a device portion 3701 that can include a memory array (or multiple memory arrays) 3701a and a capacitor circuit 3701b. Memory array 3701a and capacitor circuit 3701b can correspond to (e.g., can include) memory array 3501a and capacitor circuit 3501b, respectively, of memory device 3500 described above with reference to FIG. 35 and FIG. 36.

As shown in FIG. 37, memory array 3701a can contain memory cells 3710. Memory cells 3710 can include non-volatile memory cells. For example, memory cells 3710 can be charge trap memory cells (e.g., charge trap flash), floating gate memory cells, or other types of non-volatile memory cells.

In the physical structure of memory device 3700, memory cells 3710 can be arranged vertically (e.g., stacked over each other) in different physical levels of memory device 3700 over a substrate of memory device 3700 (e.g., a semiconductor substrate of an IC chip that includes memory device 3700). Capacitor circuit 3701b can be formed over the substrate of memory device 3700 in the same physical levels that memory cells 3710 are formed.

As shown in FIG. 37, memory cells 3710 can be arranged in blocks (memory cell blocks), such as blocks $3701a_0$ and $3701a_1$. Each of blocks $3701a_0$ and $3701a_1$ can include multiple memory cells 3710. FIG. 37 shows memory device 3700 having two blocks $3701a_0$ and $3701a_1$. Memory device 3700 can have more than two blocks.

As shown in FIG. 37, memory device 3700 can include access lines (which can include word lines) 3750 and data lines (which can include bit lines) 3770. Access lines 3750 can carry signals (e.g., word line signals) WL0 through WLm. Data lines 3770 can carry signals (e.g., bit line signals) BL0 through BLn. Memory device 3700 can use access lines 3750 to selectively access blocks $3701a_0$ and $3701a_1$ and use data lines 3770 to selectively exchange information (e.g., data) with memory cells 3710 of blocks $3701a_0$ and $3701a_1$.

Memory device 3700 can include an address register 3707 to receive address information (e.g., address signals) ADDR on lines (e.g., address lines) 3703. Memory device 3700 can include row access circuitry 3708 and column access circuitry 3709 that can decode address information from address register 3707. Based on decoded address information, memory device 3700 can determine which memory cells 3710 of which blocks $3701a_0$ and $3701a_1$ are to be accessed during a memory operation. Memory device 3700 can perform a read operation to read (e.g., sense) information (e.g., previously stored information) in memory cells 3710, or a write (e.g., program) operation to store (e.g., program) information in memory cells 3710. Memory device 3700 can use data lines 3770 associated with signals BL0 through BLn to provide information to be stored in memory cells 3710 or obtain information read (e.g., sensed) from memory cells 3710. Memory device 3700 can also perform an erase operation to erase information from some or all of memory cells 3710 of blocks $3701a_0$ and $3701a_1$.

Memory device 3700 can include a control unit 3718 (which can include components such as a state machine (e.g., finite state machine), register circuits, and other components) configured to control memory operations (e.g., read, write, and erase operations) of memory device 3700 based on control signals on lines 3704. Examples of the control signals on lines 3704 include one or more clock signals and other signals (e.g., a chip enable signal CE #, a write enable signal WE #) to indicate which operation (e.g., read, write, or erase operation) memory device 3700 can perform.

Memory device 3700 can include sense and buffer circuitry 3720 that can include components such as sense amplifiers and page buffer circuits (e.g., data latches). Sense and buffer circuitry 3720 can respond to signals BL_SEL0 through BL_SELn from column access circuitry 3709. Sense and buffer circuitry 3720 can be configured to determine (e.g., by sensing) the value of information read from memory cells 3710 (e.g., during a read operation) of blocks $3701a_0$ and $3701a_1$ and provide the value of the information to lines (e.g., global data lines) 3775. Sense and buffer circuitry 3720 can also can be configured to use signals on lines 3775 to determine the value of information to be stored (e.g., programmed) in memory cells 3710 of blocks $3701a_0$ and $3701a_1$ (e.g., during a write operation) based on the values (e.g., voltage values) of signals on lines 3775 (e.g., during a write operation).

Memory device 3700 can include input/output (I/O) circuitry 3717 to exchange information between memory cells 3710 of blocks $3701a_0$ and $3701a_1$ and lines (e.g., I/O lines) 3705. Signals DQ0 through DQN on lines 3705 can represent information read from or stored in memory cells 3710 of blocks $3701a_0$ and $3701a_1$. Lines 3705 can include nodes within memory device 3700 or pins (or solder balls) on a package where memory device 3700 can reside. Other devices external to memory device 3700 (e.g., a memory controller or a processor) can communicate with memory device 3700 through lines 3703, 3704, and 3705.

Memory device 3700 can receive a supply voltage, including supply voltages Vcc and Vss. Supply voltage Vss can operate at a ground potential (e.g., having a value of approximately zero volts). Supply voltage Vcc can include an external voltage supplied to memory device 3700 from an external power source such as a battery or alternating current to direct current (AC-DC) converter circuitry.

Memory device 3700 can include power generator circuitry 3721 to provide power (e.g., voltages) to different components of memory device 3700. Power generator circuitry 3721 can use supply voltages Vcc and Vss to generate additional voltages (not shown) that can be used during operations (e.g., read, write, and erase operations) of memory device 3700. The additional voltages can be higher or lower than the supply voltages Vcc and Vss (e.g., a positive voltage higher than voltage Vcc or a negative voltage lower than voltage Vss). For example, power generator circuitry 3721 can include charge pump circuitry similar to charge pump circuitry 3694 of FIG. 36, and capacitor circuit 3701b can include at least one capacitor (e.g., at least one capacitor C described above with reference to FIG. 1A through FIG. 36). In this example, power generator circuitry 3721 can operate in connection with capacitor circuit 3701b to generate a pumped voltage higher than voltage Vcc.

Each of memory cells 3710 can be programmed to store information representing a value of at most one bit (e.g., a single bit), or a value of multiple bits such as two, three, four, or another number of bits. For example, each of memory cells 3710 can be programmed to store information representing a binary value "0" or "1" of a single bit. The single bit per cell is sometimes called a single-level cell. In another example, each of memory cells 3710 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 3700 can include a non-volatile memory device, such that memory cells 3710 can retain information stored thereon when power (e.g., voltage Vcc, Vss, or both) is disconnected from memory device 3700. For example, memory device 3700 can be a flash memory device, such as a NAND flash (e.g., 3D NAND), a NOR flash memory device, or another kind of memory device, such as a variable resistance memory device (e.g., a phase change memory device or a resistive RAM (Random Access Memory) device).

One of ordinary skill in the art may recognize that memory device 3700 may include other components, several of which are not shown in FIG. 37 so as not to obscure the example embodiments described herein.

At least a portion of memory device 3700 (e.g., device portion 3701) can include structures similar to or identical to any of the structures (e.g., the structure of capacitor C) of the devices (e.g., IC devices or memory devices) described above with reference to FIG. 1A through FIG. 36.

The illustrations of apparatuses (e.g., devices 100, 1000, 2200, 2600, 3000, 3500, and 3700) and methods (e.g., methods of forming IC devices 1000, 2200, 2600, and 3000) are intended to provide a general understanding of the structure of various embodiments and are not intended to provide a complete description of all the elements and features of apparatuses that might make use of the structures described herein. "Apparatus" herein refers to, for example, either a device (e.g., any of devices 100, 1000, 2200, 2600, 3000, 3500, and 3700) or a system (e.g., an electronic item that can include any of devices 100, 1000, 2200, 2600, 3000, 3500, and 3700).

Any of the components described above with reference to FIG. 1 through FIG. 37 can be implemented in a number of ways, including simulation via software. Thus, apparatuses, e.g., devices 100, 1000, 2200, 2600, 3000, 3500, and 3700, or part of each of these devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Devices 100, 1000, 2200, 2600, 3000, 3500, and 3700 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 6 include apparatuses, and methods of operations performed by the apparatuses. One of the apparatuses includes volatile memory cells located along a pillar that has a length extending in a direction perpendicular to a substrate of a memory device. Each of the volatile memory cells includes a capacitor and at least one transistor. The capacitor includes a capacitor plate. The capacitor plate is either formed from a portion a semiconductor material of the pillar or formed from a conductive material separated from the pillar by a dielectric. Other embodiments including additional apparatuses and methods are described.

In the detailed description and the claims, a list of items joined by the term "one of" can mean any of the listed items. For example, if items A and B are listed, then the phrase "one of A and B" means A only or B only. In another example, if items A, B, and C are listed, then the phrase "one of A, B and C" means A only; B only; or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   conductive materials located in different levels over a semiconductor substrate of the apparatus;
   dielectric materials located in different levels over the semiconductor substrate of the apparatus, one of the conductive materials being between two of the dielectric materials, and one of the dielectric materials being between two of the conductive materials, such that a first conductive material of the conductive materials is formed on and contacts a first dielectric material of the dielectric materials, a second dielectric material of the dielectric materials is formed on and contacts the first conductive material, a second conductive material of the conductive materials is formed on and contacts the second dielectric material, wherein the dielectric materials include silicon dioxide;
   a first conductive contact having a length extending through the conductive materials and the dielectric materials in a direction perpendicular to the levels of the apparatus, the first conductive contact being electrically separated from the conductive materials;
   a second conductive contact having a length extending through the conductive materials and the dielectric materials in a direction perpendicular to the levels of the apparatus, the second conductive contact being electrically separated from the conductive materials;
   a third conductive contact having a length extending through the conductive materials and the dielectric materials in a direction perpendicular to the levels of the apparatus, the third conductive contact being electrically separated from the conductive materials;
   a first conductive region located on a level different from the levels of the conductive materials and different from the levels of the dielectric materials, the conductive region extending in a direction from the first conductive contact to the second conductive contact and from the second conductive contact to the third conductive contact and directly contacting the first, second, and third conductive contacts;
   a second conductive region directly contacting the first, second, and third conductive contacts;
   an additional conductive contact directly contacting a group of conductive materials of the conductive materials, wherein the additional conductive contact is electrically separated from the first, second, and third conductive contacts;
   a third conductive region contacting the additional conductive contact and separated from the first conductive region by a first distance; and
   a fourth conductive region contacting the additional conductive contact and separated from the second conductive region by a second distance.

2. The apparatus of claim 1, further comprising:
   a fourth conductive contact having a length extending through the conductive materials and the dielectric materials in a direction perpendicular to the levels of the apparatus, the fourth conductive contact being electrically separated from the conductive materials.

3. The apparatus of claim 1, wherein the additional conductive contact contacts a group of the dielectric materials.

4. The apparatus of claim 1, wherein the group of the conductive materials includes all of the conductive materials.

5. The apparatus of claim 1, wherein the group of the conductive materials includes fewer than all of the conductive materials.

6. An apparatus comprising:
   conductive materials located in different levels over a semiconductor substrate of the apparatus;
   dielectric materials located in different levels over the semiconductor substrate of the apparatus, one of the conductive materials being between two of the dielectric materials, and one of the dielectric materials being between two of the conductive materials, such that a first conductive material of the conductive materials is formed on and contacts a first dielectric material of the dielectric materials, a second dielectric material of the dielectric materials is formed on and contacts the first conductive material, a second conductive material of the conductive materials is formed on and contacts the second dielectric material, wherein the dielectric materials include silicon dioxide;
   a first conductive contact having a length extending through the conductive materials and the dielectric materials in a direction perpendicular to the levels of the apparatus, the first conductive contact being electrically separated from the conductive materials;
   a second conductive contact having a length extending through the conductive materials and the dielectric materials in a direction perpendicular to the levels of the apparatus, the second conductive contact being electrically separated from the conductive materials;

a third conductive contact having a length extending through the conductive materials and the dielectric materials in a direction perpendicular to the levels of the apparatus, the third conductive contact being electrically separated from the conductive materials;
a first conductive region directly contacting the first, second, and third conductive contacts;
a second conductive region directly contacting the first, second, and third conductive contacts;
an additional conductive contact directly contacting a group of conductive materials of the conductive materials, wherein the additional conductive contact is electrically separated from the first, second, and third conductive contacts, wherein the first conductive contact is part of a first node of a capacitor, and the additional conductive contact is part of a second node of the capacitor;
a third conductive region contacting the additional conductive contact and separated from the first conductive region by a first distance; and
a fourth conductive region contacting the additional conductive contact and separated from the second conductive region by a second distance.

7. An apparatus comprising:
conductive materials located in different levels over a semiconductor substrate of the apparatus;
dielectric materials located in different levels over the semiconductor substrate of the apparatus, one of the conductive materials being between two of the dielectric materials, and one of the dielectric materials being between two of the conductive materials, such that a first conductive material of the conductive materials is formed on and contacts a first dielectric material of the dielectric materials, a second dielectric material of the dielectric materials is formed on and contacts the first conductive material, a second conductive material of the conductive materials is formed on and contacts the second dielectric material, wherein the dielectric materials include silicon dioxide;
a first conductive contact having a length extending through the conductive materials and the dielectric materials in a direction perpendicular to the levels of the apparatus, the first conductive contact being electrically separated from the conductive materials;
a second conductive contact having a length extending through the conductive materials and the dielectric materials in a direction perpendicular to the levels of the apparatus, the second conductive contact being electrically separated from the conductive materials;
a third conductive contact having a length extending through the conductive materials and the dielectric materials in a direction perpendicular to the levels of the apparatus, the third conductive contact being electrically separated from the conductive materials;
a first conductive region directly contacting the first, second, and third conductive contacts; and
a second conductive region directly contacting the first, second, and third conductive contacts;
an additional conductive contact contacting a group of conductive materials of the conductive materials, wherein the additional conductive contact is electrically separated from the first, second, and third conductive contacts, wherein the first conductive region is located in a first level of the apparatus;
a third conductive region located in the first level of the apparatus and contacting the additional conductive contact and separated from the second conductive region by a first distance, wherein the conductive materials and the dielectric materials are located over the semiconductor substrate of the apparatus, the first level is under a combination of the conductive materials and the dielectric materials, and the first level is between the semiconductor substrate and the combination of the conductive materials and the dielectric materials; and
a fourth conductive region contacting the additional conductive contact and separated from the first conductive region by a second distance.

8. An apparatus comprising:
conductive materials located in different levels over a semiconductor substrate of the apparatus;
dielectric materials located in different levels over the semiconductor substrate of the apparatus, one of the conductive materials being between two of the dielectric materials, and one of the dielectric materials being between two of the conductive materials, such that a first conductive material of the conductive materials is formed on a first dielectric material of the dielectric materials, a second dielectric material of the dielectric materials is formed on the first conductive material, a second conductive material of the conductive materials is formed on the second dielectric material, wherein the dielectric materials include silicon dioxide;
a first conductive contact having a length extending through the conductive materials and the dielectric materials in a direction perpendicular to the levels of the apparatus, the first conductive contact being electrically separated from the conductive materials;
a second conductive contact having a length extending through the conductive materials and the dielectric materials in a direction perpendicular to the levels of the apparatus, the second conductive contact being electrically separated from the conductive materials;
a third conductive contact having a length extending through the conductive materials and the dielectric materials in a direction perpendicular to the levels of the apparatus, the third conductive contact being electrically separated from the conductive materials;
a first conductive region directly contacting the first, second, and third conductive contacts; and
a second conductive region directly contacting the first, second, and third conductive contacts;
an additional conductive contact contacting a group of conductive materials of the conductive materials, wherein the additional conductive contact is electrically separated from the first, second, and third conductive contacts, wherein the first conductive region is located in a first level of the apparatus;
a third conductive region located in the first level of the apparatus and contacting the additional conductive contact and separated from the first conductive region by a first distance, wherein the conductive materials and the dielectric materials are located over the semiconductor substrate of the apparatus, the first level is over the conductive materials and the dielectric materials, and the conductive materials and the dielectric materials are between the first level and the semiconductor substrate; and
a fourth conductive region contacting the additional conductive contact and separated from the second conductive region by a second distance.

9. An apparatus, comprising:
multiple tiers of conductive material located one over another above a substrate;

multiple tiers of dielectric material interleaved with the multiple tiers of conductive material, such that a first tier of conductive material of the multiple tiers of conductive material is formed on and contacts a first tier of the multiple tiers of dielectric material, a second tier of the multiple tiers of dielectric material is formed on and contacts the first tier of conductive material, a second tier of conductive material the multiple tiers of conductive material conductive materials is formed on and contacts the second tier of the multiple tiers of dielectric material, wherein the dielectric materials include silicon dioxide; and a capacitor, including, a first conductive pillar structure forming a first node of the capacitor, the first conductive pillar structure extending vertically through the multiple tiers of conductive material, the first conductive pillar structure including multiple pillars extending vertically through respective holes formed in the multiple tiers of conductive material and the multiple tiers of dielectric material;

a first conductive region located on a first level of the apparatus and directly contacting the multiple pillars;

a second conductive region located on a second level of the apparatus and directly contacting the multiple pillars;

a capacitor dielectric electrically separating the multiple pillars of the first conductive pillar structure from the multiple tiers of conductive material, wherein the capacitor dielectric including a first dielectric portion and a second dielectric portion formed in a hole of the holes, wherein a first pillar of the multiple pillars is separated from the first tier of conductive material of the multiple tiers by the first dielectric portion, and wherein a second pillar of the multiple pillars is separated from the second tier of conductive material of the multiple tiers by the second dielectric portion;

a second conductive pillar structure forming a second node of the capacitor, the second conductive pillar structure including a first pillar, a second pillar, and a third pillar, each of the first, second, and third pillar extending vertically through first tier of conductive material of the multiple tiers of conductive material and second tier of conductive material of the multiple tiers of conductive material, wherein the first pillar contacts the first and second tiers of conductive material the multiple tiers of conductive material, the second pillar contacts the first and second tiers of conductive material the multiple tiers of conductive material, and the third pillar contacts the first and second tiers of conductive material of the multiple tiers of conductive material, wherein each of the first, second, and third pillars of the second conductive pillar structure is electrically separated from the multiple pillars of the first pillar structure, wherein a direction from the first pillar of the second conductive pillar structure to the second pillar of the second conductive pillar structure is perpendicular to a direction from a first pillar of the first conductive pillar structure to a second pillar the first conductive pillar structure;

a third conductive region contacting the first, second, and third pillars of the second conductive pillar structure and separated from the first conductive region by a first distance; and a fourth conductive region contacting the first, second, and third pillars of the second conductive pillar structure and separated from the second conductive region by a second distance.

10. The apparatus of claim 9, wherein multiple pillars of the first conductive pillar structure and the first, second, and third pillars of the second conductive pillar structure include conductively doped poly silicon.

11. An apparatus comprising:

conductive materials located in different levels of the apparatus;

dielectric materials located in different levels of the apparatus, one of the conductive materials being between two of the dielectric materials, and one of the dielectric materials being between two of the conductive materials, such that a first conductive material of the conductive materials is formed on a first dielectric material of the dielectric materials, a second dielectric material of the dielectric materials is formed on the first conductive material, a second conductive material of the conductive materials is formed on the second dielectric material, wherein the dielectric materials include silicon dioxide;

first conductive contacts, each of the first conductive contacts having a length extending through the conductive materials and the dielectric materials in a direction perpendicular to the levels of the apparatus, each of the first conductive contacts being separated from the conductive materials by an additional dielectric material different from the dielectric materials;

second conductive contacts, each of the second conductive contacts having a length extending through the conductive materials and the dielectric materials in the direction perpendicular to the levels of the apparatus, each of the second conductive contacts contacting a group of the conductive materials, wherein the second conductive contacts are electrically separated from the first conductive contacts;

a first conductive region directly contacting the first conductive contacts at a first end of each of the first conductive contacts, wherein the first conductive region is located on a level of the apparatus that is over the conductive materials and over the dielectric materials;

a second conductive region directly contacting the first conductive contacts at a second end of each of the first conductive contacts;

a third conductive region directly contacting the second conductive contacts at an end of each of the second conductive contacts and separated from the first conductive region by a first distance; and a fourth conductive region contacting the second conductive contacts and separated from the second conductive region by a second distance.

12. The apparatus of claim 11, further comprising:

first additional conductive contacts, each of the first additional conductive contacts having a length extending through the conductive materials and the dielectric materials in the direction perpendicular to the levels of the apparatus, each of the first additional conductive contacts being separated from the conductive materials by a second additional dielectric material, the first additional conductive contacts being electrically coupled to the first conductive contacts; and a first additional conductive region contacting the first additional conductive contacts and the first conductive region.

13. The apparatus of claim 11, further comprising:
first holes extending through the conductive materials and the dielectric materials, wherein each of the first conductive contacts includes a portion inside a hole among the first holes; and
second holes extending through the conductive materials and the dielectric materials, wherein each of the second conductive contacts includes a portion inside a hole among the second holes.

14. The apparatus of claim 11, wherein the conductive materials are metal.

15. The apparatus of claim 11, wherein the first conductive contacts are polysilicon.

16. An apparatus comprising:
conductive materials located in different levels of the apparatus;
dielectric materials located in different levels of the apparatus, one of the conductive materials being between two of the dielectric materials, and one of the dielectric materials being between two of the conductive materials, such that a first conductive material of the conductive materials is formed on a first dielectric material of the dielectric materials, a second dielectric material of the dielectric materials is formed on and contacts the first conductive material, a second conductive material of the conductive materials is formed on and contacts the second dielectric material, wherein the dielectric materials include silicon dioxide;
first conductive contacts, each of the first conductive contacts having a length extending through the conductive materials and the dielectric materials in a direction perpendicular to the levels of the apparatus, each of the first conductive contacts being separated from the conductive materials by an additional dielectric material different from the dielectric materials;
second conductive contacts, each of the second conductive contacts having a length extending through the conductive materials and the dielectric materials in the direction perpendicular to the levels of the apparatus, each of the second conductive contacts contacting a group of the conductive materials, wherein the second conductive contacts are electrically separated from the first conductive contacts;
a first conductive region directly contacting the first conductive contacts at a first end of each of the first conductive contacts;
a second conductive region directly contacting the first conductive contacts at a second end of each of the first conductive contacts;
a third conductive region directly contacting the second conductive contacts at an end of each of the second conductive contacts and separated from the second conductive region by a first distance, wherein the first conductive region is located on a level of the apparatus that is under the conductive materials and under the dielectric materials; and
a fourth conductive region contacting the second conductive contacts and separated from the first conductive region by a second distance.

17. An apparatus comprising:
conductive materials located in different levels of the apparatus;
dielectric materials located in different levels of the apparatus, one of the conductive materials being between two of the dielectric materials, and one of the dielectric materials being between two of the conductive materials, such that a first conductive material of the conductive materials is formed on and contacts a first dielectric material of the dielectric materials, a second dielectric material of the dielectric materials is formed on and contacts the first conductive material, a second conductive material of the conductive materials is formed on and contacts the second dielectric material, wherein the dielectric materials include silicon dioxide;
first conductive contacts, each of the first conductive contacts having a length extending through the conductive materials and the dielectric materials in a direction perpendicular to the levels of the apparatus, each of the first conductive contacts being separated from the conductive materials by an additional dielectric material different from the dielectric materials;
second conductive contacts, each of the second conductive contacts having a length extending through the conductive materials and the dielectric materials in the direction perpendicular to the levels of the apparatus, each of the second conductive contacts contacting a group of the conductive materials, wherein the second conductive contacts are electrically separated from the first conductive contacts;
a first conductive region directly contacting the first conductive contacts at a first end of each of the first conductive contacts;
a second conductive region directly contacting the first conductive contacts at a second end of each of the first conductive contacts;
a third conductive region directly contacting the second conductive contacts at an end of each of the second conductive contacts and separated from the first conductive region by a first distance, wherein the first and second conductive regions are located in different levels of the apparatus, such that the first conductive region is located on a first level of the apparatus that is over the conductive materials and over the dielectric materials, the second conductive region is located on a second level of the apparatus that is under the conductive materials and under the dielectric materials, and the conductive materials and the dielectric materials are between the first level and the second level; and
a fourth conductive region contacting the second conductive contacts and separated from the second conductive region by a second distance.

* * * * *